(12) United States Patent
Melli et al.

(10) Patent No.: US 11,840,034 B2
(45) Date of Patent: Dec. 12, 2023

(54) METHOD OF FABRICATING MOLDS FOR FORMING EYEPIECES WITH INTEGRATED SPACERS

(71) Applicant: Magic Leap, Inc., Plantation, FL (US)

(72) Inventors: Mauro Melli, San Leandro, CA (US); Chieh Chang, Cedar Park, TX (US); Ling Li, Cedar Park, TX (US); Melanie Maputol West, San Francisco, CA (US); Christophe Peroz, San Francisco, CA (US); Ali Karbasi, Coral Gables, FL (US); Sharad D. Bhagat, Austin, TX (US); Brian George Hill, Duxbury, MA (US)

(73) Assignee: Magic Leap, Inc., Plantation, FL (US)

( * ) Notice: Subject to any disclaimer, the term of this patent is extended or adjusted under 35 U.S.C. 154(b) by 240 days.

(21) Appl. No.: 17/186,902

(22) Filed: Feb. 26, 2021

(65) Prior Publication Data

US 2021/0268756 A1    Sep. 2, 2021

Related U.S. Application Data

(60) Provisional application No. 62/983,518, filed on Feb. 28, 2020, provisional application No. 63/043,039, filed on Jun. 23, 2020.

(51) Int. Cl.
*B29D 11/00* (2006.01)
*B29C 33/42* (2006.01)
(Continued)

(52) U.S. Cl.
CPC ...... *B29D 11/00682* (2013.01); *B29C 33/424* (2013.01); *G02B 6/136* (2013.01);
(Continued)

(58) Field of Classification Search
CPC ... B29D 11/00682; B29C 33/38; B29C 33/42; B29C 33/424; G02B 6/136
See application file for complete search history.

(56) References Cited

U.S. PATENT DOCUMENTS

| | | |
|---|---|---|
| 5,705,256 A | 1/1998 | Takahashi |
| 6,136,243 A | 10/2000 | Mehregany et al. |

(Continued)

FOREIGN PATENT DOCUMENTS

| | | |
|---|---|---|
| WO | WO 2016/141372 | 9/2016 |
| WO | WO 2019/195193 | * 10/2019 |
| WO | WO 2020/0263866 | 12/2020 |

OTHER PUBLICATIONS

International Search Report and Written Opinion for PCT Application No. PCT/US 21/19997, dated May 21, 2021.

(Continued)

*Primary Examiner* — Mathieu D Vargot
(74) *Attorney, Agent, or Firm* — Fish & Richardson P.C.

(57) ABSTRACT

Methods are disclosed for fabricating molds for forming eyepieces having waveguides with integrated spacers. The molds are formed by etching deep holes (e.g., 5 μm to 1000 μm deep) into a substrate using a wet etch or dry etch. The etch masks for defining the holes may be formed with a thick metal layer and/or multiple layers of different metals. A resist layer may be disposed over the etch mask. The resist layer may be patterned to form a pattern of holes, the pattern may be transferred to the etch mask, and the etch mask may be used to transfer the pattern into the underlying substrate. The patterned substrate may be utilized as a mold onto which a flowable polymer may be introduced and allowed to harden. Hardened polymer in the holes may form integrated spacers. The hardened polymer may be removed from the mold to form a waveguide with integrated spacers.

18 Claims, 43 Drawing Sheets

(51) Int. Cl.
*G02B 6/136* (2006.01)
*G02B 6/12* (2006.01)

(52) U.S. Cl.
CPC .............. *G02B 2006/12107* (2013.01); *G02B 2006/12173* (2013.01); *G02B 2006/12176* (2013.01)

(56) References Cited

U.S. PATENT DOCUMENTS

| | | |
|---|---|---|
| 6,832,037 B2 | 12/2004 | Aylward et al. |
| 6,850,221 B1 | 2/2005 | Tickle |
| 7,228,051 B2 | 6/2007 | Cok et al. |
| 7,974,505 B2 | 7/2011 | Hill et al. |
| 8,917,962 B1 | 12/2014 | Nichol |
| 9,417,452 B2 | 8/2016 | Schowengerdt et al. |
| 2004/0071405 A1 | 4/2004 | Baney et al. |
| 2006/0028436 A1 | 2/2006 | Armstrong |
| 2007/0081123 A1 | 4/2007 | Lewis |
| 2008/0085089 A1 | 4/2008 | Catching et al. |
| 2009/0004840 A1 | 1/2009 | Farinelli et al. |
| 2012/0099820 A1 | 4/2012 | Rolston et al. |
| 2012/0127062 A1 | 5/2012 | Bar-Zeev et al. |
| 2012/0162549 A1 | 6/2012 | Gao et al. |
| 2013/0069272 A1 | 3/2013 | Ootea et al. |
| 2013/0082922 A1 | 4/2013 | Miller |
| 2013/0117377 A1 | 5/2013 | Miller |
| 2013/0125027 A1 | 5/2013 | Abovitz |
| 2013/0188118 A1 | 7/2013 | Oka et al. |
| 2013/0208234 A1 | 8/2013 | Lewis |
| 2013/0242262 A1 | 9/2013 | Lewis |
| 2014/0069889 A1 | 3/2014 | Ohtsu et al. |
| 2014/0071539 A1 | 3/2014 | Gao |
| 2014/0168260 A1 | 6/2014 | O'Brien et al. |
| 2014/0177023 A1 | 6/2014 | Gao et al. |
| 2014/0218468 A1 | 8/2014 | Gao et al. |
| 2014/0267420 A1 | 9/2014 | Schowengerdt |
| 2015/0016777 A1 | 1/2015 | Abovitz et al. |
| 2015/0103306 A1 | 4/2015 | Kaji et al. |
| 2015/0178939 A1 | 6/2015 | Bradski et al. |
| 2015/0205126 A1 | 7/2015 | Schowengerdt |
| 2015/0302652 A1 | 10/2015 | Miller et al. |
| 2015/0309263 A2 | 10/2015 | Abovitz et al. |
| 2015/0326570 A1 | 11/2015 | Publicover et al. |
| 2015/0346495 A1 | 12/2015 | Welch et al. |
| 2016/0011419 A1 | 1/2016 | Gao |
| 2016/0026253 A1 | 1/2016 | Bradski et al. |
| 2016/0116739 A1 | 4/2016 | TeKolste et al. |
| 2016/0346960 A1 | 12/2016 | Fukaya et al. |
| 2017/0205618 A1 | 7/2017 | Basset et al. |
| 2017/0276948 A1 | 9/2017 | Welch et al. |
| 2017/0322376 A1 | 11/2017 | Wu et al. |
| 2018/0059320 A1 | 3/2018 | Miller et al. |
| 2018/0267312 A1 | 9/2018 | Melli |
| 2018/0314159 A1 | 11/2018 | Mitamura et al. |
| 2018/0348429 A1 | 12/2018 | Young et al. |
| 2020/0400941 A1 | 12/2020 | Li |
| 2020/0400955 A1* | 12/2020 | Messer ................ G02B 6/0016 |
| 2021/0109278 A1 | 4/2021 | Peroz |
| 2021/0157032 A1 | 5/2021 | Peroz et al. |

OTHER PUBLICATIONS

ARToolKit: https://web.archive.org/web/20051013062315/http://www.hitl.washington.edu:80/artoolkit/documentation/hardware.htm, archived Oct. 13, 2005.

Azuma, "A Survey of Augmented Reality," Teleoperators and Virtual Environments 6, (Aug. 4, 1997), pp. 355-385. https://web.archive.org/web/20010604100006/http://www.cs.unc.edu/~azuma/ARpresence.pdf.

Azuma, "Predictive Tracking for Augmented Realty," TR95-007, Department of Computer Science, UNC-Chapel Hill, NC, Feb. 1995.

Bimber, et al., "Spatial Augmented Reality—Merging Real and Virtual Worlds," 2005 https://web.media.mit.edu/~raskar/book/BimberRaskarAugmentedRealityBook.pdf.

Jacob, "Eye Tracking in Advanced Interface Design," Human-Computer Interaction Lab Naval Research Laboratory, Washington, D.C. / paper/ in Virtual Environments and Advanced Interface Design, ed. by W. Barfield and T.A. Furness, pp. 258-288, Oxford University Press, New York (1995).

Tay, et al., "Defect-free wet etching through pyrex glass using Cr/Au mask," Microsystem Technologies 12, 935-939, Mar. 2006.

Tanriverdi and Jacob, "Interacting With Eye Movements in Virtual Environments," Department of Electrical Engineering and Computer Science, Tufts University, Medford, MA—paper/Proc. ACM CHI 2000 Human Factors in Computing Systems Conference, pp. 265-272, Addison-Wesley/ACM Press (2000).

Williams, et al., "Etch Rates for Micromachining Processing—Part II," Journal of Microelectromechanical Systems, vol. 12, No. 6, Dec. 2003.

* cited by examiner

METHOD OF FABRICATING MOLDS FOR FORMING EYEPIECES WITH INTEGRATED SPACERS

PRIORITY CLAIM

This application claims the priority benefit of U.S. Patent Prov. App. 62/983,518, entitled METHOD OF FABRICATING MOLDS FOR FORMING EYEPIECES WITH INTEGRATED SPACERS, filed Feb. 28, 2020; and U.S. Patent Prov. App. 63/043,039, entitled METHOD OF FABRICATING MOLDS FOR FORMING EYEPIECES WITH INTEGRATED SPACERS, filed Jun. 23, 2020. Each of the above-noted applications is incorporated herein by reference in its entirety.

CROSS-REFERENCE TO RELATED APPLICATIONS

This application incorporates by reference the entirety of each of the following patent applications: U.S. application Ser. No. 14/555,585 filed on Nov. 27, 2014, published on Jul. 23, 2015 as U.S. Publication No. 2015/0205126; U.S. application Ser. No. 14/690,401 filed on Apr. 18, 2015, published on Oct. 22, 2015 as U.S. Publication No. 2015/0302652; U.S. application Ser. No. 14/212,961 filed on Mar. 14, 2014, now U.S. Pat. No. 9,417,452 issued on Aug. 16, 2016; U.S. application Ser. No. 14/331,218 filed on Jul. 14, 2014, published on Oct. 29, 2015 as U.S. Publication No. 2015/0309263; and U.S. Application No. 62/651,507 filed on Apr. 2, 2018, entitled HYBRID POLYMER WAVEGUIDE AND METHODS FOR MAKING THE SAME.

BACKGROUND

Field

The present disclosure relates to display systems and, more particularly, to augmented reality display systems.

Description of the Related Art

Modern computing and display technologies have facilitated the development of systems for so called "virtual reality" or "augmented reality" experiences, wherein digitally reproduced images or portions thereof are presented to a user in a manner wherein they seem to be, or may be perceived as, real. A virtual reality, or "VR", scenario typically involves presentation of digital or virtual image information without transparency to other actual real-world visual input; an augmented reality, or "AR", scenario typically involves presentation of digital or virtual image information as an augmentation to visualization of the actual world around the user. A mixed reality, or "MR", scenario is a type of AR scenario and typically involves virtual objects that are integrated into, and responsive to, the natural world. For example, in an MR scenario, AR image content may be blocked by or otherwise be perceived as interacting with objects in the real world.

Referring to FIG. 1, an augmented reality scene 10 is depicted wherein a user of an AR technology sees a real-world park-like setting 20 featuring people, trees, buildings in the background, and a concrete platform 30. In addition to these items, the user of the AR technology also perceives that he "sees" "virtual content" such as a robot statue 40 standing upon the real-world platform 30, and a cartoon-like avatar character 50 flying by which seems to be a personification of a bumble bee, even though these elements 40, 50 do not exist in the real world. Because the human visual perception system is complex, it is challenging to produce an AR technology that facilitates a comfortable, natural-feeling, rich presentation of virtual image elements amongst other virtual or real-world imagery elements.

Systems and methods disclosed herein address various challenges related to AR and VR technology.

SUMMARY

In some embodiments, a method is provided for forming molds. The mold may be utilized to form waveguides having integrated spacers. The method comprises providing a substrate; depositing an etch mask layer over the substrate; defining openings in the etch mask layer; and etching the substrate through the etch mask layer to define openings in the substrate. The openings in the substrate have a depth between 5 μm and 1000 μm.

In some embodiments, the method further comprises depositing a photoresist layer over the etch mask layer; and lithographically defining openings in the photoresist layer. Defining openings in the etch mask layer comprises extending the openings in the photoresist layer into the etch mask layer. In some embodiments, the method further comprises depositing an adhesion layer over the substrate before depositing the etch mask.

In some embodiments, the method further comprises augmenting the etch mask layer after stopping depositing the etch mask. Augmenting the etch mask layer comprises depositing additional etch mask material directly on the etch mask layer. Depositing the additional etch mask material may comprise a vapor deposition. Depositing the additional etch mask material may comprise electroplating. The additional etch mask material may be a same material as the material deposited during depositing the etch mask layer.

In some embodiments, the etch mask layer has a thickness of 10 nm to 200 nm. In some embodiments, etching the substrate through the etch mask layer comprises a wet etch. In some embodiments, etching the substrate through the etch mask layer comprises a dry etch. In some embodiments, the substrate is formed of an optically transparent material, which may be chosen from the group consisting of glass, quartz, and fused silica. In some embodiments, the etch mask layer is formed of metal.

In some embodiments, the method further comprises defining interior openings in the substrate. A ratio of the heights of the interior openings and the openings in the substrate may be 500:1 or greater. In some embodiments, the ratio is 100000:1 or less. In some embodiments, the interior openings have a size and periodicity corresponding to the diffractive gratings. In some embodiments, the method further comprises removing the etch mask layer.

DETAILED DESCRIPTION

Figure 1:
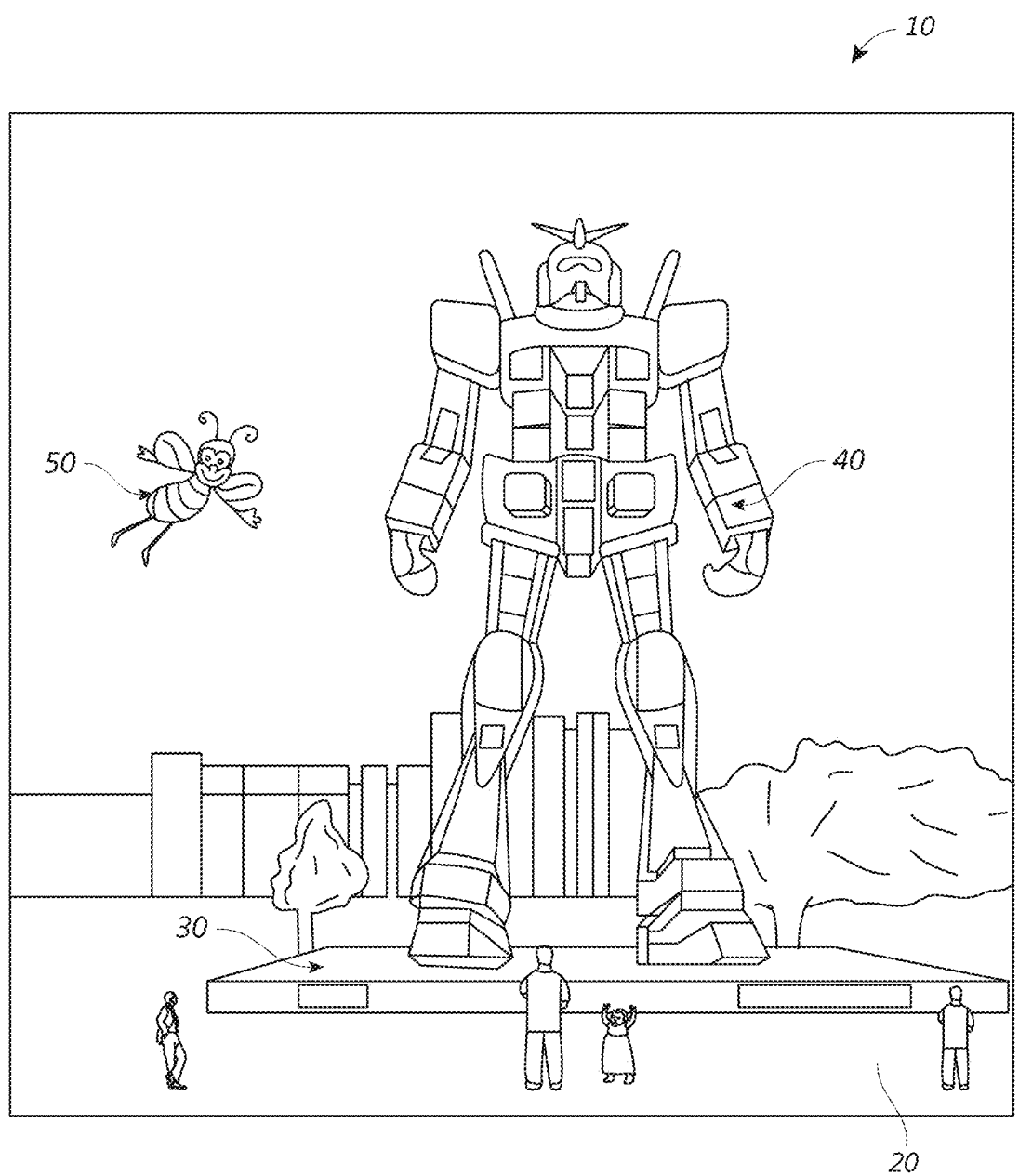
FIG. 1 illustrates a user's view of augmented reality (AR) through an AR device.

Near-eye augmented and virtual reality display systems may include eyepieces for directing image information into the eyes of a viewer. The eyepieces may be formed of stacks of waveguides that are spaced apart by intervening beads of glue. It will be appreciated that the sizes of the beads and the separation between the waveguides provided by the beads may impact the optical performance of the eyepiece and the perceived image quality of the display system. For example, the beads may be formed at specific locations and then an overlying waveguide may be pressed onto the beads at specific pressures, after which the beads may be hardened by curing. As a result, formation of the spacers may require precise alignment and controlled pressure to maintain a constant separation distance between the waveguides throughout the stack of waveguides. It may be challenging to provide such precise alignment and pressure control. In addition, where the waveguides are formed of polymers, the polymer waveguides may be flexible and utilizing beads of material to separate the waveguides may not provide sufficient mechanical or structural stability for maintaining the desired separation between waveguides.

In some embodiments, one or more waveguides, which may be used to form a stack of waveguides, may include integral spacers for providing a desired separation with overlying or underlying structures, such as other waveguides. The waveguides may each include surface relief features, e.g. diffractive optical elements that are formed simultaneously with the spacer, such as by imprinting. In some embodiments, the spacers and the main body of the waveguides form a monolithic structure. In some embodiments, the waveguide may be a hybrid waveguide comprising a plurality of layers, one of which may include the spacers and the diffractive optical elements. In some embodiments, the spacers may be laterally elongated along the same axis as the diffractive optical elements, which may facilitate the fabrication of the spacers and diffractive optical elements without deforming these features.

In some embodiments, the spacers and/or indentations may have varying sizes, e.g., widths, and/or multiple spacers and/or indentations may be formed as neighboring groups of spacers and/or indentations. For example, both major surfaces of the waveguide may include spacers and indentations, thereby forming an interlocking system of spacers and indentations with underlying and/or overlying matching waveguides. Advantageously, the varying sizes and/or neighboring groups of spacers and/or indentations may increase the mechanical and structural stability of a single waveguide and/or stack of waveguides.

In some embodiments, the spacers are disposed on one major surface of a waveguide and indentations are provided on an opposite major surface of the waveguide. The indentations are sized and positioned to align with spacers of immediately neighboring waveguides, thereby forming a self-aligned stack of waveguides. Tops of the spacers may be provided with light scattering features and/or a light leakage prevention material (e.g., an anti-reflective coating and/or a light absorbing material) to prevent light leakage between the waveguides.

In some embodiments, different waveguides of the stack of waveguides may be configured to incouple and/or outcouple light of different colors, e.g., different component colors for forming a full-color image. In addition or alternatively, different waveguides of the waveguides may be configured to output light with different amounts of wavefront divergence, to display image content at different apparent distances from the viewer.

Advantageously, the spacers integral with the waveguides provide a rigid structure for easily and reproducibility separating spacers of a stack of spacers. In addition, providing matching indentations in the waveguides further facilitates the making of consistent stacks of spacers by providing self-aligned stacking. The consistent separation between spacers may provide consistent optical performance by consistently preventing light from leaking between the waveguides, in addition to facilitating the total internal reflection of light through individual waveguides. Moreover, manufacturing processes may be simplified by eliminating separate steps for depositing beads of the material, precisely applying pressure to waveguides, and then hardening the glue material. Rather, where the waveguides comprise diffractive optical elements, the spacers may be formed simultaneously with the diffractive optical elements.

As discussed herein, waveguides may form eyepieces for augmented and virtual reality display systems. The waveguides may be configured to output light to display image content for a viewer. It will appreciated that some light beams within the waveguides may travel through the waveguides without being outcoupled for the viewer. Such light may be referred to herein as unutilized light. Unutilized light may, in some circumstances, reflect off of edges of the waveguides and propagate back through the waveguides, where the light may propagate out of the waveguide (e.g. be out-coupled by outcoupling elements in the waveguides, or escape total internal reflection due to the angles at which the light reflects off of the edges). Undesirably, this propagation of unutilized light out of the waveguide may cause visual artifacts such as ghosting and/or reductions in the contrast of the display system.

In some embodiments, one or more waveguides, which may be used to form a stack of waveguides (which may include integral spacers to separate neighboring waveguides), may include edge treatments to reduce or mitigate unwanted reflections and propagation of unutilized light out of a waveguide, thus improving image quality. The edge treatments may include, as examples, light absorbing material that is applied to one or more edges of the waveguide and/or reflection-preventing structures formed at those edges. In some embodiments, the edge treatments may include blackening materials, black ink, light absorbing materials, edge roughening, out-coupling gratings, light-trapping structures, absorbing polymers, and combinations of these and other treatments.

Advantageously, in some embodiments, various edge treatments may be formed simultaneously with the formation of spacers and/or diffractive optical elements. For example, an imprint mold may include patterns for defining the edge treatments (e.g., the patterns may define a rough texture, out-coupling optical elements, and/or light trapping microstructures).

In some embodiments, the waveguides with integral spacers disclosed herein may be formed using an imprinting or casting process. For example, the integral spacers and the waveguide may be formed simultaneously by a casting process in which waveguide material, in a liquid state, is flowed onto or into a mold containing a negative of the features (e.g., spacers and/or optical elements such as gratings) desired to be formed on the surface of the waveguide. The material is then allowed to solidify and the mold is removed, leaving a waveguide with integral spacers (and possibly other features such as optical elements).

Etch processes may be utilized to define the desired negative features in a mold. However, the sizes of features such as spacers may be challenging for conventional fabrication processes, and may cause surface defects, which may undesirably create optical artifacts. Advantageously, fabrication processes that include wet or dry etches according to various embodiments allow the formation of large openings for forming integral spacers, while providing low levels of defects on the face of the substrate and/or substrate backside. In some embodiments, a multipart etch mask stack (e.g., including multiple layers of etch masks and/or metal etch masks in a stack with a photoresist layer) may be utilized to form openings of sizes suitable for forming integral spacers, while protecting the surface of the substrate from undesirable etching. In some embodiments, a wet and/or dry etch may be utilized to etch the substrate through the etch mask. Advantageously, the selection of a wet or dry etch may be made based upon the desired cross-sectional profile of the opening to be formed. For example, wet etches may be utilized to form wider openings with more rounded corners than dry etches.

In some embodiments, the molds may be formed by etching deep holes or openings into a substrate using the multipart etch mask stack. In some embodiments, the holes may be 5 μm to 1000 μm deep. The etch masks for defining the holes may be formed with a thick metal layer and/or multiple layers of different metals. A resist layer may be disposed over the etch mask. The resist layer may be patterned to form a pattern of holes, the pattern may be transferred to the etch mask, and the etch mask may be used to transfer the pattern into the underlying substrate. The patterned substrate may be utilized as a mold onto which a flowable polymer may be introduced and allowed to harden. Hardened polymer in the holes may form integrated spacers. The hardened polymer may be removed from the mold (demolded) to form a waveguide with integrated spacers.

It has been found that defects on the face of the substrate may be caused by pinholes in a deposited metal etch mask. Undesirably, even when the metal etch mask appears to be retained after an etch of the substrate, pinholes in the metal etch mask may allow some etchant to leak through the metal etch mask, thereby causing undesirable etching of the substrate in isolated locations across the substrate surface. In some embodiments, it has been found that the pinholes may be mitigated by augmenting the thickness of the metal etch mask by, e.g., deposition of additional layers of etch mask material, by the use of a photoresist layer which is sufficiently thick to be retained throughout the etch of the substrate, and/or by electroplating to increase the thickness of an earlier-deposited metal layer. In addition, in some embodiments, the underside of the substrate may be protected using a deposited metal layer and/or an adhered sacrificial substrate.

Reference will now be made to the drawings, in which like reference numerals refer to like parts throughout. Unless indicated otherwise, the drawings are schematic not necessarily drawn to scale.

Example Display Systems

Figure 2:
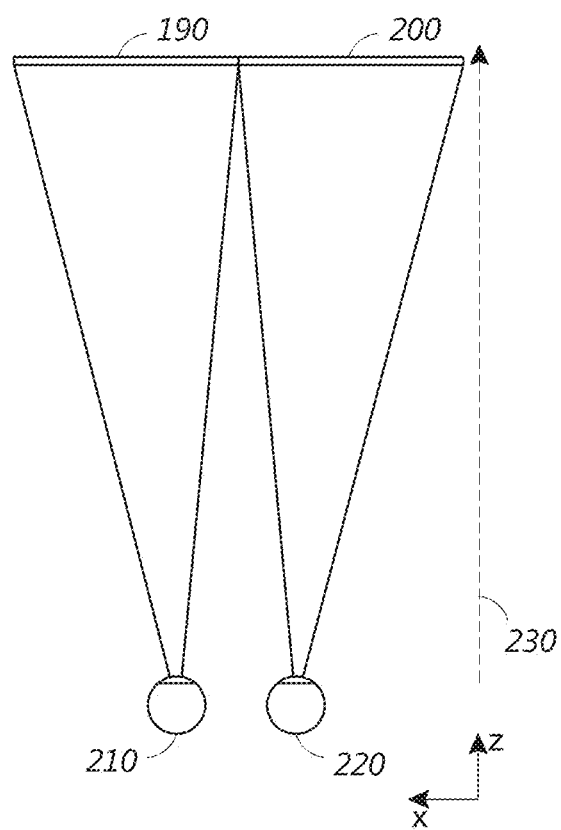
FIG. 2 illustrates a conventional display system for simulating three-dimensional imagery for a user.

FIG. 2 illustrates a conventional display system for simulating three-dimensional imagery for a user. It will be appreciated that a user's eyes are spaced apart and that, when looking at a real object in space, each eye will have a slightly different view of the object and may form an image of the object at different locations on the retina of each eye. This may be referred to as binocular disparity and may be utilized by the human visual system to provide a perception of depth. Conventional display systems simulate binocular disparity by presenting two distinct images 190, 200 with slightly different views of the same virtual object—one for each eye 210, 220—corresponding to the views of the virtual object that would be seen by each eye were the virtual object a real object at a desired depth. These images provide binocular cues that the user's visual system may interpret to derive a perception of depth.

With continued reference to FIG. 2, the images 190, 200 are spaced from the eyes 210, 220 by a distance 230 on a z-axis. The z-axis is parallel to the optical axis of the viewer with their eyes fixated on an object at optical infinity directly ahead of the viewer. The images 190, 200 are flat and at a fixed distance from the eyes 210, 220. Based on the slightly different views of a virtual object in the images presented to the eyes 210, 220, respectively, the eyes may naturally rotate such that an image of the object falls on corresponding points on the retinas of each of the eyes, to maintain single binocular vision. This rotation may cause the lines of sight of each of the eyes 210, 220 to converge onto a point in space at which the virtual object is perceived to be present. As a result, providing three-dimensional imagery conventionally involves providing binocular cues that may manipulate the vergence of the user's eyes 210, 220, and that the human visual system interprets to provide a perception of depth.

Figure 3A:
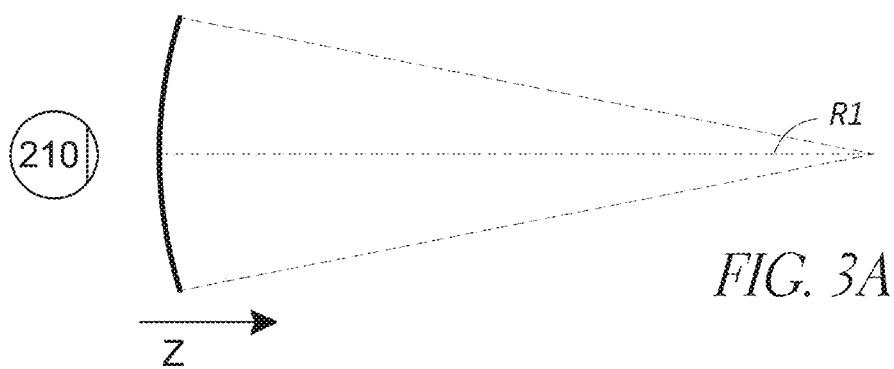
FIGS. 3A-3C illustrate relationships between radius of curvature and focal radius.
Figure 3B:
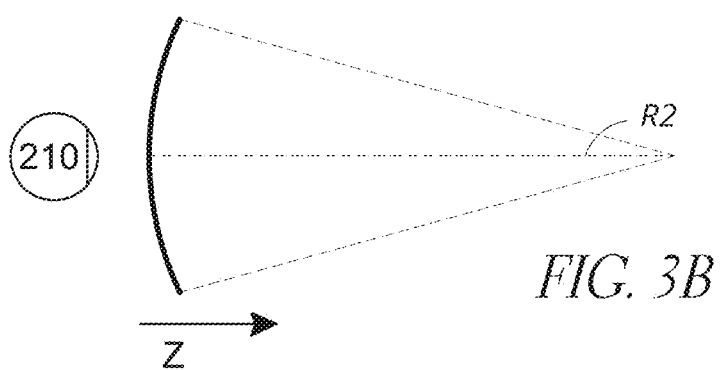
Figure 3C:
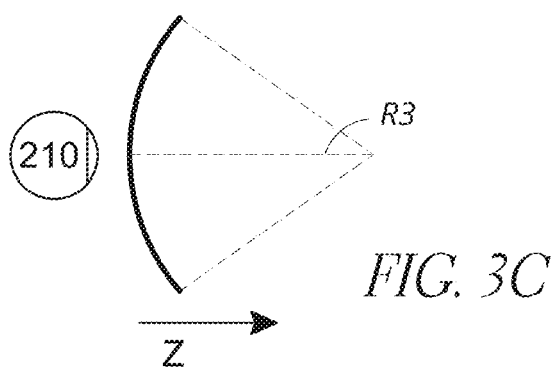

Generating a realistic and comfortable perception of depth is challenging, however. It will be appreciated that light from objects at different distances from the eyes have wavefronts with different amounts of divergence. FIGS. 3A-3C illustrate relationships between distance and the divergence of light rays. The distance between the object and the eye 210 is represented by, in order of decreasing distance, R1, R2, and R3. As shown in FIGS. 3A-3C, the light rays become more divergent as distance to the object decreases. Conversely, as distance increases, the light rays become more collimated. Stated another way, it may be said that the light field produced by a point (the object or a part of the object) has a spherical wavefront curvature, which is a function of how far away the point is from the eye of the user. The curvature increases with decreasing distance between the object and the eye 210. While only a single eye 210 is illustrated for clarity of illustration in FIGS. 3A-3C and other figures herein, the discussions regarding eye 210 may be applied to both eyes 210 and 220 of a viewer.

With continued reference to FIGS. 3A-3C, light from an object that the viewer's eyes are fixated on may have different degrees of wavefront divergence. Due to the different amounts of wavefront divergence, the light may be focused differently by the lens of the eye, which in turn may require the lens to assume different shapes to form a focused image on the retina of the eye. Where a focused image is not formed on the retina, the resulting retinal blur acts as a cue to accommodation that causes a change in the shape of the lens of the eye until a focused image is formed on the retina. For example, the cue to accommodation may trigger the ciliary muscles surrounding the lens of the eye to relax or contract, thereby modulating the force applied to the suspensory ligaments holding the lens, thus causing the shape of the lens of the eye to change until retinal blur of an object of fixation is eliminated or minimized, thereby forming a focused image of the object of fixation on the retina (e.g., fovea) of the eye. The process by which the lens of the eye changes shape may be referred to as accommodation, and the shape of the lens of the eye required to form a focused image of the object of fixation on the retina (e.g., fovea) of the eye may be referred to as an accommodative state.

Figure 4A:
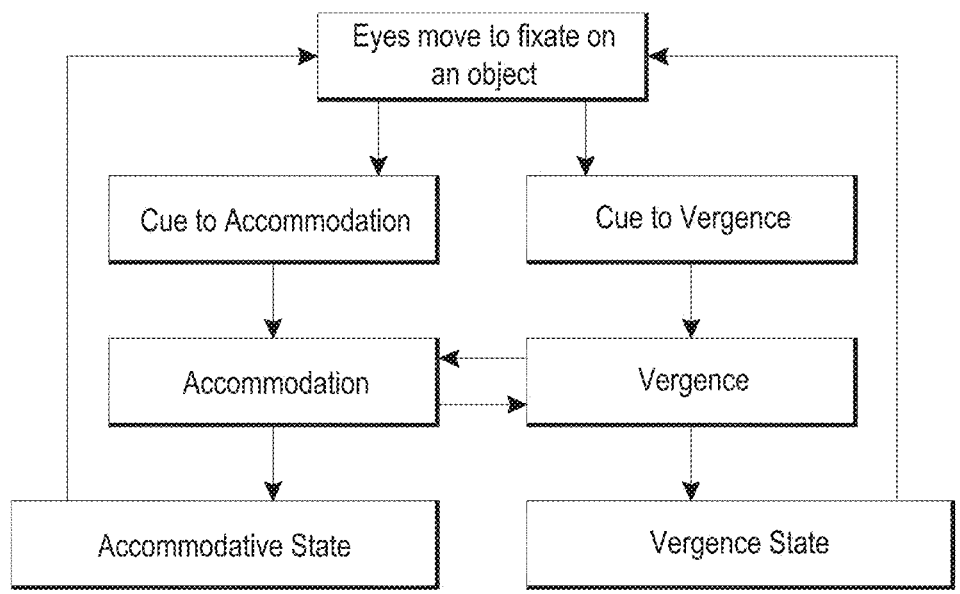
FIG. 4A illustrates a representation of the accommodation-vergence response of the human visual system.

With reference now to FIG. 4A, a representation of the accommodation-vergence response of the human visual system is illustrated. The movement of the eyes to fixate on an object causes the eyes to receive light from the object, with the light forming an image on each of the retinas of the eyes. The presence of retinal blur in the image formed on the retina may provide a cue to accommodation, and the relative locations of the image on the retinas may provide a cue to vergence. The cue to accommodation causes accommodation to occur, resulting in the lenses of the eyes each assuming a particular accommodative state that forms a focused image of the object on the retina (e.g., fovea) of the eye. On the other hand, the cue to vergence causes vergence movements (rotation of the eyes) to occur such that the images formed on each retina of each eye are at corresponding retinal points that maintain single binocular vision. In these positions, the eyes may be said to have assumed a particular vergence state. With continued reference to FIG. 4A, accommodation may be understood to be the process by which the eye achieves a particular accommodative state, and vergence may be understood to be the process by which the eye achieves a particular vergence state. As indicated in FIG. 4A, the accommodative and vergence states of the eyes may change if the user fixates on another object. For example, the accommodated state may change if the user fixates on a new object at a different depth on the z-axis.

Without being limited by theory, it is believed that viewers of an object may perceive the object as being "three-dimensional" due to a combination of vergence and accommodation. As noted above, vergence movements (e.g., rotation of the eyes so that the pupils move toward or away from each other to converge the lines of sight of the eyes to fixate upon an object) of the two eyes relative to each other are closely associated with accommodation of the lenses of the eyes. Under normal conditions, changing the shapes of the lenses of the eyes to change focus from one object to another object at a different distance will automatically cause a matching change in vergence to the same distance, under a relationship known as the "accommodation-vergence reflex." Likewise, a change in vergence will trigger a matching change in lens shape under normal conditions.

Figure 4B:
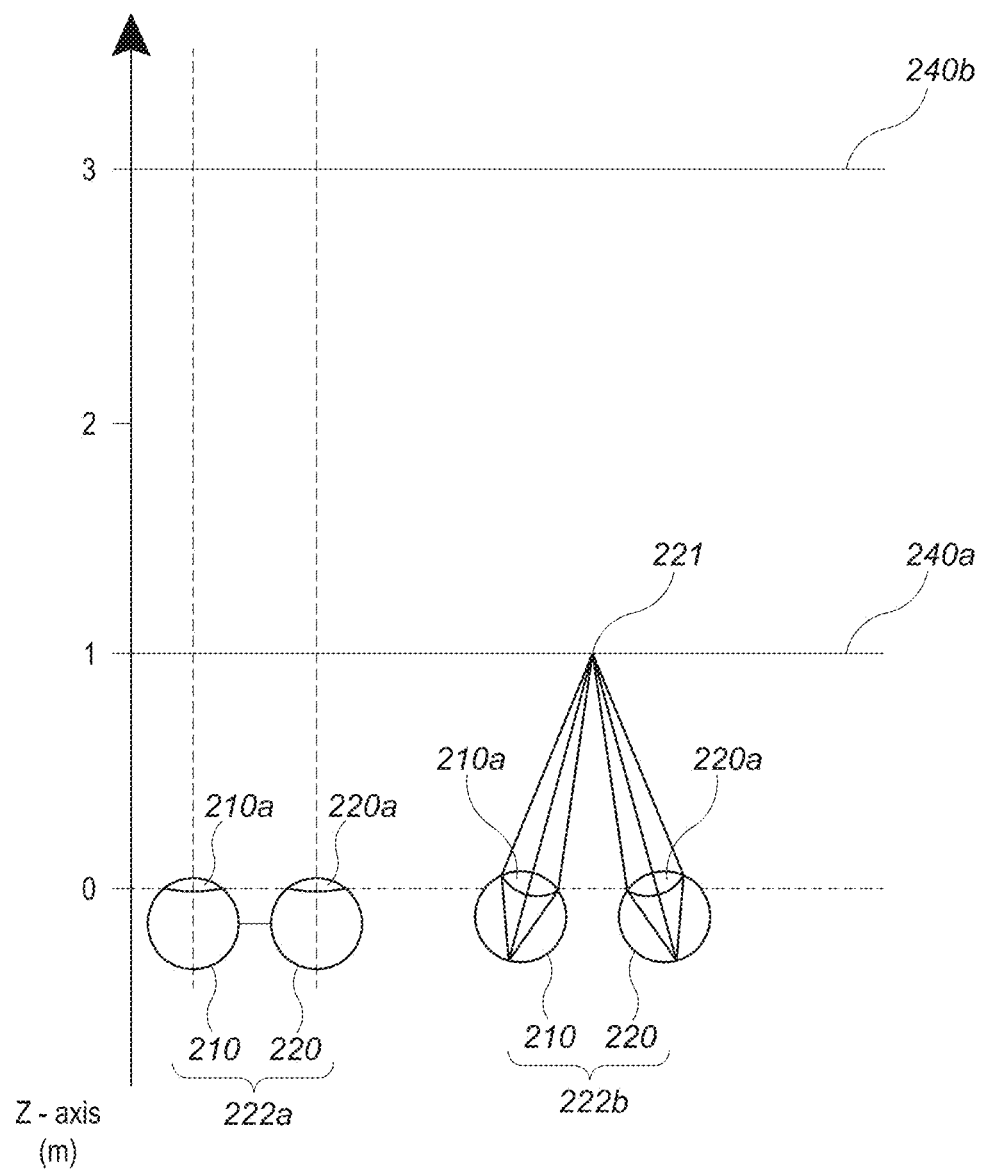
FIG. 4B illustrates examples of different accommodative states and vergence states of a pair of eyes of the user.

With reference now to FIG. 4B, examples of different accommodative and vergence states of the eyes are illustrated. The pair of eyes 222a is fixated on an object at optical infinity, while the pair eyes 222b are fixated on an object 221 at less than optical infinity. Notably, the vergence states of each pair of eyes is different, with the pair of eyes 222a directed straight ahead, while the pair of eyes 222 converge on the object 221. The accommodative states of the eyes forming each pair of eyes 222a and 222b are also different, as represented by the different shapes of the lenses 210a, 220a.

Undesirably, many users of conventional "3-D" display systems find such conventional systems to be uncomfortable or may not perceive a sense of depth at all due to a mismatch between accommodative and vergence states in these displays. As noted above, many stereoscopic or "3-D" display systems display a scene by providing slightly different images to each eye. Such systems are uncomfortable for many viewers, since they, among other things, simply provide different presentations of a scene and cause changes in the vergence states of the eyes, but without a corresponding change in the accommodative states of those eyes. Rather, the images are shown by a display at a fixed distance from the eyes, such that the eyes view all the image information at a single accommodative state. Such an arrangement works against the "accommodation-vergence reflex" by causing changes in the vergence state without a matching change in the accommodative state. This mismatch is believed to cause viewer discomfort. Display systems that provide a better match between accommodation and vergence may form more realistic and comfortable simulations of three-dimensional imagery.

Without being limited by theory, it is believed that the human eye typically may interpret a finite number of depth planes to provide depth perception. Consequently, a highly believable simulation of perceived depth may be achieved by providing, to the eye, different presentations of an image corresponding to each of these limited numbers of depth planes. In some embodiments, the different presentations may provide both cues to vergence and matching cues to accommodation, thereby providing physiologically correct accommodation-vergence matching.

With continued reference to FIG. 4B, two depth planes 240, corresponding to different distances in space from the eyes 210, 220, are illustrated. For a given depth plane 240, vergence cues may be provided by the displaying of images of appropriately different perspectives for each eye 210, 220. In addition, for a given depth plane 240, light forming the images provided to each eye 210, 220 may have a wavefront divergence corresponding to a light field produced by a point at the distance of that depth plane 240.

In the illustrated embodiment, the distance, along the z-axis, of the depth plane 240 containing the point 221 is 1 m. As used herein, distances or depths along the z-axis may be measured with a zero-point located at the exit pupils of the user's eyes. Thus, a depth plane 240 located at a depth of 1 m corresponds to a distance of 1 m away from the exit pupils of the user's eyes, on the optical axis of those eyes with the eyes directed towards optical infinity. As an approximation, the depth or distance along the z-axis may be measured from the display in front of the user's eyes (e.g., from the surface of a waveguide), plus a value for the distance between the device and the exit pupils of the user's eyes. That value may be called the eye relief and corresponds to the distance between the exit pupil of the user's eye and the display worn by the user in front of the eye. In practice, the value for the eye relief may be a normalized value used generally for all viewers. For example, the eye relief may be assumed to be 20 mm and a depth plane that is at a depth of 1 m may be at a distance of 980 mm in front of the display.

Figure 4C:
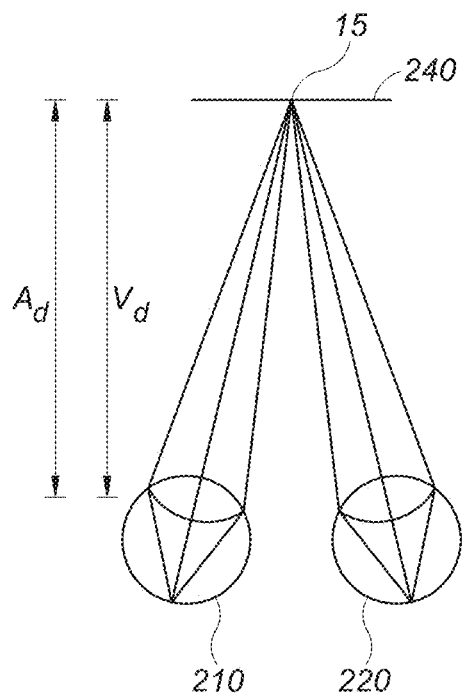
FIG. 4C illustrates an example of a representation of a top-down view of a user viewing content via a display system.
Figure 4D:
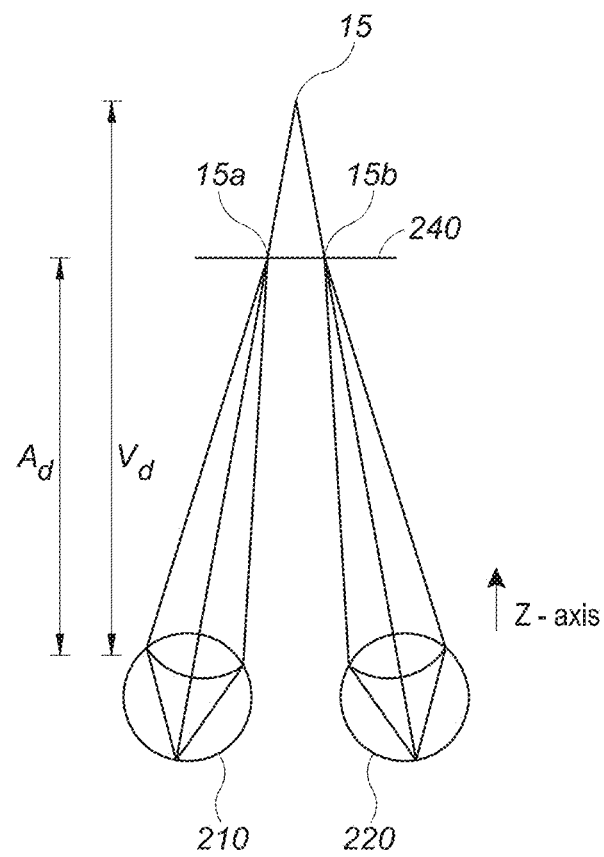
FIG. 4D illustrates another example of a representation of a top-down view of a user viewing content via a display system.

With reference now to FIGS. 4C and 4D, examples of matched accommodation-vergence distances and mismatched accommodation-vergence distances are illustrated, respectively. As illustrated in FIG. 4C, the display system may provide images of a virtual object to each eye 210, 220. The images may cause the eyes 210, 220 to assume a vergence state in which the eyes converge on a point 15 on a depth plane 240. In addition, the images may be formed by a light having a wavefront curvature corresponding to real objects at that depth plane 240. As a result, the eyes 210, 220 assume an accommodative state in which the images are in focus on the retinas of those eyes. Thus, the user may perceive the virtual object as being at the point 15 on the depth plane 240.

It will be appreciated that each of the accommodative and vergence states of the eyes 210, 220 are associated with a particular distance on the z-axis. For example, an object at a particular distance from the eyes 210, 220 causes those eyes to assume particular accommodative states based upon the distances of the object. The distance associated with a particular accommodative state may be referred to as the accommodation distance, $A_d$. Similarly, there are particular vergence distances, $V_d$, associated with the eyes in particular vergence states, or positions relative to one another. Where the accommodation distance and the vergence distance match, the relationship between accommodation and vergence may be said to be physiologically correct. This is considered to be the most comfortable scenario for a viewer.

In stereoscopic displays, however, the accommodation distance and the vergence distance may not always match. For example, as illustrated in FIG. 4D, images displayed to the eyes 210, 220 may be displayed with wavefront divergence corresponding to depth plane 240, and the eyes 210, 220 may assume a particular accommodative state in which the points 15a, 15b on that depth plane are in focus. However, the images displayed to the eyes 210, 220 may provide cues for vergence that cause the eyes 210, 220 to converge on a point 15 that is not located on the depth plane 240. As a result, the accommodation distance corresponds to the distance from the exit pupils of the eyes 210, 220 to the depth plane 240, while the vergence distance corresponds to the larger distance from the exit pupils of the eyes 210, 220 to the point 15, in some embodiments. The accommodation distance is different from the vergence distance. Consequently, there is an accommodation-vergence mismatch. Such a mismatch is considered undesirable and may cause discomfort in the user. It will be appreciated that the mismatch corresponds to distance (e.g., $V_d-A_d$) and may be characterized using diopters.

In some embodiments, it will be appreciated that a reference point other than exit pupils of the eyes 210, 220 may be utilized for determining distance for determining accommodation-vergence mismatch, so long as the same reference point is utilized for the accommodation distance and the vergence distance. For example, the distances could be measured from the cornea to the depth plane, from the retina to the depth plane, from the eyepiece (e.g., a waveguide of the display device) to the depth plane, from the center of rotation of an eye, and so on.

Without being limited by theory, it is believed that users may still perceive accommodation-vergence mismatches of up to about 0.25 diopter, up to about 0.33 diopter, and up to about 0.5 diopter as being physiologically correct, without the mismatch itself causing significant discomfort. In some embodiments, display systems disclosed herein (e.g., the display system 250, FIG. 6) present images to the viewer having accommodation-vergence mismatch of about 0.5 diopter or less. In some other embodiments, the accommodation-vergence mismatch of the images provided by the display system is about 0.33 diopter or less. In yet other embodiments, the accommodation-vergence mismatch of the images provided by the display system is about 0.25 diopter or less, including about 0.1 diopter or less.

Figure 5:
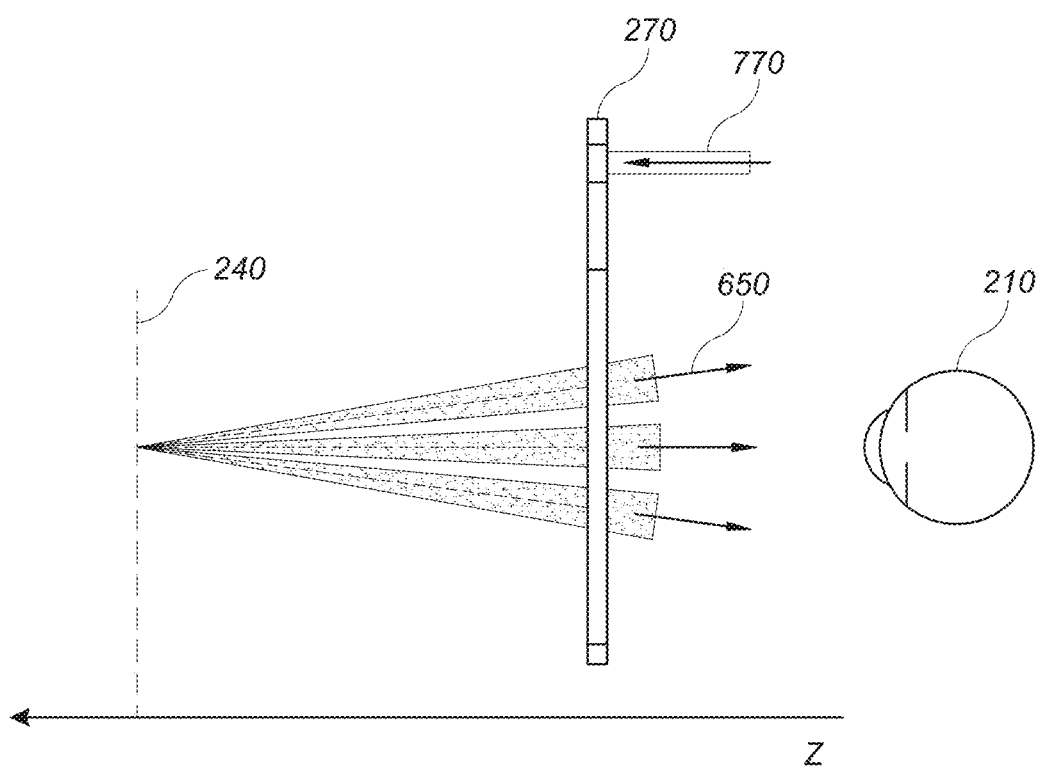
FIG. 5 illustrates aspects of an approach for simulating three-dimensional imagery by modifying wavefront divergence.

FIG. 5 illustrates aspects of an approach for simulating three-dimensional imagery by modifying wavefront divergence. The display system includes a waveguide 270 that is configured to receive light 770 that is encoded with image information, and to output that light to the user's eye 210. The waveguide 270 may output the light 650 with a defined amount of wavefront divergence corresponding to the wavefront divergence of a light field produced by a point on a desired depth plane 240. In some embodiments, the same amount of wavefront divergence is provided for all objects presented on that depth plane. In addition, it will be illustrated that the other eye of the user may be provided with image information from a similar waveguide.

In some embodiments, a single waveguide may be configured to output light with a set amount of wavefront divergence corresponding to a single or limited number of depth planes and/or the waveguide may be configured to output light of a limited range of wavelengths. Consequently, in some embodiments, a plurality or stack of waveguides may be utilized to provide different amounts of wavefront divergence for different depth planes and/or to output light of different ranges of wavelengths. As used herein, it will be appreciated that a depth plane may follow the contours of a flat or a curved surface. In some embodiments, advantageously for simplicity, the depth planes may follow the contours of flat surfaces.

Figure 6:
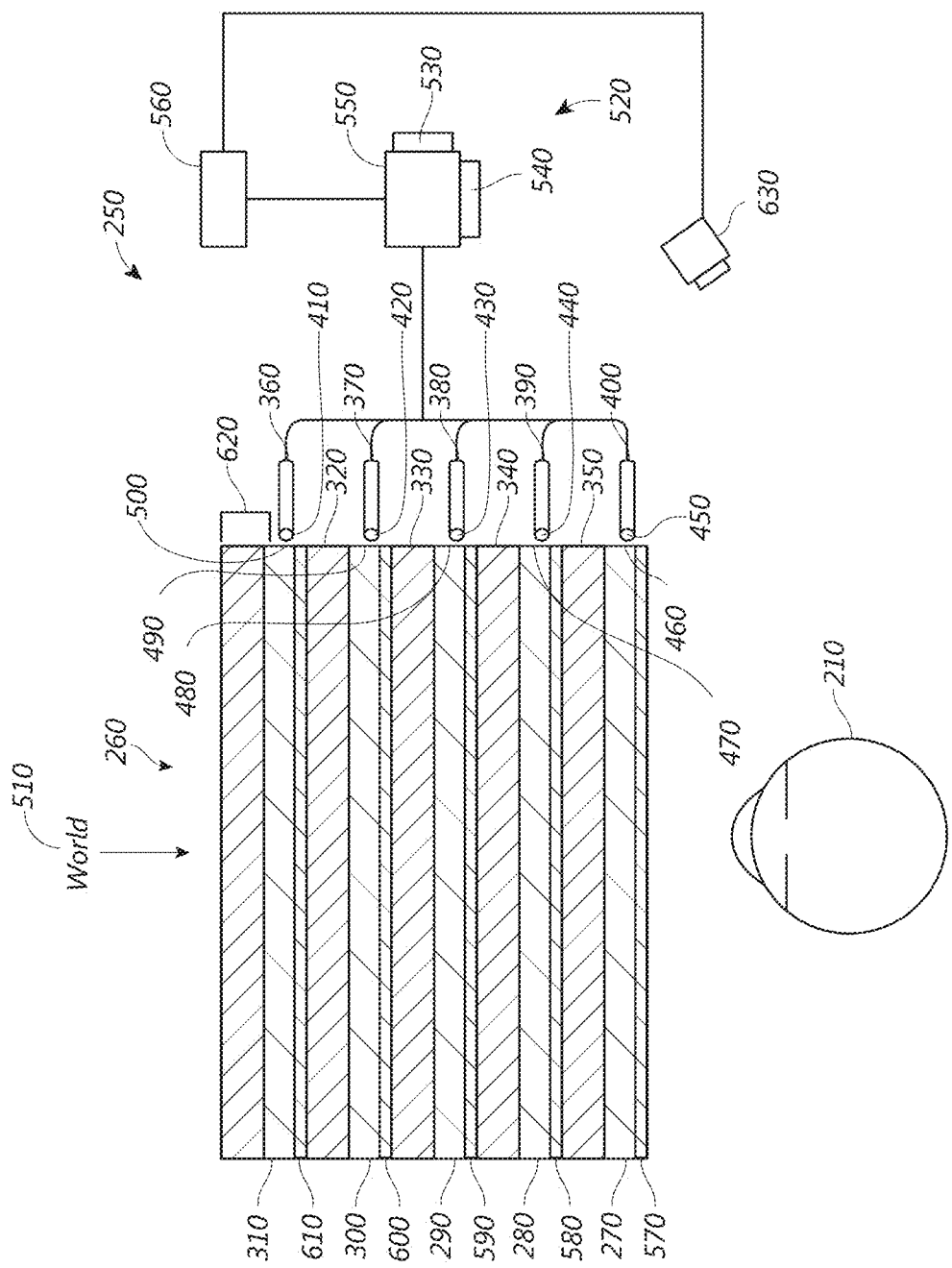
FIG. 6 illustrates an example of a waveguide stack for outputting image information to a user.

FIG. 6 illustrates an example of a waveguide stack for outputting image information to a user. A display system 250 includes a stack of waveguides, or stacked waveguide assembly, 260 that may be utilized to provide three-dimensional perception to the eye/brain using a plurality of waveguides 270, 280, 290, 300, 310. It will be appreciated that the display system 250 may be considered a light field display in some embodiments. In addition, the waveguide assembly 260 may also be referred to as an eyepiece.

In some embodiments, the display system 250 may be configured to provide substantially continuous cues to vergence and multiple discrete cues to accommodation. The cues to vergence may be provided by displaying different images to each of the eyes of the user, and the cues to accommodation may be provided by outputting the light that forms the images with selectable discrete amounts of wavefront divergence. Stated another way, the display system 250 may be configured to output light with variable levels of wavefront divergence. In some embodiments, each discrete level of wavefront divergence corresponds to a particular depth plane and may be provided by a particular one of the waveguides 270, 280, 290, 300, 310.

With continued reference to FIG. 6, the waveguide assembly 260 may also include a plurality of features 320, 330, 340, 350 between the waveguides. In some embodiments, the features 320, 330, 340, 350 may be one or more lenses. The waveguides 270, 280, 290, 300, 310 and/or the plurality of lenses 320, 330, 340, 350 may be configured to send image information to the eye with various levels of wavefront curvature or light ray divergence. Each waveguide level may be associated with a particular depth plane and may be configured to output image information corresponding to that depth plane. Image injection devices 360, 370, 380, 390, 400 may function as a source of light for the waveguides and may be utilized to inject image information into the waveguides 270, 280, 290, 300, 310, each of which may be configured, as described herein, to distribute incoming light across each respective waveguide, for output toward the eye 210. Light exits an output surface 410, 420, 430, 440, 450 of the image injection devices 360, 370, 380, 390, 400 and is injected into a corresponding input surface 460, 470, 480, 490, 500 of the waveguides 270, 280, 290, 300, 310. In some embodiments, each of the input surfaces 460, 470, 480, 490, 500 may be an edge of a corresponding waveguide, or may be part of a major surface of the corresponding waveguide (that is, one of the waveguide surfaces directly facing the world 510 or the viewer's eye 210). It will be appreciated that the major surfaces of a waveguide correspond to the surfaces of the waveguide between which the thickness of the waveguide extends. In some embodiments, a single beam of light (e.g. a collimated beam) may be injected into each waveguide to output an entire field of cloned collimated beams that are directed toward the eye 210 at particular angles (and amounts of divergence) corresponding to the depth plane associated with a particular waveguide. In some embodiments, a single one of the image injection devices 360, 370, 380, 390, 400 may be associated with and inject light into a plurality (e.g., three) of the waveguides 270, 280, 290, 300, 310.

In some embodiments, the image injection devices 360, 370, 380, 390, 400 are discrete displays that each produce image information for injection into a corresponding waveguide 270, 280, 290, 300, 310, respectively. In some other embodiments, the image injection devices 360, 370, 380, 390, 400 are the output ends of a single multiplexed display which may, e.g., pipe image information via one or more optical conduits (such as fiber optic cables) to each of the image injection devices 360, 370, 380, 390, 400. It will be appreciated that the image information provided by the image injection devices 360, 370, 380, 390, 400 may include light of different wavelengths, or colors (e.g., different component colors, as discussed herein).

In some embodiments, the light injected into the waveguides 270, 280, 290, 300, 310 is provided by a light projector system 520, which comprises a light module 530, which may include a light emitter, such as a light emitting diode (LED). The light from the light module 530 may be directed to and modified by a light modulator 540, e.g., a spatial light modulator, via a beam splitter 550. The light modulator 540 may be configured to change the perceived intensity of the light injected into the waveguides 270, 280, 290, 300, 310 to encode the light with image information. Examples of spatial light modulators include liquid crystal displays (LCD) including a liquid crystal on silicon (LCOS) displays. It will be appreciated that the image injection devices 360, 370, 380, 390, 400 are illustrated schematically and, in some embodiments, these image injection devices may represent different light paths and locations in a common projection system configured to output light into associated ones of the waveguides 270, 280, 290, 300, 310. In some embodiments, the waveguides of the waveguide assembly 260 may function as ideal lens while relaying light injected into the waveguides out to the user's eyes. In this conception, the object may be the spatial light modulator 540 and the image may be the image on the depth plane.

In some embodiments, the display system 250 may be a scanning fiber display comprising one or more scanning fibers configured to project light in various patterns (e.g., raster scan, spiral scan, Lissajous patterns, etc.) into one or more waveguides 270, 280, 290, 300, 310 and ultimately to the eye 210 of the viewer. In some embodiments, the illustrated image injection devices 360, 370, 380, 390, 400 may schematically represent a single scanning fiber or a bundle of scanning fibers configured to inject light into one or a plurality of the waveguides 270, 280, 290, 300, 310. In some other embodiments, the illustrated image injection devices 360, 370, 380, 390, 400 may schematically represent a plurality of scanning fibers or a plurality of bundles of scanning fibers, each of which are configured to inject light into an associated one of the waveguides 270, 280, 290, 300, 310. It will be appreciated that one or more optical fibers may be configured to transmit light from the light module 530 to the one or more waveguides 270, 280, 290, 300, 310. It will be appreciated that one or more intervening optical structures may be provided between the scanning fiber, or fibers, and the one or more waveguides 270, 280, 290, 300, 310 to, e.g., redirect light exiting the scanning fiber into the one or more waveguides 270, 280, 290, 300, 310.

A controller 560 controls the operation of one or more of the stacked waveguide assembly 260, including operation of the image injection devices 360, 370, 380, 390, 400, the light source 530, and the light modulator 540. In some embodiments, the controller 560 is part of the local data processing module 140. The controller 560 includes programming (e.g., instructions in a non-transitory medium) that regulates the timing and provision of image information to the waveguides 270, 280, 290, 300, 310 according to, e.g., any of the various schemes disclosed herein. In some embodiments, the controller may be a single integral device, or a distributed system connected by wired or wireless communication channels. The controller 560 may be part of the processing modules 140 or 150 (FIG. 9D) in some embodiments.

With continued reference to FIG. 6, the waveguides 270, 280, 290, 300, 310 may be configured to propagate light within each respective waveguide by total internal reflection (TIR). The waveguides 270, 280, 290, 300, 310 may each be planar or have another shape (e.g., curved), with major top and bottom surfaces and edges extending between those major top and bottom surfaces. In the illustrated configuration, the waveguides 270, 280, 290, 300, 310 may each include out-coupling optical elements 570, 580, 590, 600, 610 that are configured to extract light out of a waveguide by redirecting the light, propagating within each respective waveguide, out of the waveguide to output image information to the eye 210. Extracted light may also be referred to as out-coupled light and the out-coupling optical elements light may also be referred to light extracting optical elements. An extracted beam of light may be outputted by the waveguide at locations at which the light propagating in the waveguide strikes a light extracting optical element. The out-coupling optical elements 570, 580, 590, 600, 610 may, for example, be gratings, including diffractive optical features, as discussed further herein. While illustrated disposed at the bottom major surfaces of the waveguides 270, 280, 290, 300, 310, for ease of description and drawing clarity, in some embodiments, the out-coupling optical elements 570, 580, 590, 600, 610 may be disposed at the top and/or bottom major surfaces, and/or may be disposed directly in the volume of the waveguides 270, 280, 290, 300, 310, as discussed further herein. In some embodiments, the out-coupling optical elements 570, 580, 590, 600, 610 may be formed in a layer of material that is attached to a transparent substrate to form the waveguides 270, 280, 290, 300, 310. In some other embodiments, the waveguides 270, 280, 290, 300, 310 may be a monolithic piece of material and the out-coupling optical elements 570, 580, 590, 600, 610 may be formed on a surface and/or in the interior of that piece of material.

With continued reference to FIG. 6, as discussed herein, each waveguide 270, 280, 290, 300, 310 is configured to output light to form an image corresponding to a particular depth plane. For example, the waveguide 270 nearest the eye may be configured to deliver collimated light (which was injected into such waveguide 270), to the eye 210. The collimated light may be representative of the optical infinity focal plane. The next waveguide up 280 may be configured to send out collimated light which passes through the first lens 350 (e.g., a negative lens) before it may reach the eye 210; such first lens 350 may be configured to create a slight convex wavefront curvature so that the eye/brain interprets light coming from that next waveguide up 280 as coming from a first focal plane closer inward toward the eye 210 from optical infinity. Similarly, the third up waveguide 290 passes its output light through both the first 350 and second 340 lenses before reaching the eye 210; the combined optical power of the first 350 and second 340 lenses may be configured to create another incremental amount of wavefront curvature so that the eye/brain interprets light coming from the third waveguide 290 as coming from a second focal plane that is even closer inward toward the person from optical infinity than was light from the next waveguide up 280.

The other waveguide layers 300, 310 and lenses 330, 320 are similarly configured, with the highest waveguide 310 in the stack sending its output through all of the lenses between it and the eye for an aggregate focal power representative of the closest focal plane to the person. To compensate for the stack of lenses 320, 330, 340, 350 when viewing/interpreting light coming from the world 510 on the other side of the stacked waveguide assembly 260, a compensating lens layer 620 may be disposed at the top of the stack to compensate for the aggregate power of the lens stack 320, 330, 340, 350 below. Such a configuration provides as many perceived focal planes as there are available waveguide/lens pairings. Both the out-coupling optical elements of the waveguides and the focusing aspects of the lenses may be static (i.e., not dynamic or electro-active). In some alternative embodiments, either or both may be dynamic using electro-active features.

In some embodiments, two or more of the waveguides 270, 280, 290, 300, 310 may have the same associated depth plane. For example, multiple waveguides 270, 280, 290, 300, 310 may be configured to output images set to the same depth plane, or multiple subsets of the waveguides 270, 280, 290, 300, 310 may be configured to output images set to the same plurality of depth planes, with one set for each depth plane. This may provide advantages for forming a tiled image to provide an expanded field of view at those depth planes.

With continued reference to FIG. 6, the out-coupling optical elements 570, 580, 590, 600, 610 may be configured to both redirect light out of their respective waveguides and to output this light with the appropriate amount of divergence or collimation for a particular depth plane associated with the waveguide. As a result, waveguides having different associated depth planes may have different configurations of out-coupling optical elements 570, 580, 590, 600, 610, which output light with a different amount of divergence depending on the associated depth plane. In some embodiments, the light extracting optical elements 570, 580, 590, 600, 610 may be volumetric or surface features, which may be configured to output light at specific angles. For example, the light extracting optical elements 570, 580, 590, 600, 610 may be volume holograms, surface holograms, and/or diffraction gratings. In some embodiments, the features 320, 330, 340, 350 may not be lenses; rather, they may simply be spacers (e.g., cladding layers and/or structures for forming air gaps).

In some embodiments, the out-coupling optical elements 570, 580, 590, 600, 610 are diffractive features that form a diffraction pattern, or "diffractive optical element" (also referred to herein as a "DOE"). Preferably, the DOE's have a sufficiently low diffraction efficiency so that only a portion of the light of the beam is deflected away toward the eye 210 with each intersection of the DOE, while the rest continues to move through a waveguide via TIR. The light carrying the image information is thus divided into a number of related exit beams that exit the waveguide at a multiplicity of locations and the result is a fairly uniform pattern of exit emission toward the eye 210 for this particular collimated beam bouncing around within a waveguide.

In some embodiments, one or more DOEs may be switchable between "on" states in which they actively diffract, and "off" states in which they do not significantly diffract. For instance, a switchable DOE may comprise a layer of polymer dispersed liquid crystal, in which microdroplets comprise a diffraction pattern in a host medium, and the refractive index of the microdroplets may be switched to substantially match the refractive index of the host material (in which case the pattern does not appreciably diffract incident light) or the microdroplet may be switched to an index that does not match that of the host medium (in which case the pattern actively diffracts incident light).

In some embodiments, a camera assembly 630 (e.g., a digital camera, including visible light and infrared light cameras) may be provided to capture images of the eye 210 and/or tissue around the eye 210 to, e.g., detect user inputs and/or to monitor the physiological state of the user. As used herein, a camera may be any image capture device. In some embodiments, the camera assembly 630 may include an image capture device and a light source to project light (e.g., infrared light) to the eye, which may then be reflected by the eye and detected by the image capture device. In some embodiments, the camera assembly 630 may be attached to the frame 80 (FIG. 9D) and may be in electrical communication with the processing modules 140 and/or 150, which may process image information from the camera assembly 630. In some embodiments, one camera assembly 630 may be utilized for each eye, to separately monitor each eye.

Figure 7:
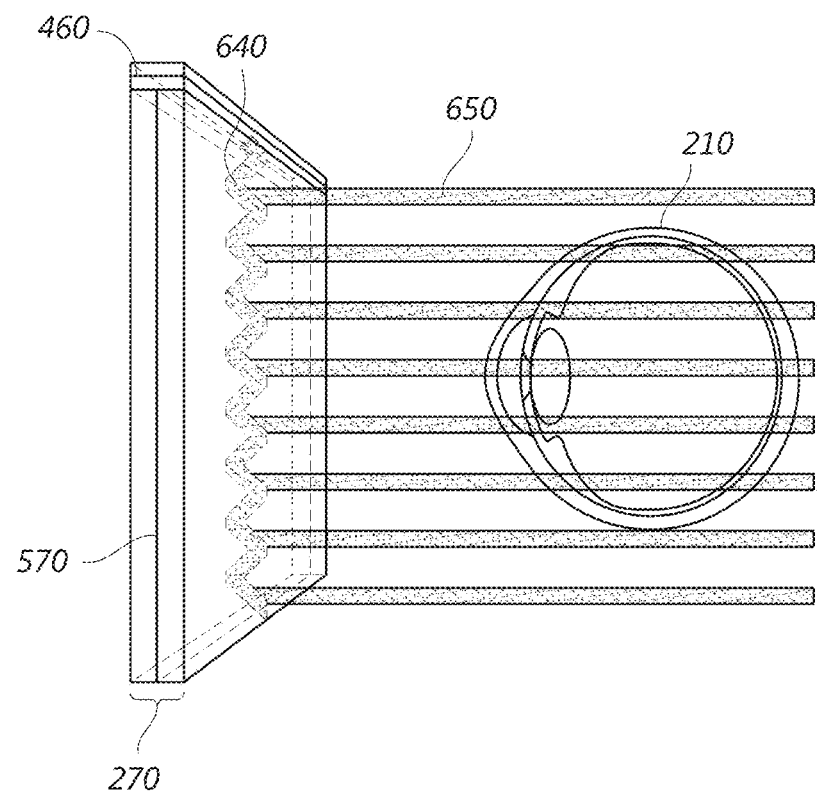
FIG. 7 illustrates an example of exit beams outputted by a waveguide.

With reference now to FIG. 7, an example of exit beams outputted by a waveguide is shown. One waveguide is illustrated, but it will be appreciated that other waveguides in the waveguide assembly 260 (FIG. 6) may function similarly, where the waveguide assembly 260 includes multiple waveguides. Light 640 is injected into the waveguide 270 at the input surface 460 of the waveguide 270 and propagates within the waveguide 270 by TIR. At points where the light 640 impinges on the DOE 570, a portion of the light exits the waveguide as exit beams 650. The exit beams 650 are illustrated as substantially parallel but, as discussed herein, they may also be redirected to propagate to the eye 210 at an angle (e.g., forming divergent exit beams), depending on the depth plane associated with the waveguide 270. It will be appreciated that substantially parallel exit beams may be indicative of a waveguide with out-coupling optical elements that out-couple light to form images that appear to be set on a depth plane at a large distance (e.g., optical infinity) from the eye 210. Other waveguides or other sets of out-coupling optical elements may output an exit beam pattern that is more divergent, which would require the eye 210 to accommodate to a closer distance to bring it into focus on the retina and would be interpreted by the brain as light from a distance closer to the eye 210 than optical infinity.

Figure 8:
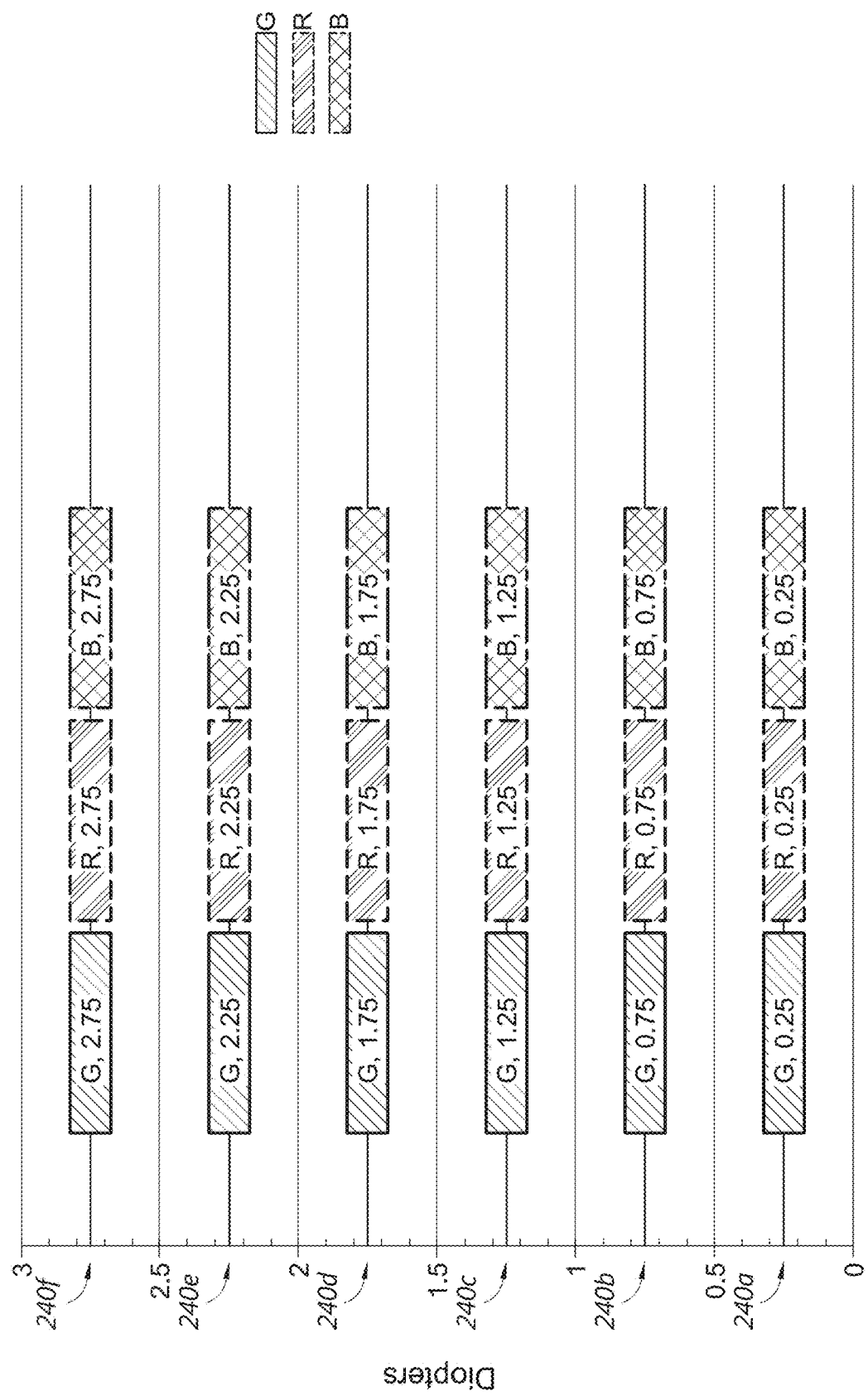
FIG. 8 illustrates an example of a stacked waveguide assembly in which each depth plane includes images formed using multiple different component colors.

In some embodiments, a full color image may be formed at each depth plane by overlaying images in each of the component colors, e.g., three or more component colors. FIG. 8 illustrates an example of a stacked waveguide assembly in which each depth plane includes images formed using multiple different component colors. The illustrated embodiment shows depth planes 240a-240f, although more or fewer depths are also contemplated. Each depth plane may have three or more component color images associated with it, including: a first image of a first color, G; a second image of a second color, R; and a third image of a third color, B. Different depth planes are indicated in the figure by different numbers for diopters (dpt) following the letters G, R, and B. Just as examples, the numbers following each of these letters indicate diopters (1/m), or inverse distance of the depth plane from a viewer, and each box in the figures represents an individual component color image. In some embodiments, to account for differences in the eye's focusing of light of different wavelengths, the exact placement of the depth planes for different component colors may vary. For example, different component color images for a given depth plane may be placed on depth planes corresponding to different distances from the user. Such an arrangement may increase visual acuity and user comfort and/or may decrease chromatic aberrations.

In some embodiments, light of each component color may be outputted by a single dedicated waveguide and, consequently, each depth plane may have multiple waveguides associated with it. In such embodiments, each box in the figures including the letters G, R, or B may be understood to represent an individual waveguide, and three waveguides may be provided per depth plane where three component color images are provided per depth plane. While the waveguides associated with each depth plane are shown adjacent to one another in this drawing for ease of description, it will be appreciated that, in a physical device, the waveguides may all be arranged in a stack with one waveguide per level. In some other embodiments, multiple component colors may be outputted by the same waveguide, such that, e.g., only a single waveguide may be provided per depth plane.

With continued reference to FIG. 8, in some embodiments, G is the color green, R is the color red, and B is the color blue. In some other embodiments, other colors associated with other wavelengths of light, including magenta and cyan, may be used in addition to or may replace one or more of red, green, or blue.

It will be appreciated that references to a given color of light throughout this disclosure will be understood to encompass light of one or more wavelengths within a range of wavelengths of light that are perceived by a viewer as being of that given color. For example, red light may include light of one or more wavelengths in the range of about 620-780 nm, green light may include light of one or more wavelengths in the range of about 492-577 nm, and blue light may include light of one or more wavelengths in the range of about 435-493 nm.

In some embodiments, the light source 530 (FIG. 6) may be configured to emit light of one or more wavelengths outside the visual perception range of the viewer, for example, infrared and/or ultraviolet wavelengths. In addition, the in-coupling, out-coupling, and other light redirecting structures of the waveguides of the display 250 may be configured to direct and emit this light out of the display towards the user's eye 210, e.g., for imaging and/or user stimulation applications.

Figure 9A:
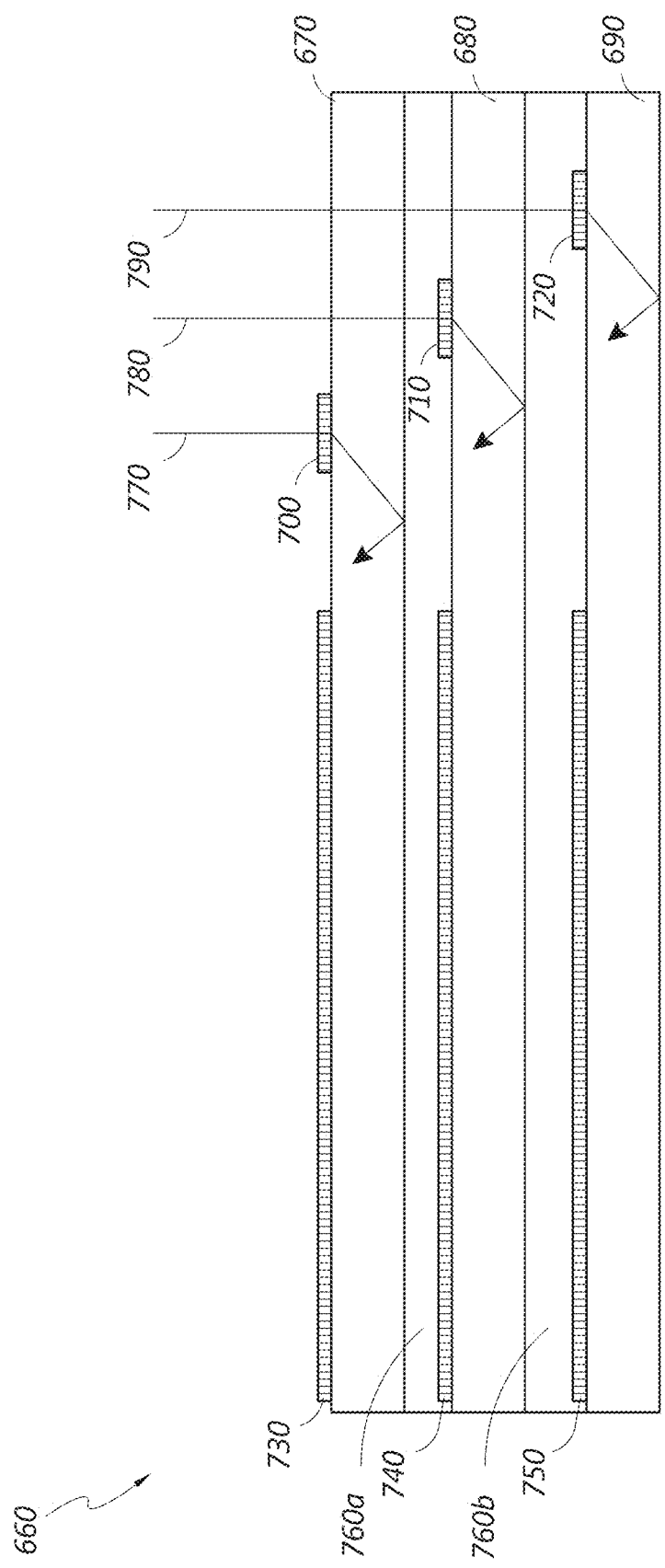
FIG. 9A illustrates a cross-sectional side view of an example of a set of stacked waveguides that each includes an incoupling optical element.

With reference now to FIG. 9A, in some embodiments, light impinging on a waveguide may need to be redirected to in-couple that light into the waveguide. An in-coupling optical element may be used to redirect and in-couple the light into its corresponding waveguide. FIG. 9A illustrates a cross-sectional side view of an example of a plurality or set 660 of stacked waveguides that each includes an in-coupling optical element. The waveguides may each be configured to output light of one or more different wavelengths, or one or more different ranges of wavelengths. It will be appreciated that the stack 660 may correspond to the stack 260 (FIG. 6) and the illustrated waveguides of the stack 660 may correspond to part of the plurality of waveguides 270, 280, 290, 300, 310, except that light from one or more of the image injection devices 360, 370, 380, 390, 400 is injected into the waveguides from a position that requires light to be redirected for in-coupling.

The illustrated set 660 of stacked waveguides includes waveguides 670, 680, and 690. Each waveguide includes an associated in-coupling optical element (which may also be referred to as a light input area on the waveguide), with, e.g., in-coupling optical element 700 disposed on a major surface (e.g., an upper major surface) of waveguide 670, in-coupling optical element 710 disposed on a major surface (e.g., an upper major surface) of waveguide 680, and in-coupling optical element 720 disposed on a major surface (e.g., an upper major surface) of waveguide 690. In some embodiments, one or more of the in-coupling optical elements 700, 710, 720 may be disposed on the bottom major surface of the respective waveguide 670, 680, 690 (particularly where the one or more in-coupling optical elements are reflective, deflecting optical elements). As illustrated, the in-coupling optical elements 700, 710, 720 may be disposed on the upper major surface of their respective waveguide 670, 680, 690 (or the top of the next lower waveguide), particularly where those in-coupling optical elements are transmissive, deflecting optical elements. In some embodiments, the in-coupling optical elements 700, 710, 720 may be disposed in the body of the respective waveguide 670, 680, 690. In some embodiments, as discussed herein, the in-coupling optical elements 700, 710, 720 are wavelength selective, such that they selectively redirect one or more wavelengths of light, while transmitting other wavelengths of light. While illustrated on one side or corner of their respective waveguide 670, 680, 690, it will be appreciated that the in-coupling optical elements 700, 710, 720 may be disposed in other areas of their respective waveguide 670, 680, 690 in some embodiments.

As illustrated, the in-coupling optical elements 700, 710, 720 may be laterally offset from one another. In some embodiments, each in-coupling optical element may be offset such that it receives light without that light passing through another in-coupling optical element. For example, each in-coupling optical element 700, 710, 720 may be configured to receive light from a different image injection device 360, 370, 380, 390, and 400 as shown in FIG. 6, and may be separated (e.g., laterally spaced apart) from other in-coupling optical elements 700, 710, 720 such that it substantially does not receive light from the other ones of the in-coupling optical elements 700, 710, 720.

Each waveguide also includes associated light distributing elements, with, e.g., light distributing elements 730 disposed on a major surface (e.g., a top major surface) of waveguide 670, light distributing elements 740 disposed on a major surface (e.g., a top major surface) of waveguide 680, and light distributing elements 750 disposed on a major surface (e.g., a top major surface) of waveguide 690. In some other embodiments, the light distributing elements 730, 740, 750, may be disposed on a bottom major surface of associated waveguides 670, 680, 690, respectively. In some other embodiments, the light distributing elements 730, 740, 750, may be disposed on both top and bottom major surface of associated waveguides 670, 680, 690, respectively; or the light distributing elements 730, 740, 750, may be disposed on different ones of the top and bottom major surfaces in different associated waveguides 670, 680, 690, respectively.

The waveguides 670, 680, 690 may be spaced apart and separated by, e.g., gas, liquid, and/or solid layers of material. For example, as illustrated, layer 760*a* may separate waveguides 670 and 680; and layer 760*b* may separate waveguides 680 and 690. In some embodiments, the layers 760*a* and 760*b* are formed of low refractive index materials (that is, materials having a lower refractive index than the material forming the immediately adjacent one of waveguides 670, 680, 690). Preferably, the refractive index of the material forming the layers 760*a*, 760*b* is 0.05 or more, or 0.10 or less than the refractive index of the material forming the waveguides 670, 680, 690. Advantageously, the lower refractive index layers 760*a*, 760*b* may function as cladding layers that facilitate total internal reflection (TIR) of light through the waveguides 670, 680, 690 (e.g., TIR between the top and bottom major surfaces of each waveguide). In some embodiments, the layers 760*a*, 760*b* are formed of air. While not illustrated, it will be appreciated that the top and bottom of the illustrated set 660 of waveguides may include immediately neighboring cladding layers.

Preferably, for ease of manufacturing and other considerations, the material forming the waveguides 670, 680, 690 are similar or the same, and the material forming the layers 760*a*, 760*b* are similar or the same. In some embodiments, the material forming the waveguides 670, 680, 690 may be different between one or more waveguides, and/or the material forming the layers 760*a*, 760*b* may be different, while still holding to the various refractive index relationships noted above.

With continued reference to FIG. 9A, light rays 770, 780, 790 are incident on the set 660 of waveguides. It will be appreciated that the light rays 770, 780, 790 may be injected into the waveguides 670, 680, 690 by one or more image injection devices 360, 370, 380, 390, 400 (FIG. 6).

In some embodiments, the light rays 770, 780, 790 have different properties, e.g., different wavelengths or different ranges of wavelengths, which may correspond to different colors. The incoupling optical elements 700, 710, 720 each deflect the incident light such that the light propagates through a respective one of the waveguides 670, 680, 690 by TIR. In some embodiments, the incoupling optical elements 700, 710, 720 each selectively deflect one or more particular wavelengths of light, while transmitting other wavelengths to an underlying waveguide and associated incoupling optical element.

For example, in-coupling optical element 700 may be configured to deflect ray 770, which has a first wavelength or range of wavelengths, while transmitting rays 780 and 790, which have different second and third wavelengths or ranges of wavelengths, respectively. The transmitted ray 780 impinges on and is deflected by the in-coupling optical element 710, which is configured to deflect light of a second wavelength or range of wavelengths. The ray 790 is deflected by the in-coupling optical element 720, which is configured to selectively deflect light of third wavelength or range of wavelengths.

With continued reference to FIG. 9A, the deflected light rays 770, 780, 790 are deflected so that they propagate through a corresponding waveguide 670, 680, 690; that is, the in-coupling optical elements 700, 710, 720 of each waveguide deflects light into that corresponding waveguide 670, 680, 690 to in-couple light into that corresponding waveguide. The light rays 770, 780, 790 are deflected at angles that cause the light to propagate through the respective waveguide 670, 680, 690 by TIR. The light rays 770, 780, 790 propagate through the respective waveguide 670, 680, 690 by TIR until impinging on the waveguide's corresponding light distributing elements 730, 740, 750.

Figure 9B:
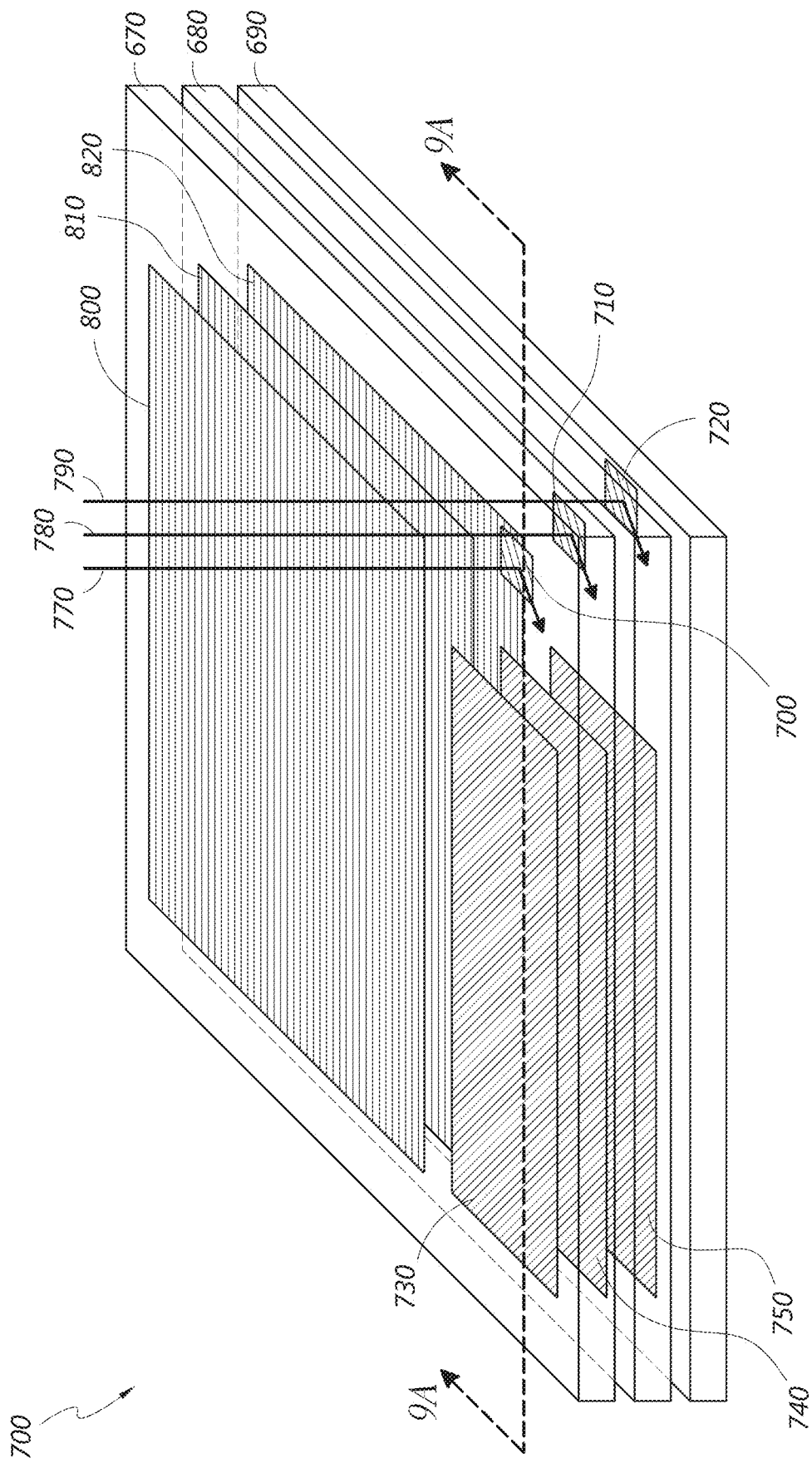
FIG. 9B illustrates a perspective view of an example of the plurality of stacked waveguides of FIG. 9A.

With reference now to FIG. 9B, a perspective view of an example of the plurality of stacked waveguides of FIG. 9A is illustrated. As noted above, the in-coupled light rays 770, 780, 790, are deflected by the in-coupling optical elements 700, 710, 720, respectively, and then propagate by TIR within the waveguides 670, 680, 690, respectively. The light rays 770, 780, 790 then impinge on the light distributing elements 730, 740, 750, respectively. The light distributing elements 730, 740, 750 deflect the light rays 770, 780, 790 so that they propagate towards the out-coupling optical elements 800, 810, 820, respectively.

In some embodiments, the light distributing elements 730, 740, 750 are orthogonal pupil expanders (OPE's). In some embodiments, the OPE's deflect or distribute light to the out-coupling optical elements 800, 810, 820 and, in some embodiments, may also increase the beam or spot size of this light as it propagates to the out-coupling optical elements. In some embodiments, the light distributing elements 730, 740, 750 may be omitted and the in-coupling optical elements 700, 710, 720 may be configured to deflect light directly to the out-coupling optical elements 800, 810, 820. For example, with reference to FIG. 9A, the light distributing elements 730, 740, 750 may be replaced with out-coupling optical elements 800, 810, 820, respectively. In some embodiments, the out-coupling optical elements 800, 810, 820 are exit pupils (EP's) or exit pupil expanders (EPE's) that direct light in a viewer's eye 210 (FIG. 7). It will be appreciated that the OPE's may be configured to increase the dimensions of the eye box in at least one axis and the EPE's may be to increase the eye box in an axis crossing, e.g., orthogonal to, the axis of the OPEs. For example, each OPE may be configured to redirect a portion of the light striking the OPE to an EPE of the same waveguide, while allowing the remaining portion of the light to continue to propagate down the waveguide. Upon impinging on the OPE again, another portion of the remaining light is redirected to the EPE, and the remaining portion of that portion continues to propagate further down the waveguide, and so on. Similarly, upon striking the EPE, a portion of the impinging light is directed out of the waveguide towards the user, and a remaining portion of that light continues to propagate through the waveguide until it strikes the EP again, at which time another portion of the impinging light is directed out of the waveguide, and so on. Consequently, a single beam of incoupled light may be "replicated" each time a portion of that light is redirected by an OPE or EPE, thereby forming a field of cloned beams of light, as shown in FIG. 6. In some embodiments, the OPE and/or EPE may be configured to modify a size of the beams of light.

Accordingly, with reference to FIGS. 9A and 9B, in some embodiments, the set 660 of waveguides includes waveguides 670, 680, 690; in-coupling optical elements 700, 710, 720; light distributing elements (e.g., OPE's) 730, 740, 750; and out-coupling optical elements (e.g., EP's) 800, 810, 820 for each component color. The waveguides 670, 680, 690 may be stacked with an air gap/cladding layer between each one. The in-coupling optical elements 700, 710, 720 redirect or deflect incident light (with different in-coupling optical elements receiving light of different wavelengths) into its waveguide. The light then propagates at an angle which will result in TIR within the respective waveguide 670, 680, 690. In the example shown, light ray 770 (e.g., blue light) is deflected by the first in-coupling optical element 700, and then continues to bounce down the waveguide, interacting with the light distributing element (e.g., OPE's) 730 and then the out-coupling optical element (e.g., EPs) 800, in a manner described earlier. The light rays 780 and 790 (e.g., green and red light, respectively) will pass through the waveguide 670, with light ray 780 impinging on and being deflected by in-coupling optical element 710. The light ray 780 then bounces down the waveguide 680 via TIR, proceeding on to its light distributing element (e.g., OPEs) 740 and then the out-coupling optical element (e.g., EP's) 810. Finally, light ray 790 (e.g., red light) passes through the waveguide 690 to impinge on the light in-coupling optical elements 720 of the waveguide 690. The light in-coupling optical elements 720 deflect the light ray 790 such that the light ray propagates to light distributing element (e.g., OPEs) 750 by TIR, and then to the out-coupling optical element (e.g., EPs) 820 by TIR. The out-coupling optical element 820 then finally out-couples the light ray 790 to the viewer, who also receives the out-coupled light from the other waveguides 670, 680.

Figure 9C:
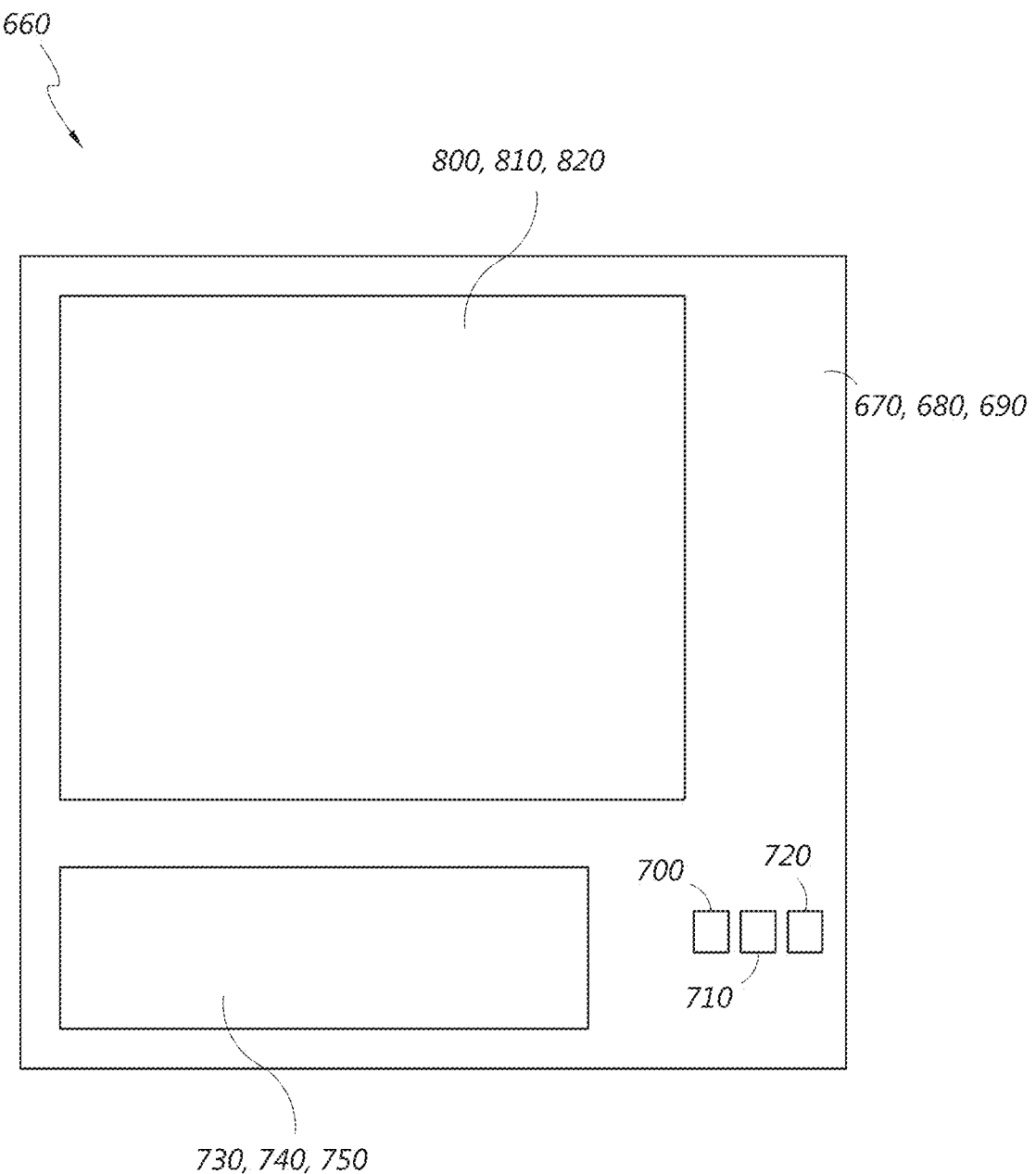
FIG. 9C illustrates a top-down plan view of an example of the plurality of stacked waveguides of FIGS. 9A and 9B.

FIG. 9C illustrates a top-down plan view of an example of the plurality of stacked waveguides of FIGS. 9A and 9B. As illustrated, the waveguides 670, 680, 690, along with each waveguide's associated light distributing element 730, 740, 750 and associated out-coupling optical element 800, 810, 820, may be vertically aligned. However, as discussed herein, the in-coupling optical elements 700, 710, 720 are not vertically aligned; rather, the in-coupling optical elements are preferably non-overlapping (e.g., laterally spaced apart as seen in the top-down view). As discussed further herein, this nonoverlapping spatial arrangement facilitates the injection of light from different resources into different waveguides on a one-to-one basis, thereby allowing a specific light source to be uniquely coupled to a specific waveguide. In some embodiments, arrangements including nonoverlapping spatially-separated in-coupling optical elements may be referred to as a shifted pupil system, and the in-coupling optical elements within these arrangements may correspond to sub pupils.

Figure 9D:
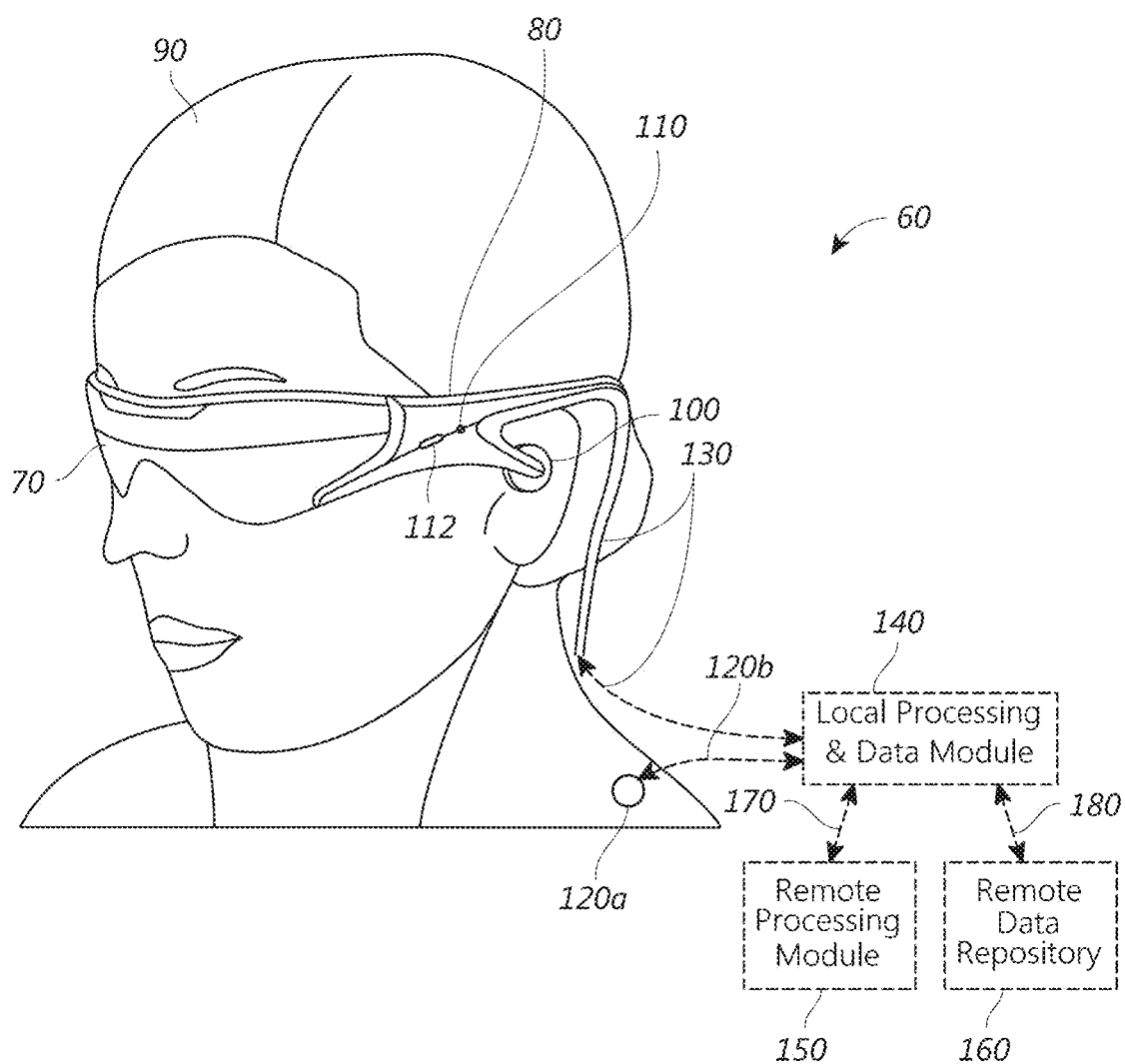
FIG. 9D illustrates an example of wearable display system.

FIG. 9D illustrates an example of wearable display system 60 into which the various waveguides and related systems disclosed herein may be integrated. In some embodiments, the display system 60 is the system 250 of FIG. 6, with FIG. 6 schematically showing some parts of that system 60 in greater detail. For example, the waveguide assembly 260 of FIG. 6 may be part of the display 70.

With continued reference to FIG. 9D, the display system 60 includes a display 70, and various mechanical and electronic modules and systems to support the functioning of that display 70. The display 70 may be coupled to a frame 80, which is wearable by a display system user or viewer 90 and which is configured to position the display 70 in front of the eyes of the user 90. The display 70 may be considered eyewear in some embodiments. In some embodiments, a speaker 100 is coupled to the frame 80 and configured to be positioned adjacent the ear canal of the user 90 (in some embodiments, another speaker, not shown, may optionally be positioned adjacent the other ear canal of the user to provide stereo/shapeable sound control). The display system 60 may also include one or more microphones 110 or other devices to detect sound. In some embodiments, the microphone is configured to allow the user to provide inputs or commands to the system 60 (e.g., the selection of voice menu commands, natural language questions, etc.), and/or may allow audio communication with other persons (e.g., with other users of similar display systems. The microphone may further be configured as a peripheral sensor to collect audio data (e.g., sounds from the user and/or environment). In some embodiments, the display system 60 may further include one or more outwardly-directed environmental sensors 112 configured to detect objects, stimuli, people, animals, locations, or other aspects of the world around the user. For example, environmental sensors 112 may include one or more cameras, which may be located, for example, facing outward so as to capture images similar to at least a portion of an ordinary field of view of the user 90. In some embodiments, the display system may also include a peripheral sensor 120a, which may be separate from the frame 80 and attached to the body of the user 90 (e.g., on the head, torso, an extremity, etc. of the user 90). The peripheral sensor 120a may be configured to acquire data characterizing a physiological state of the user 90 in some embodiments. For example, the sensor 120a may be an electrode.

With continued reference to FIG. 9D, the display 70 is operatively coupled by communications link 130, such as by a wired lead or wireless connectivity, to a local data processing module 140 which may be mounted in a variety of configurations, such as fixedly attached to the frame 80, fixedly attached to a helmet or hat worn by the user, embedded in headphones, or otherwise removably attached to the user 90 (e.g., in a backpack-style configuration, in a belt-coupling style configuration). Similarly, the sensor 120a may be operatively coupled by communications link 120b, e.g., a wired lead or wireless connectivity, to the local processor and data module 140. The local processing and data module 140 may comprise a hardware processor, as well as digital memory, such as non-volatile memory (e.g., flash memory or hard disk drives), both of which may be utilized to assist in the processing, caching, and storage of data. Optionally, the local processor and data module 140 may include one or more central processing units (CPUs), graphics processing units (GPUs), dedicated processing hardware, and so on. The data may include data a) captured from sensors (which may be, e.g., operatively coupled to the frame 80 or otherwise attached to the user 90), such as image capture devices (such as cameras), microphones, inertial measurement units, accelerometers, compasses, GPS units, radio devices, gyros, and/or other sensors disclosed herein; and/or b) acquired and/or processed using remote processing module 150 and/or remote data repository 160 (including data relating to virtual content), possibly for passage to the display 70 after such processing or retrieval. The local processing and data module 140 may be operatively coupled by communication links 170, 180, such as via a wired or wireless communication links, to the remote processing module 150 and remote data repository 160 such that these remote modules 150, 160 are operatively coupled to each other and available as resources to the local processing and data module 140. In some embodiments, the local processing and data module 140 may include one or more of the image capture devices, microphones, inertial measurement units, accelerometers, compasses, GPS units, radio devices, and/or gyros. In some other embodiments, one or more of these sensors may be attached to the frame 80, or may be standalone structures that communicate with the local processing and data module 140 by wired or wireless communication pathways.

With continued reference to FIG. 9D, in some embodiments, the remote processing module 150 may comprise one or more processors configured to analyze and process data and/or image information, for instance including one or more central processing units (CPUs), graphics processing units (GPUs), dedicated processing hardware, and so on. In some embodiments, the remote data repository 160 may comprise a digital data storage facility, which may be available through the internet or other networking configuration in a "cloud" resource configuration. In some embodiments, the remote data repository 160 may include one or more remote servers, which provide information, e.g., information for generating augmented reality content, to the local processing and data module 140 and/or the remote processing module 150. In some embodiments, all data is stored and all computations are performed in the local processing and data module, allowing fully autonomous use from a remote module. Optionally, an outside system (e.g., a system of one or more processors, one or more computers) that includes CPUs, GPUs, and so on, may perform at least a portion of processing (e.g., generating image information, processing data) and provide information to, and receive information from, modules 140, 150, 160, for instance via wireless or wired connections.

Example Waveguide Structures

Figure 10A:
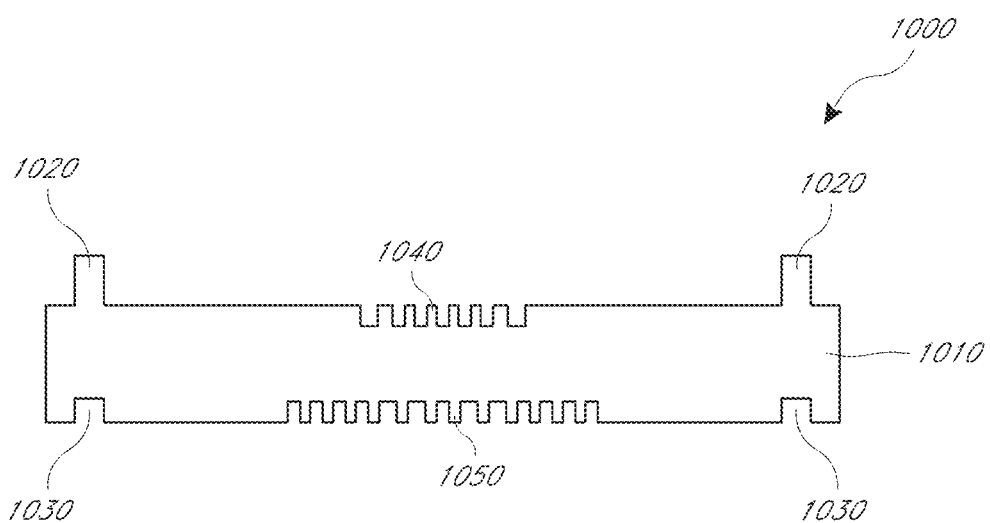
FIG. 10A illustrates an example of a waveguide comprising spacers.

Referring now to FIG. 10A, an example of a waveguide comprising spacers is illustrated. A waveguide 1000 comprises a main optically transmissive body 1010 and spacers 1020 extending vertically from a major surface 1022 of the main body 1010. Preferably, the spacers 1020 are integral with the waveguide 1000 and form a monolithic structure with at least a part of the waveguide defining the major surface 1022. More preferably, the spacers 1020 form a monolithic structure with the entire waveguide 1000, with the material of the waveguide 1000 extending vertically to form the spacers 1020. As a result, the spacers 1020 and main body 1010 may be formed of the same material and be without an intervening boundary.

In some embodiments, the spacers 1020 may be formed of a different material than the main body 1010, such that an intervening boundary exists at the interface of the spacers 1020 and the main body 1010. For example, the spacers 1020 may comprise locally deposited material, which is then imprinted to form the spacers 1020.

In some embodiments, indentations 1030 are provided extending into a major surface 1032 of the waveguide 1000. As illustrated, the major surface 1032 and, thus, the indentations 1030 are disposed on a side of the waveguide 1000 opposite the major surface 1022. As discussed further herein, the indentations 1030 are preferably positioned, shaped, and sized such that spacers of an underlying waveguide (not illustrated) may be accommodated within those indentations 1030. Similarly, the spacers 1020 are preferably position, shaped, and sized such that they may be accommodated within indentations of an overlying waveguide (not illustrated). In some embodiments, the waveguide 1000 may be provided without indentations 1030 and any underlying spacers may simply contact the major surface 1032.

With continued reference to FIG. 10A, in some embodiments, the major surface 1022 may comprise surface relief features 1040. As illustrated, the spacers 1020 extend vertically to a height greater than the top of the surface relief features 1040. Preferably, the spacers 1020 have a height sufficient to space the waveguide 1000 from an overlying waveguide by a desired separation distance, e.g., 30 μm or more. In some embodiments, the spacers 1020 have a height of 30 μm or more. As discussed herein, the spacers 1020 may fit within the indentations 1030 of an overlying waveguide in some embodiments. In such embodiments, the height of the spacers 1020 may be equal to the desired separation between waveguides (e.g., 30 μm) plus the height of the indentations in which the spacers are inserted.

Additionally or alternatively to the surface relief features 1040, in some embodiments, the opposing major surface 1032 may comprise surface relief features 1050. In some embodiments, one or both of the surface relief features 1040 and 1050 may include a pattern of protrusions and indentations sized and arranged to form a diffractive optical element, such as diffractive gratings. It will be appreciated that such diffractive optical elements may correspond to one or more of the in-coupling optical elements 700, 710, 720; light distributing elements 730, 740, 750; or out-coupling optical elements 800, 810, 820 of FIGS. 9A-9C. In some embodiments, the waveguide 1000 may omit one or both of the surface relief features 1040, 1050 such that the major surfaces 1022, 1032 may be smooth except for spacers 1020, 1030, respectively.

In some embodiments, the surface relief features 1040, 1050 may advantageously increase the density of surface relief features across a given expanse of the waveguide 1000 and may be identical. In some other embodiments, the surface relief features 1040, 1050 may be different. For example, the surface relief features 1040 may be configured to diffract light of different wavelengths and/or different incident angles and/or to output light at different angles from the surface relief features 1050.

With continued reference to FIG. 10A, the waveguide 1000 is formed of an optically transmissive material, e.g., a highly transparent material. Preferably, the material has a high refractive index, which may provide advantages for providing a large field of view. In some embodiments, the material has a refractive index greater than 1.5, or greater than 1.65. The material forming the waveguide 1000 may be a highly transparent polymer material, e.g., an organic polymer material. Examples of high refractive index materials include polyimide-based high index resins, halogen-containing (e.g., bromine or iodine-containing) polymers, phosphorous containing polymers, thiol-ene based polymers, and high refractive index resin materials. Examples of high refractive index resin materials include those commercially available from NTT-AT of Kawasaki-shi, Kanagawa, Japan, such as the high refractive index resins sold under the name #565 and #566; and high refractive index resin materials commercially available from Akron Polymer System of Akron, Ohio, USA, such as the high refractive index resins sold under the name APS-1000, APS2004, APS-4001, and as part of the APS 3000 series.

Figure 10B:
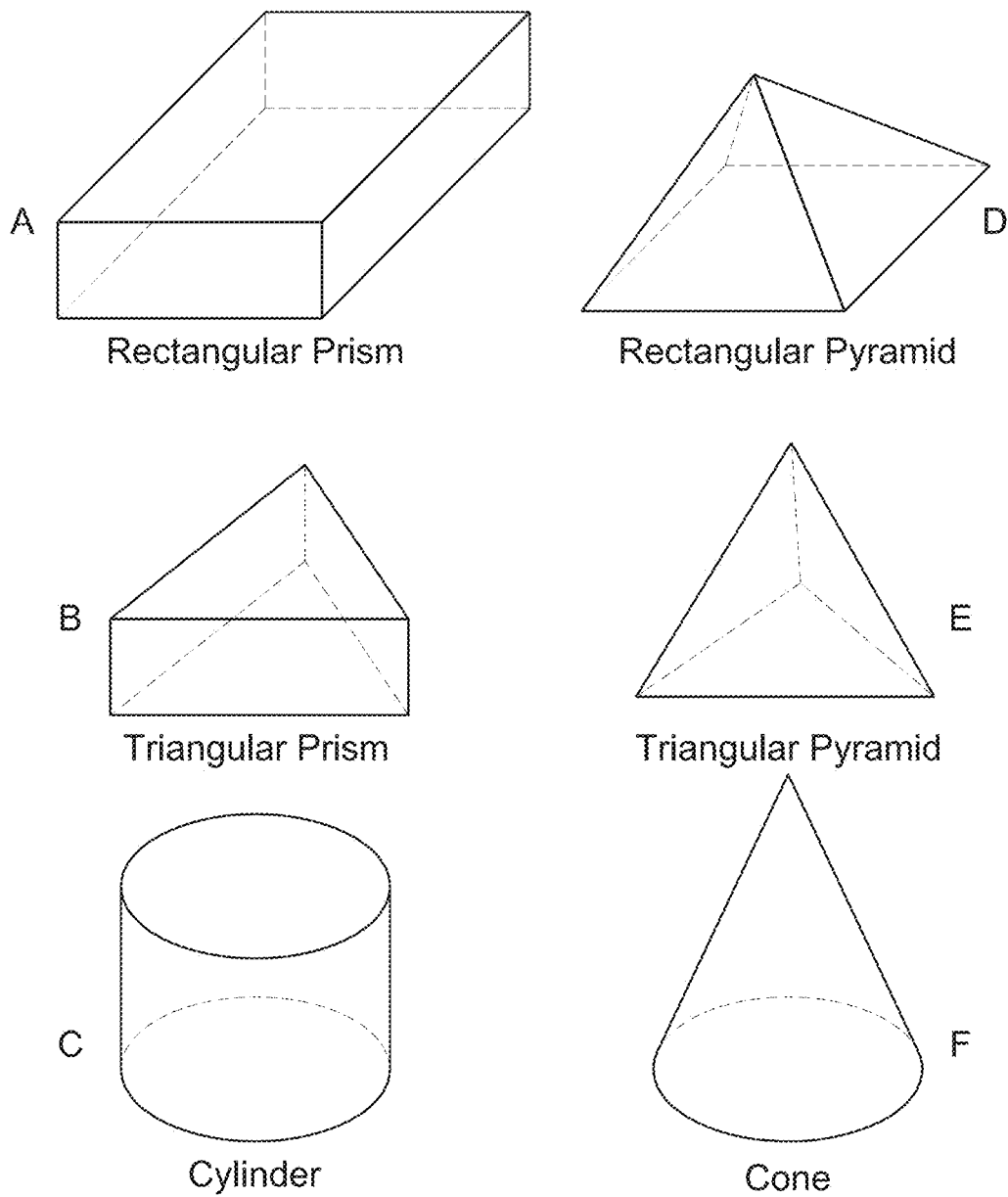
FIG. 10B illustrates examples of 3-dimensional shapes for spacers and indentations for accommodating the spacers.

With reference now to FIG. 10B, examples of 3-dimensional shapes for spacers and indentations for accommodating the spacers are illustrated. In some embodiments, the spacers 1020 and corresponding indentations 1030 may be laterally-elongated three-dimensional volumes. It will be appreciated that such laterally-elongated volumes may provide advantages for structural stability and mechanical strength, particularly where the waveguides are utilized to form stacks of similar waveguides. An example of such a laterally-elongated three-dimensional volume is shape A, a rectangular prism. In some embodiments, the spacers 1020 and corresponding indentations 1030 may have other shapes including rectangular prisms (shape B), cylinders (shape C), rectangular pyramids (shape D), triangular pyramids (shape E), and cones (shape F). It will be appreciated that, in a single waveguide and/or a stack of waveguides, multiple different shapes may be utilized in some embodiments. In some embodiments, the tops of the spacers 1020, having a pointed shape (e.g., a rectangular pyramid (shape D), a triangular pyramid (shape E), or a cone (shape F)), may be rounded or flattened to reduce stress at the point of contact with an overlying structure such as another waveguide. Where the spacers 1020 are formed by imprinting, the desired rounding or flattening of the tops of the shapes may be formed by an appropriately shaped mold or imprint reticle.

Figure 10C:
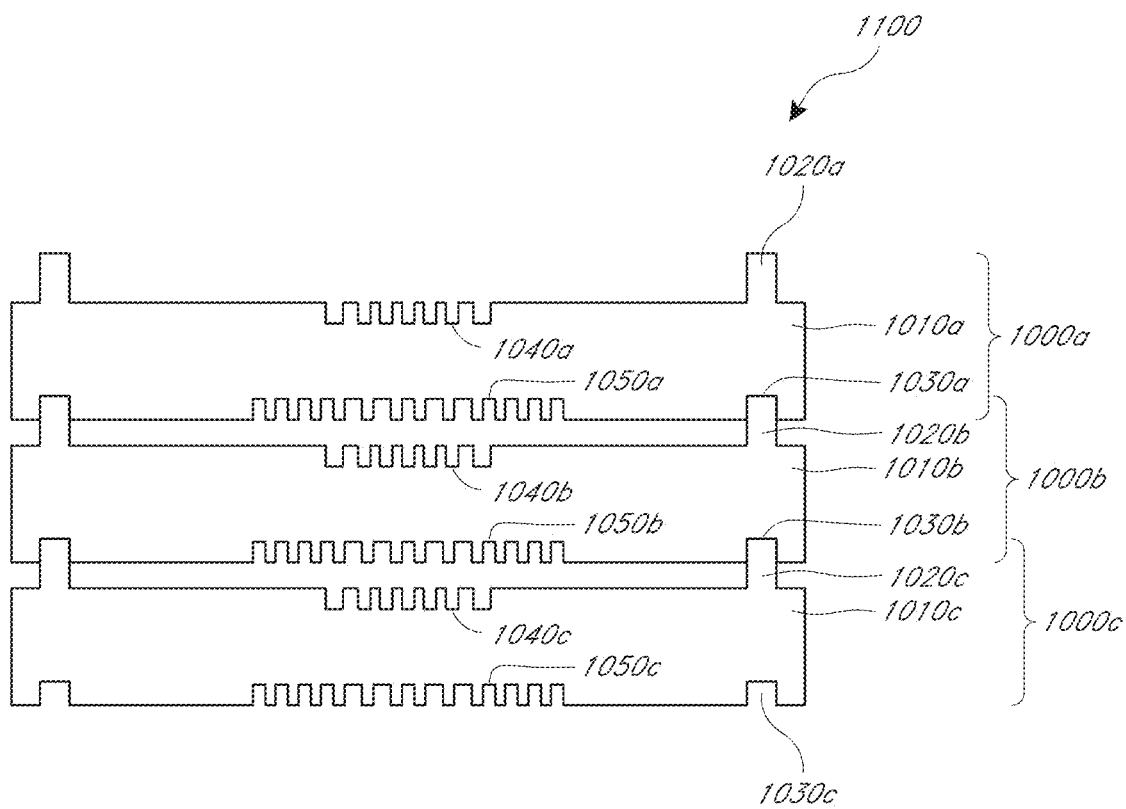
FIG. 10C illustrates an example of a stack of waveguides comprising spacers.

With reference now to FIG. 10C, an example of a stack of waveguides comprising spacers as illustrated. A stack 1100 of waveguides comprises individual waveguides 1000a, 1000b, and 1000c have, respectively, optically transmissive bodies 1010a, 1010b, 1010c. Each waveguide comprises, respectively, spacers 1020a, 1020b, 1020c. Preferably, each waveguide also comprises, respectively, indentations 1030a, 1030b, 1030c for accommodating the spacers of a directly underlying waveguide. It will be appreciated that the spacers have a height greater than the depth of the indentations, such that, once accommodated into the indentations, the spacers separate the waveguides by a gap (e.g., an air gap). As illustrated, the spacers 1020b fit within the indentations 1030a, and the spacers 1020c fit within the indentations 1030b.

In some embodiments, one or more of the waveguides 1000a, 1000b, 1000c may comprise surface relief features on one or more major surfaces of those waveguides. For example, each of these waveguides may comprise surface relief features 1040a, 1050b corresponding to the surface relief features 1040, 1050 of the waveguide 1000 (FIG. 10A). In some embodiments, different ones of the waveguides 1000a, 1000b, 1000c may include diffractive optical elements configured to incouple and/or outcouple light of different wavelengths, e.g., corresponding to different component colors for forming a full-color image. For example, the waveguides 1000a, 1000b, 1000c may correspond to the waveguides 670, 680, 690 of FIGS. 9A-9C.

It will be appreciated that light may propagate through the waveguides 1000a, 1000b, 1000c by total internal reflection, e.g., from incoupling optical elements to outcoupling optical elements. In addition, light leakage between the waveguides may degrade image quality. To reduce the likelihood that the spacers 1020, 1020a, 1020b, 1020c may be conduits for light leakage between waveguides, the spacers 1020, 1020a, 1020b, 1020c are preferably disposed at locations that are out of the path of propagation of light between incoupling optical elements and outcoupling optical elements.

Figure 11A:
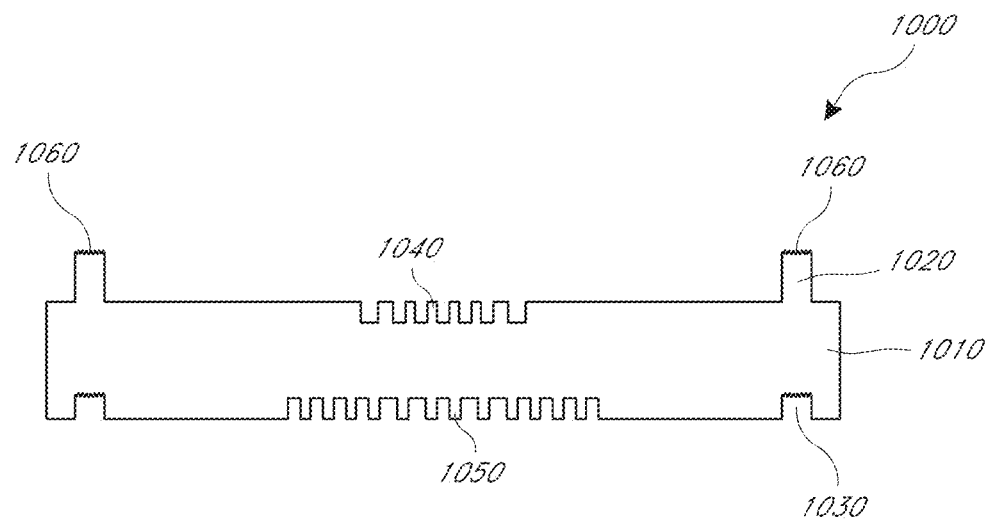
FIG. 11A illustrates an example of a waveguide comprising spacers with light scattering features.

In some embodiments, light leakage between waveguides may be mitigated using one or both of light scattering features and light leakage prevention materials at the interface between spacers 1020, 1020a, 1020b, 1020c and immediately adjacent waveguides. Examples of light leakage prevention materials include light absorbing materials and layers of material forming anti-reflective coatings. FIG. 11A illustrates an example of a waveguide comprising spacers 1020 with light scattering features 1060 on surfaces of the spacers that are configured to interface with an overlying waveguide. In some embodiments, the light scattering features 1060 may take the form of peaks and valleys (e.g., irregularly oriented peaks and valleys) on the surface of the spacers 1020. In some embodiments, the light scattering features 1060 may be provided only on top surfaces of the spacers. In some other embodiments, the light scattering features 1060 may also extend on the sides of the spacers 1020. It will be appreciated that light scattering features 1060 may be formed by roughening surfaces of the spacers 1020, e.g., by abrasion. In some embodiments, the light scattering features 1060 may be formed during the formation of the spacers 1020. For example, spacers 1020 may be formed by imprinting, and the mold used to form the spacers 1020 may include a pattern to form the light scattering features 1060 at the tops of the spacers 1020 thereby advantageously allowing simultaneous formation of the waveguide features (e.g., diffractive optical elements 1040), spacers 1020, and the light scattering features 1060. It will be appreciated that conventional waveguide materials such as glasses are generally considered not compatible with such simultaneous formation, due to concerns regarding breakage of discrete integral protrusions such as spacers and an inability to accurately reproduce the constituent features that form the diffractive optical elements 1040 and light scattering features 1060.

Figure 11B:
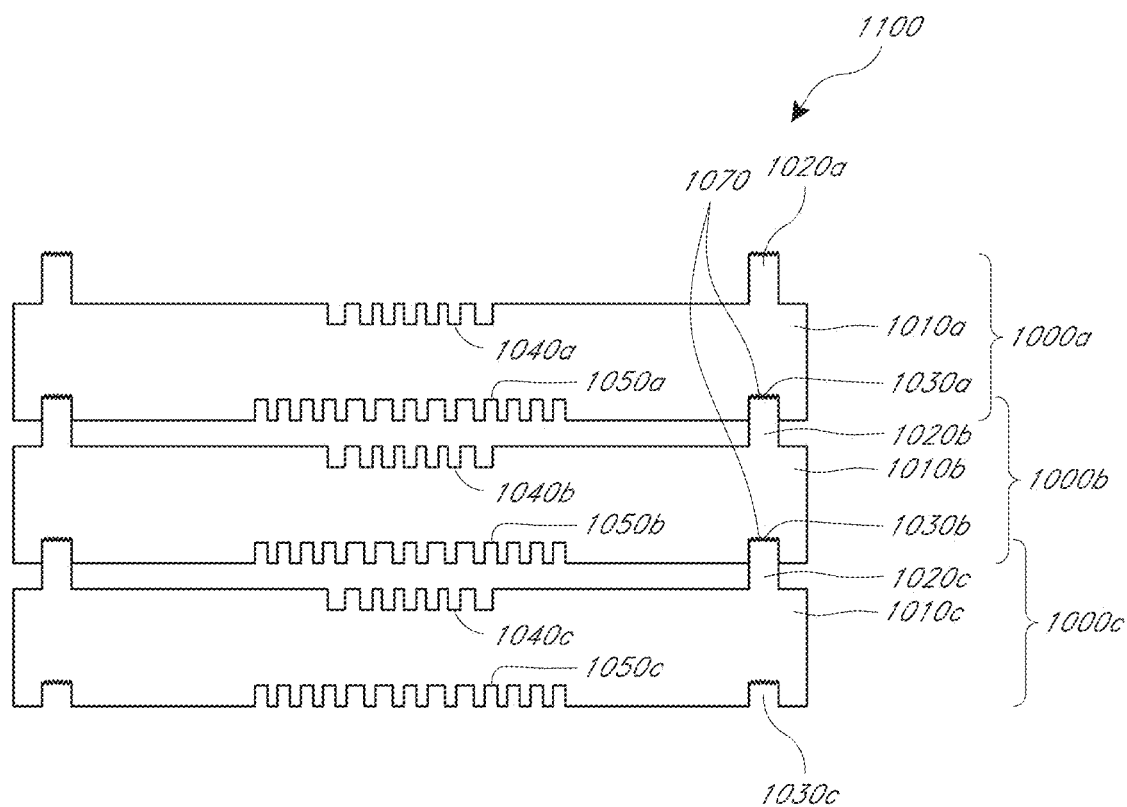
FIG. 11B illustrates an example of a stack of waveguides comprising spacers and light leakage prevention material at the interface between spacers and immediately neighboring waveguides.

As noted above, in some embodiments, one or more layers of material may be utilized to prevent light leakage between spacers and waveguides. FIG. 11B illustrates an example of a stack of waveguides 1100 comprising spacers 1020a, 1020b, 1020c and light leakage prevention material 1070 at the interface between the spacers and immediately neighboring ones of the waveguides 1000a, 1000b, 1000c. For example, light leakage prevention material 1070 may be a light absorbing material and/or one or more layers of material forming an antireflective coating. The light leakage prevention material 1070 may be provided between spacers 1020b and waveguide 1000a. Light leakage prevention material 1070 may also be provided between spacers 1020c and waveguide 1000b. In some embodiments, the light leakage prevention material 1070 may be applied to the spacers before attaching the spacers to another waveguide. For example, light leakage prevention material 1070 may be deposited on surfaces of the spacers before inserting the spacers into matching indentations in an overlying waveguide. Examples of light absorbing materials to serve as the light leakage prevention material 1070 include carbon black, meso-porous carbon, carbon nanotubes (single-walled as well as multi-walled nanotubes). Example of carbon nanotubes include single atom carbon nanotubes such as VANTA BLACK® available from Surrey NanoSystems of Newhaven, the United Kingdom. In some embodiments, the light leakage prevention material 1070 may be a light absorbing adhesive which may be used to adhere the spacers to an overlying waveguide. In some embodiments, the spacers may include light scattering features and light leakage prevention materials at the interface between the spacers and an overlying waveguide.

With continued reference to FIG. 11B, the light leakage prevention material 1070 may form an anti-reflective coating. Examples of anti-reflective coatings include single and multi-layer anti-reflective coatings formed of partially reflective and partially transmissive layers of material.

Figure 12A:
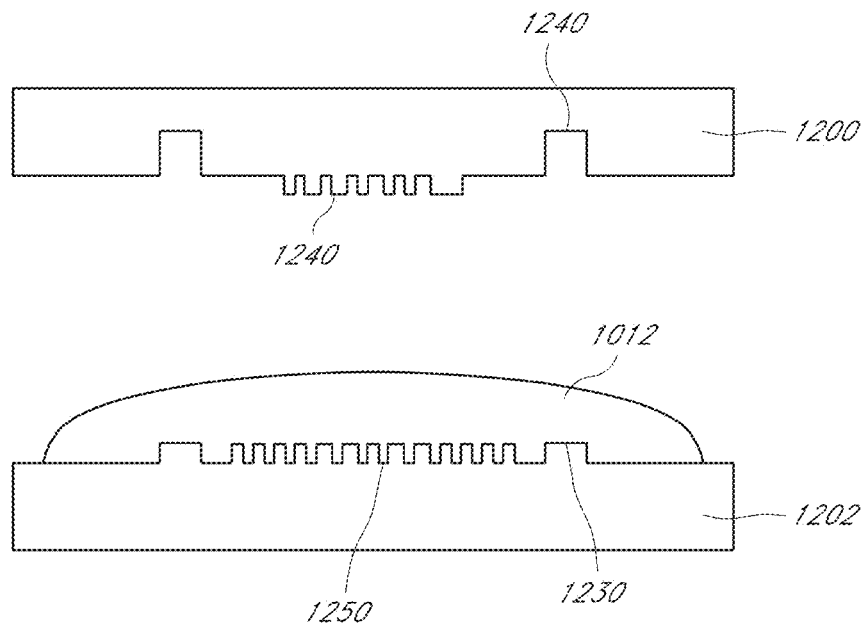
FIGS. 12A-12C illustrate an example of a method for forming a waveguide with spacers.
Figure 12B:
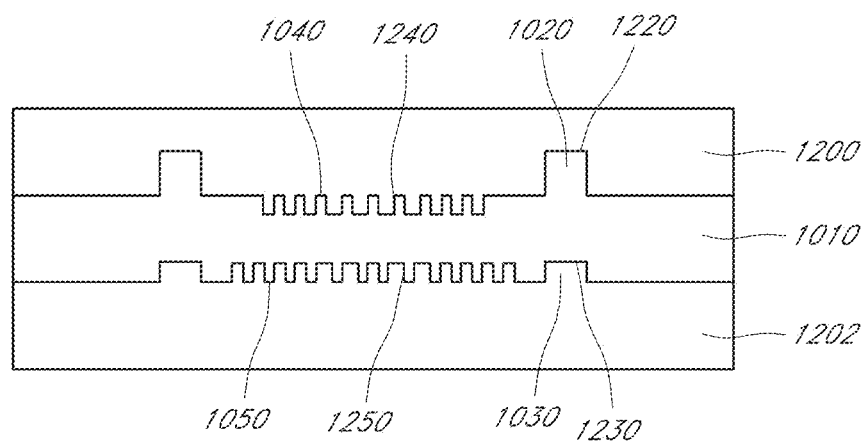
Figure 12C:
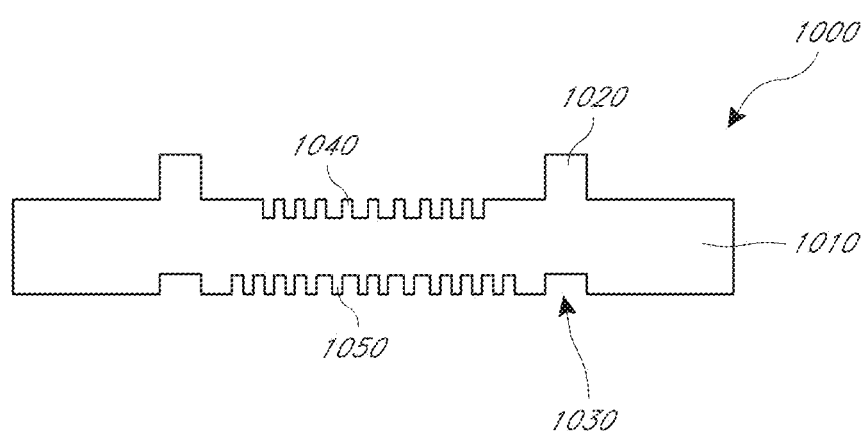

With reference now to FIGS. 12A-12C, an example of a method for forming a waveguide with spacers as illustrated. With reference to FIG. 12A, a pair of molds 1200, 1202 is provided. The mold 1202 comprises a pattern of raised features 1250, which may be the negative of a desired pattern to be defined in the waveguide to be formed. In some embodiments, the mold 1202 includes a plurality of raised features 1230 for forming indentations in the waveguide to be formed. A mass of material 1012 for forming the waveguide is deposited on the mold 1202.

With reference to FIG. 12B, the molds 1200, 1202 are brought together to compress the material 1012 (FIG. 12A). The compressed material may be subjected to a curing process (e.g., exposure to UV light) to harden that material to form the waveguide 1010. As illustrated, the negative pattern 1250 defines the patterned structure 1050, which may be diffractive optical elements. It will be appreciated that additional negative patterns may be provided on the mold 1202 to form an additional structure, including diffractive optical elements, as desired.

With reference to FIG. 12C, the molds 1200, 1202 are moved apart relative to one another. The waveguide 1010 is released from the molds, thereby forming the waveguide 1000.

With reference to FIGS. 12A-12C, it will be appreciated that, in some other embodiments, the raised features 1230 are omitted, such that the resulting waveguide 1000 does not include the indentations 1030. Instead, in some embodiments, the spacers of underlying waveguides simply rests on the bottom major surface of the overlying waveguides.

Figure 13A:
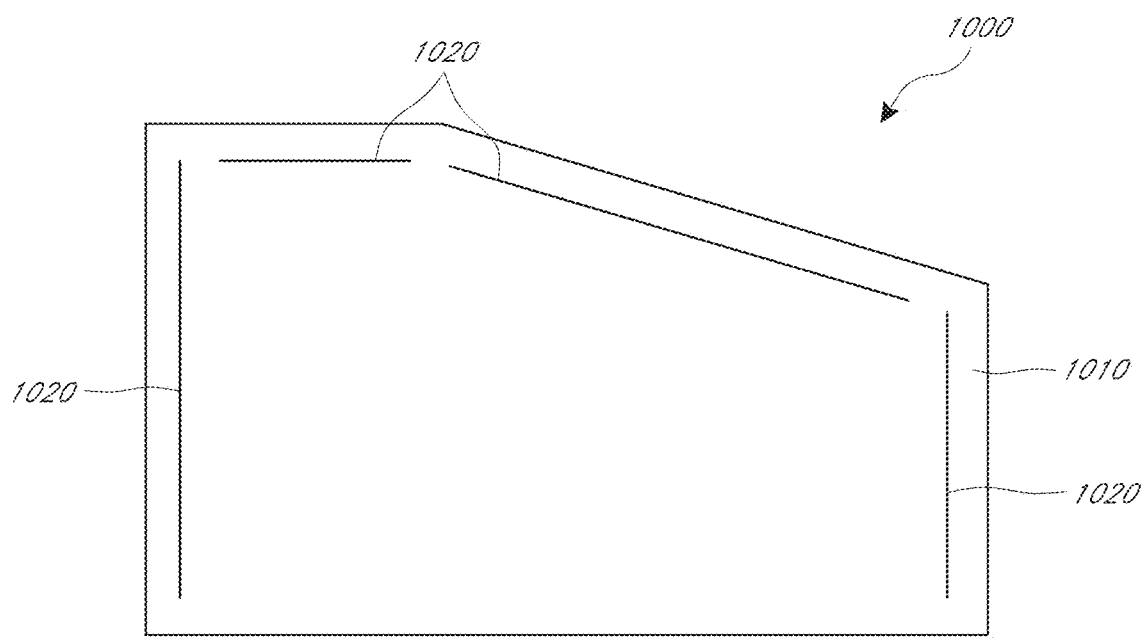
FIGS. 13A-13B illustrate examples of top-down plan views of waveguides comprising spacers.
Figure 13B:
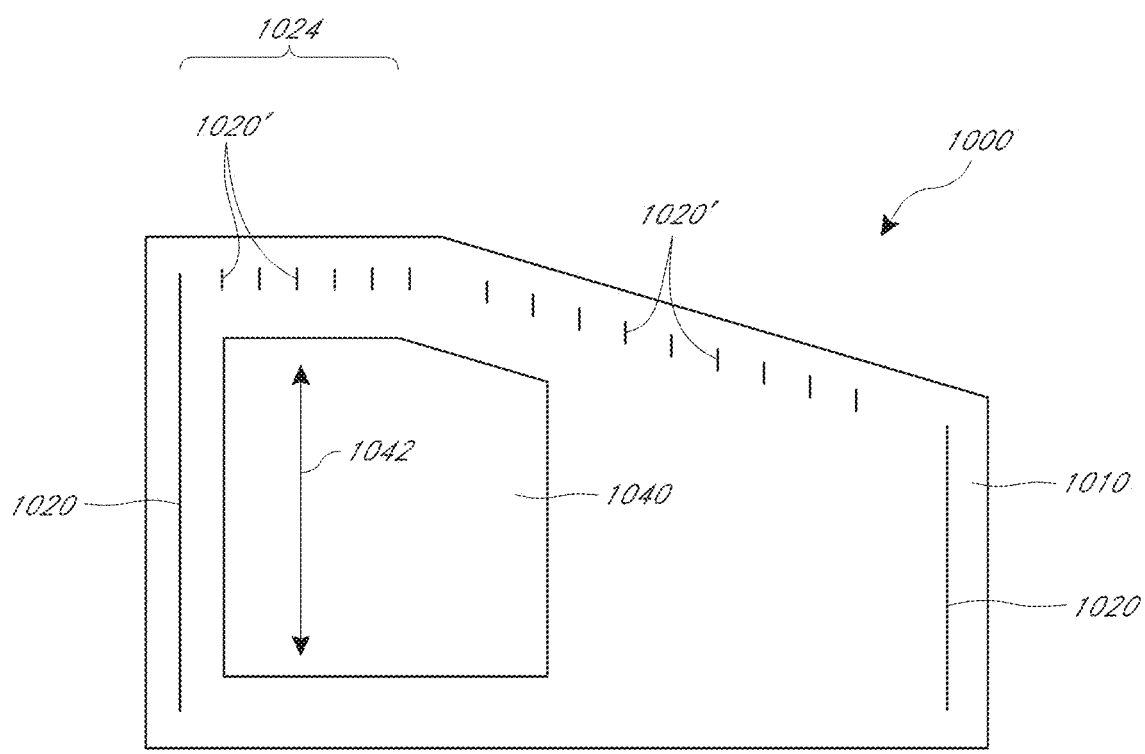

As discussed herein, the spacers 1020 are preferably formed at locations away from the path of propagation of light between incoupling and outcoupling optical elements of a waveguide. FIGS. 13A-13B illustrate examples of top-down plan views of waveguides comprising spacers. As shown in FIG. 13A, the spacers 1020 are preferably positioned along the periphery of the waveguide 1000. It will be appreciated that the spacers 1020 may thus surround an area in which diffractive optical elements, such as incoupling and outcoupling optical elements, are disposed.

In some embodiments, with reference to FIG. 13B, the spacers 1020 may be elongated along the same axis 1042 as the surface relief features 1040. In such embodiments, the spacers 1020 may include spacers having a relatively long expanse along the axis 1042, and a plurality of other spacers 1020' having relatively shorter expenses. For example, these other spacers 1020' may be spaced-apart and arrayed in groups 1024, with the groups of spacers spaced-apart along an axis that crosses the axis 1042. Advantageously, having the spacers 1020, 1020' elongated along the same axis 1042 as the surface relief features 1040 may facilitate consistent manufacturing of the spacers and the surface relief features. For example, in some embodiments, the spacers and the surface relief features may be formed by imprinting using a mold that is subsequently removed by peeling the mold and the waveguide away from one another. It will be appreciated that this peeling away may be performed along the axis 1042 and that spacers or surface relief features elongated along a different axis may face an increased likelihood of breakage or deformation upon removal of the mold.

Figure 14:
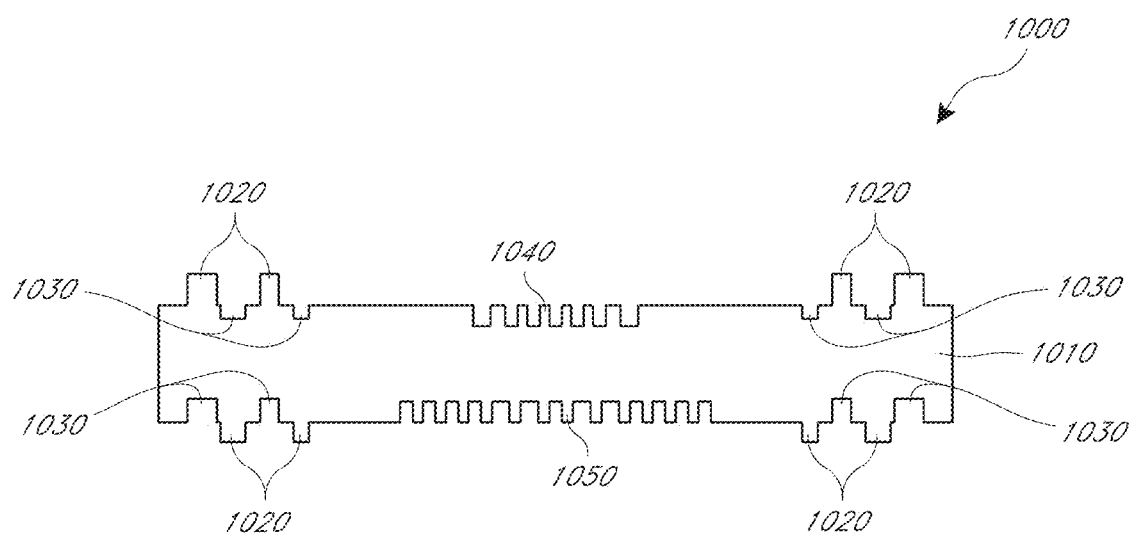
FIG. 14 illustrates an example of a waveguide comprising spacers and indentations of varying dimensions.

With reference now to FIG. 14, an example of a waveguide comprising spacers 1020 and indentations 1030 of varying dimensions is illustrated. It will be appreciated that some spacers 1020 may be wider than others. The widths of the spacers 1020 may vary depending upon their location on the waveguide 1000. For example, spacers 1020 at locations less likely to interact with light may be wider than spacers 1020 at locations in which the spacers 1020 are more likely to receive light and unintentionally leak that light into neighboring waveguides.

With continued reference to FIG. 14, in some embodiments, multiple side-by-side spacers 1020 and/or multiple side-by-side indentations 1030 may be provided in place of a single one of the spacers 1020 and indentations 1030 illustrated in FIG. 10A. For example, as illustrated, two side-by-side spacers 1020 and two corresponding side-by-side indentations 1030 may be provided in place of a single one of the spacers 1020 and 1030 of FIG. 10A. In some embodiments, the side-by-side spacers and indentations may have different widths. In some embodiments, spacers may be provided on both top and bottom major surfaces of the waveguide 1000. In such embodiments, the spacers and the indentations may interlock when forming a stack, thereby advantageously increasing the stability and mechanical strength of a stack of waveguides formed using these waveguides. In some embodiments, individual ones of the spacers 1020 may include multiple tiers which decrease in width with distance from a major surface of the waveguide.

In some embodiments, the waveguide 1000 may be a hybrid waveguide formed by multiple layers of different materials. For example, the hybrid waveguide may include a core layer and at least one auxiliary layer. Preferably, the core layer is formed of a highly transparent material and the auxiliary layer is formed of a thinner layer of material, in which surface relief structures, such as diffractive optical elements, are provided. In some embodiments, the material forming the core layer is a highly transparent polymer, e.g., having a transparency relay transmission of greater than 85%, greater than 90%, or greater than 96% in the visible light spectrum across the thickness of the core layer. The material may be a flowable material (e.g., a flowable polymer) which may be flowed onto a surface and subsequently hardened, e.g., by curing. The auxiliary layer may be thinner than the core layer and is preferably formed of a different material than the core layer. In some embodiments, the auxiliary layer is formed of a polymer (e.g., an organic polymer), an inorganic material, a hybrid organic/inorganic material, or combinations thereof. In some embodiments, for a given thickness, the auxiliary layer may have lower transparency in the visible spectrum and/or have lower homogeneity (in composition and/or optical properties such as transparency) than the core layer. However, this lower transparency and/or lower homogeneity may be ameliorated by the relative thinness of the auxiliary layer in comparison to the core layer.

Preferably, the core layer is formed of a material with a high refractive index, which may provide an advantageously large field of view for display devices utilizing the core layer in the waveguide. In some embodiments, the material forming the core layer may have a refractive index of about 1.65 or more, about 1.70 or more, or about 1.80 or more. In addition, the auxiliary layer may be formed of a material with a different refractive index than the core layer. It will be appreciated that differences in refractive indices at an interface comprising nanophotonic structures may facilitate the ability of diffractive optical elements in that layer to redirect light. In some embodiments, the material forming the auxiliary layer has a refractive index that differs from the refractive index of the material forming the core layer by about 0.05 or more, about 0.1 or more, or about 0.2 or more. In some embodiments, waveguide may include an additional auxiliary layer in which indentations and/or additional surface relief features (e.g., diffractive optical elements) are formed. Additional details regarding hybrid waveguides are disclosed in U.S. Application No. 62/651,507 filed on Apr. 2, 2018, entitled HYBRID POLYMER WAVEGUIDE AND METHODS FOR MAKING THE SAME, the entirety of which is incorporated by reference herein.

In some embodiments, the core and auxiliary layers may be formed using flowable materials, without vapor deposition. The core layer may be formed of relatively high refractive index materials as described above for the waveguide 1000, and the auxiliary layer may be formed of a lower refractive index material. Examples of lower refractive index materials (e.g., having a refractive index lower than 1.65) include organic polymer materials, low refractive index resins, sol-gel based hybrid polymers (e.g., $TiO_2$, $ZrO_2$, and ITO sol-gel materials), polymers doped with nanoparticles (such as $TiO_2$, $ZrO_2$), and active materials (e.g., polymers doped with quantum dots). Examples of low refractive index organic polymer materials include those commercially available from Sigma-Aldrich of St. Louis, Missouri, USA, such as the polymer material sold under the names CPS 1040 UV, CPS1040 UV-A, CPS1030, CPS 1020UV, CPS 1040UV-VIS, CPS 1030 UV-VIS, and CPS 1020 UV-VIS. Examples of low refractive index resins include those commercially available from Miwon of the Nagase Group, Osaka, Japan.

In some embodiments, patterns (e.g., patterns defining diffractive optical elements) may be formed during the formation of the core and/or auxiliary layer without separate patterning and etch processes. For example, the patterns may be formed by imprinting and subsequently hardening or curing of the imprinted material.

Figure 15A:
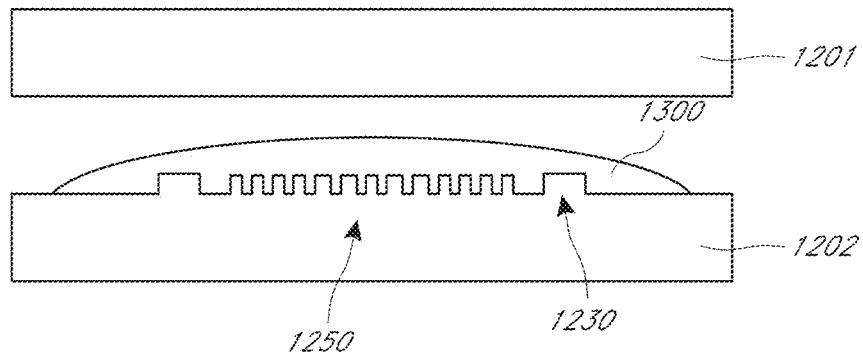
FIGS. 15A-15G illustrate an example of a method for forming a hybrid waveguide with spacers.
Figure 15B:
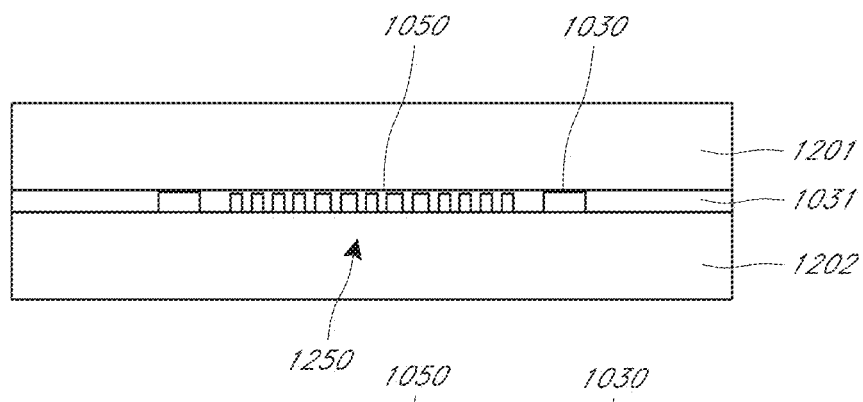
Figure 15C:
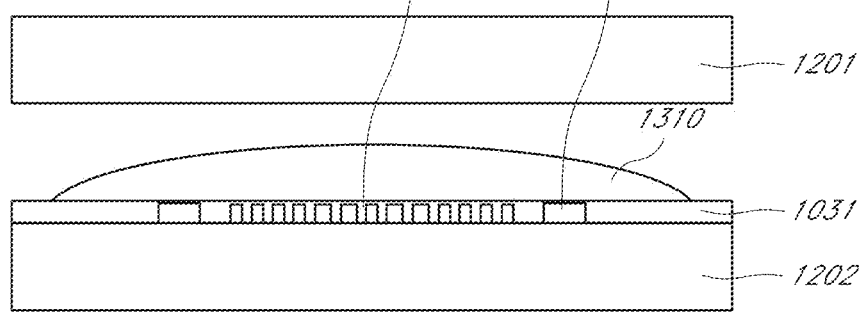
Figure 15D:
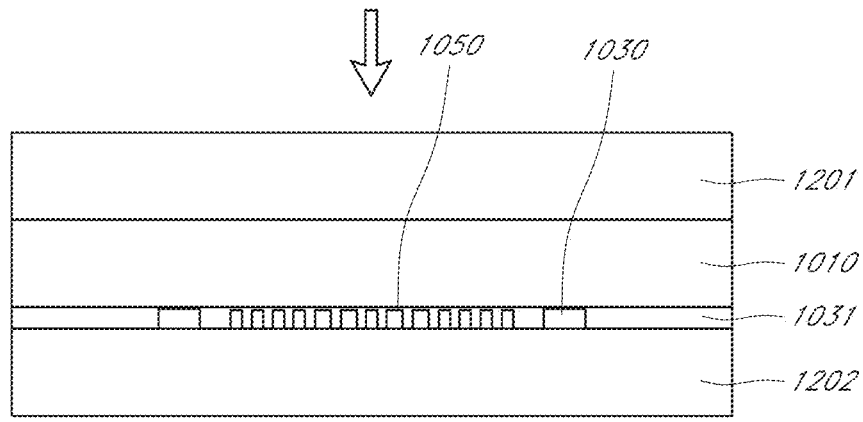
Figure 15E:
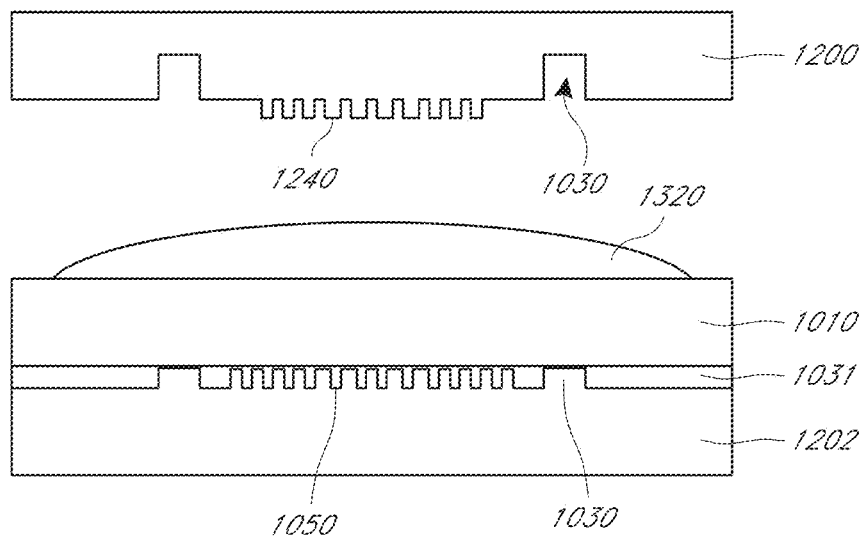
Figure 15F:
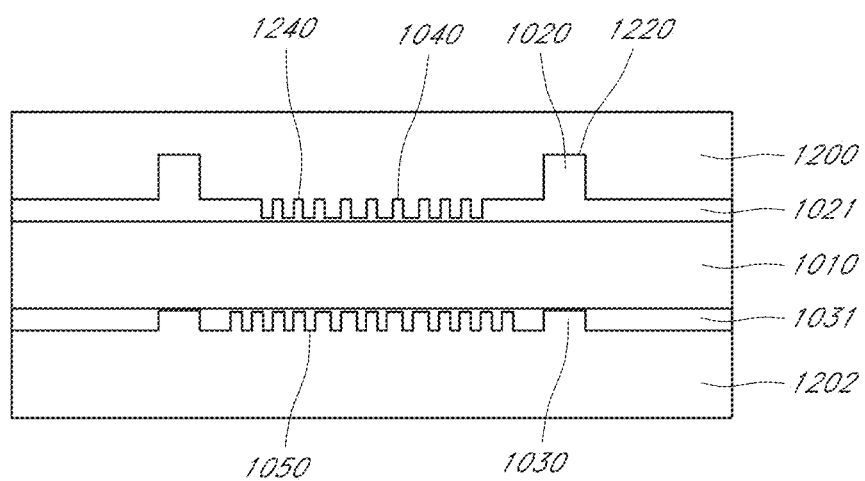
Figure 15G:
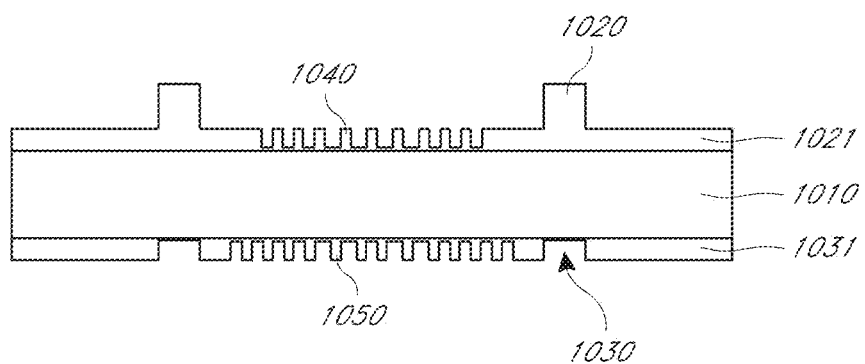

FIGS. 15A-15G illustrate a method of forming a hybrid waveguide with a core layer and overlying and underlying auxiliary layers. With reference to FIG. 15A, a pair of molds 1201, 1202 is provided, with the mold 1202 comprising a pattern of raised features 1250 for forming surface relief features in the auxiliary layer to be formed. A mass of material 1300 for forming the auxiliary layer is subsequently deposited on the mold 1202. With reference to FIG. 15B, the molds 1201, 1202 are moved closer together to compress the mass of material 1300 (FIG. 16A). The compressed material 1300 may be subjected to a curing process (e.g., by exposure to UV light), which hardens those materials to form a solid auxiliary layer 1031. With reference to FIG. 15C, the molds 1201 is separated from the auxiliary layer 1031 and a mass of core layer material 1310 is deposited on the auxiliary layer 1031. With reference to FIG. 15D, the molds 1201, 1202 are moved closer together to compress the mass of material 1310, thereby forming the core layer 1010. The compressed material may be subjected to a curing process (e.g., exposure to UV light), which hardens that material to form a solid core layer 1010. With reference to FIG. 15E, the mold 1201 is separated from the core layer 1010 and replaced with the mold 1200. The mold 1200 includes a pattern of protrusions 1240 for defining surface relief features in an additional auxiliary layer. An additional mass of material 1320 for forming the additional auxiliary layer is deposited on the core layer 1010. With reference to FIG. 15F, the molds 1200, 1202 are moved closer together to compress the mass of material 1320 (FIG. 16E) to define the auxiliary layer 1021. It will be appreciated that the pattern of features 1240 imprints the desired surface relief features 1040 in the auxiliary layer 1021. The compressed material forming the auxiliary layer 1021 may be subjected to a curing process to harden that material to form the solid auxiliary layer 1020. With reference to FIG. 15G, the molds 1200, 1202 are moved apart and a hybrid waveguide comprising the core layer 1010 and the auxiliary layers 1031, 1021 is released from the molds.

In some other embodiments, the core and auxiliary layers may be formed of different flowable materials which are immiscible. These materials may be deposited one on top of the other and then subsequently compressed and hardened. Further details regarding such a process are found in U.S. Application No. 62/651,507 filed on Apr. 2, 2018, entitled HYBRID POLYMER WAVEGUIDE AND METHODS FOR MAKING THE SAME.

With reference again to FIGS. 12A-12C and 15A-15G, it will be appreciated that the molds 1200, 1201, 1202 may be patterned with negatives of the spacers and the surface relief features to be formed. In addition, the molds preferably have sufficient rigidity to imprint features into the various flowable materials used to form the waveguides. Examples of materials for forming the molds include glass, fused silica, quartz, silicon, and metals.

Negatives the spacers may be defined in these materials using various processes, depending upon whether the spacers have vertical or inclined sidewalls. For spacers with vertical sidewalls, the spacers, as seen in a top-down view, may first be patterned using lithography, e.g. by patterning a photoresist deposited on the material to be patterned, and then etched through the patterned photoresist using a directional etch. Examples of directional etches include dry etches such as RIE, ICP, sputter etching. In some other embodiments, a wet etch (e.g., comprising HF) may be utilized.

For spacers with inclined sidewalls, the negatives of the spacers may be formed using gray-scale lithography to pattern a three-dimensional shape in a resist layer as a mask, and the geometries of that shape are transferred into the underlying substrate (the mold material) by one or more dry etch techniques such as RIE, ICP, and sputter etching, or by wet etching. For silicon substrates, the inclined sidewall surfaces may also be fabricated using wet chemical etching. In some embodiments, the top-down view shapes/geometries may first be patterned in a resist layer using lithography, and then the substrate (the mold) is etched first using a dry etch, and then a wet etch. In the case of a silicon mold, the silicon wet etch may include KOH and TMAH.

Example Waveguide Structures for Reducing Propagation of Unutilized Light Out of the Waveguide As discussed herein, not all of the light propagating through a waveguide may be out-coupled as the light makes a single pass across the waveguide. The light which remains after propagating across the waveguide to an edge of the waveguide may be referred to as unutilized light. As also discussed herein, optical artifacts may result if this unutilized light were to propagate out of the waveguide. Various embodiments disclosed herein provide edge treatments which mitigate the recirculation of light within the waveguide after it contacts an edge or the area near an image, thereby reducing the likelihood that unutilized light will propagate out of the waveguide.

Figure 16:
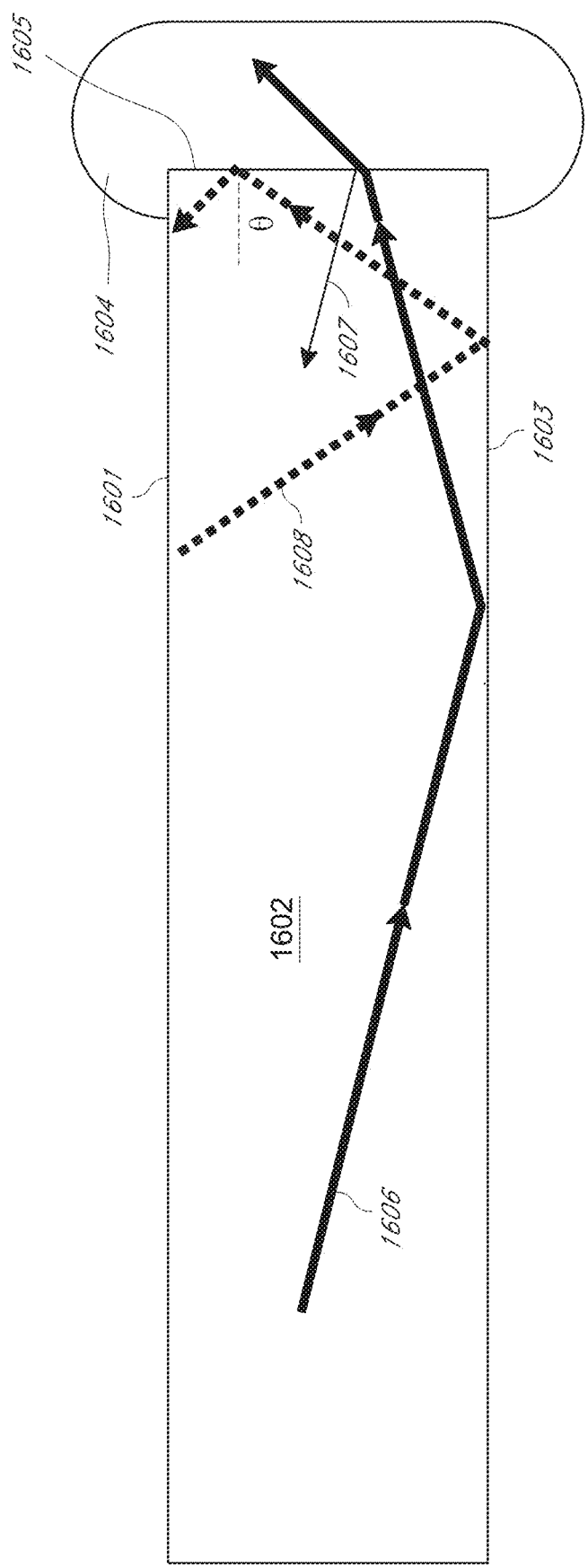
FIG. 16 illustrates an example of a waveguide having edges covered with absorbing material.

In some embodiments, the edge treatment may comprise light absorbing materials covering one or more images of a waveguide. Referring now to FIG. 16, an example of a waveguide 1602 having edges covered with light absorbing materials illustrated. The waveguide 1602 has a top major surface 1601 and bottom major surface 1603 and an edge 1605. The edge 1605 is covered with light absorbing material 1604. The light absorbing material 1604 may, in some embodiments, be a layer of light absorbing material applied on the edge of waveguide 1602 and may absorb unutilized light beams, as such light beams 1606 and 1608, that are travelling towards the edges. The unutilized light beams may include light beams that are not outcoupled from the waveguide 1602 to a viewer. The unutilized light beams may reflect off of the edge 1605 of the waveguide 1602, propagate back through the waveguide 1602, and then be out-coupled from waveguide 1602 (e.g., via outcoupling elements such as out-coupling optical elements 800, 810, 820 of FIG. 9B) as ghost images and/or stray light which decrease image quality.

With continued reference to FIG. 16, without the light absorbing material 1604, light beams, such as light beam 1608, that strike the edge of waveguide 1602 with relatively large incident angles may reflect back from the edge and reduce the contrast (e.g. by impinging on the top major surface 1601 of the waveguide at an angle such that the light escapes total internal reflection to propagate out of the waveguide 1602). Similarly, light beams having relatively small incident angles, such as light beam 1606, that exit out of the waveguide 1602 may still have some portion, such as reflection 1607, reflecting back into the waveguide due, as examples, to a difference in refractive index ($\Delta n = n_{waveguide} - n_{ink}$) between the waveguide 1602 forming an interface with the edge of the waveguide.

Without being limited by theory, it has been found that the refractive index (n) and the extinction coefficient (k) of an edge-applied light absorbing material, such as material 1604 applied to waveguide 1602, influence how well the by the absorbing material extracts and absorbs light from a waveguide. Simulations were performed for light absorption versus reflection for light beams striking an edge-applied light absorbing material, as a function of the extinction coefficient (k) of the light absorbing material and as a function of the angle of incidence (e.g., measured relative to a vector that is normal to the plane of the waveguide edge, shown in FIG. 16 as ⊖, where light beam 1606 has a larger incident angle than light beam 1608). The simulations were performed for absorption of s-polarized light (e.g., transverse-electric TE polarized light) and absorption of p-polarized light (e.g., transverse-magnetic TM polarized light), and averages were obtained to determine an absorption average for s-polarized light and p-polarized light. The simulations assumed a waveguide having an index of refraction of 1.73. Some of the simulations assumed light absorbing material having an index of refraction of 1.55, while some of the simulations assumed light absorbing material having an index of refraction of 1.65. The simulation results indicated that light beams with higher incident angles (e.g., light beams that strike the light absorbing material 1604 relatively directly instead of in a glancing manner) are not fully absorbed and may be reflected. In particular, as incident angles increase beyond about 65 degrees, absorption drops off and the light starts to reflect off of the edge 1605 (e.g., due to the difference in index of refraction between waveguide 1602 and the light absorbing material 1604). The simulation results also indicate that increasing the extinction coefficient, k, of the light absorbing material 1604 boosts the absorption of higher-incident-angle light beams, but the boost is relatively limited (e.g., absorption at k=0.05 is only about 50% higher than absorption at k=0.005, all other factors being constant).

Again, without being limited by theory, the simulation results indicate that the light absorbing material having an index of refraction of 1.65 significantly outperformed the light absorbing material having an index of refraction of 1.55. This is believed to be due to the lower difference in index of refraction between the waveguide and the light absorbing material. Thus, the simulation results illustrate that, to improve light absorption by the light absorbing material 1604, it is helpful to reduce the difference in indices of refraction of the waveguide 1602 and the light absorbing material 1604 and also helpful, but to a lesser extent, to utilize a light absorbing material 1604 with a high extinction coefficient (k). In some embodiments, the difference in indices of refraction of the waveguide 1602 and the light absorbing material 1604 is 0.2 or less. In addition, in some embodiments, the light absorbing material 1604 has an extinction coefficient (k) of at least 0.02.

It will be appreciated that the above discussion relates to a single interaction of light beams and with the edge 1605 and the light absorbing material 1604. To further improve absorption of light beams into the light absorbing material, the coverage area of the light absorbing material may be increased as illustrated in FIGS. 17 and 18, in which the light absorbing material extends over a larger portion of the waveguide.

Figure 17:
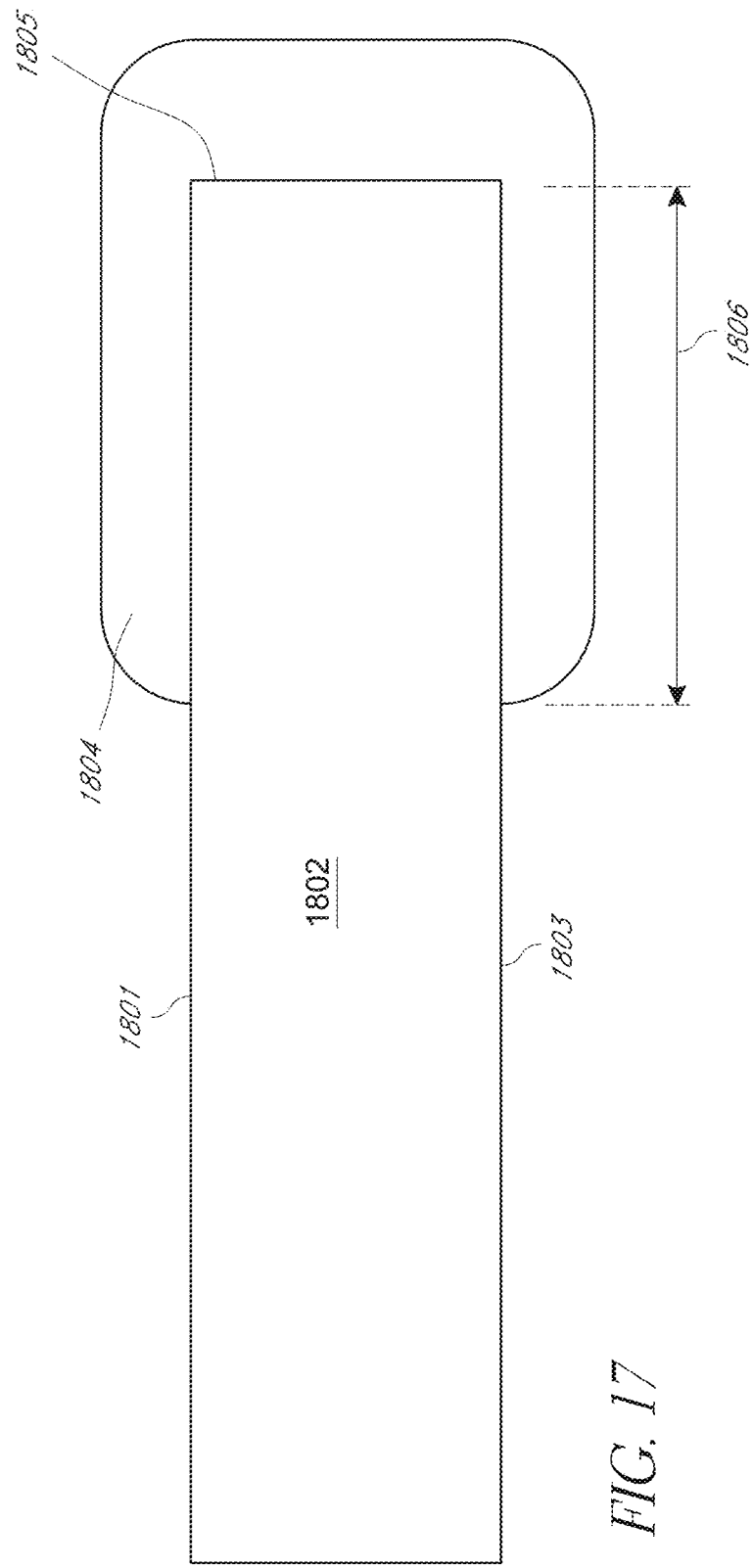
FIGS. 17-18 illustrate an example of a waveguide having light absorbing material extending on portions of top and bottom major surfaces of the waveguide.
Figure 18:
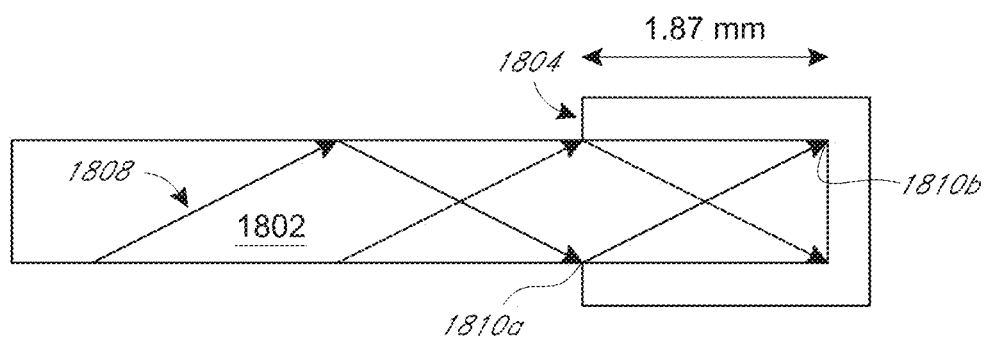

FIGS. 17-18 illustrate an example of a waveguide having light absorbing material extending on portions of top and bottom major surfaces 1801, 1803 of the waveguide 1802. As illustrated, light absorbing material 1804 that covers at least one edge 1805 of the waveguide 1802 and also extends over edge-adjacent portions of the top and bottom major surfaces 1801, 1803 of the waveguide. In particular, the light absorbing material 1804 may be formed on portions of the waveguide 1802 that extend for a particular distance, illustrated as length of blackening 1806, away from the edge 1805 of the waveguide 1802.

As shown in FIG. 18, extending the light absorbing material 1804 over the length 1806 may create multiple interactions between propagating light beams and the light absorbing material 1804, thus increasing absorption of the unutilized light beams. In particular, FIG. 18 illustrates how a particular light beam 1808 propagating within waveguide 1802 via total internal reflection (TIR) may interact with light absorbing material 1804 at point 1810a and also at point 1810b.

In general, the length 1806 needed to ensure that propagating light interacts with the light absorbing material 1804 multiple times may vary depending on the difference in index of refraction between the waveguide 1802 and adjacent materials (which may be air), the thickness of the waveguide 1802, the wavelengths of light passing through the waveguide 1802, a grating design (e.g., a design of outcoupling elements such as out-coupling optical elements 800, 810, 820 of FIG. 9B), the field of view of waveguide 1802, among other possible factors. FIG. 18 illustrates a particular example of blue light propagating via TIR inside glass having an index of refraction of 1.8 with air as an adjacent material, where a length of blackening of at least approximately 1.87 mm of black ink (with n=1.73) is sufficient to ensure multiple interactions. In some embodiments, the length 1806 may extend approximately 2 mm, approximately 5 mm, or between approximately 2-5 mm from the waveguide edge in order to effectively absorb a large portion of the propagating light that reaches the edge of the waveguide.

It has been determined that the thickness of an edge-applied light absorbing material, such as material 1604 applied to waveguide 1602 and material 1804 applied to waveguide 1802, influences well the material extracts and absorbs light from a waveguide. Studies of absorption of light by a light absorbing material such as black ink were performed for materials of three different indices of refraction (n=1.55, n=1.65, and n=1.73). Various simulations showed potential thicknesses of material that may be utilized to achieve a desired level of absorption (e.g., a certain minimum percentage of absorption, which may be at least 95% absorption) as a function of the incident angle and as the extinction coefficient was varied from approximately $7\times10^{-3}$ to approximately $10\times10^{-3}$. In general, larger thicknesses of material achieved a desired level of absorption when the incident angle is low (e.g., when light strikes the material relatively perpendicularly) as compared to when the incident angle is high (e.g., when light strikes the material in a glancing manner). Additionally, larger thicknesses of material achieved the desired level of absorption when the extinction coefficient is lower, however, the absorption rates were less dependent on the extinction coefficient than on the incident angle. The simulations further indicated that a material thickness of approximately 20 μm may be utilized to achieve advantageously high levels of absorption for a range of simulated incident angles (e.g., approximately 20 degrees from perpendicular to approximately 70 degrees from perpendicular) and a desired range of simulated extinction coefficients (e.g., extinction coefficients from approximately $7\times10^{-3}$ to approximately $10\times10^{-3}$). In some embodiments, the light absorbing material has a thickness of 20 μm or more.

Any suitable material may be used as edge-applied light absorbing or blackening material (e.g., material 1604 applied to waveguide 1602 and material 1804 applied to waveguide 1802). As examples, edge-applied light absorbing or blackening materials may include thin film materials such as fullerene, graphene, amorphous silicon, germanium, etc., which may be deposited on a waveguide surface by physical or chemical vapor deposition or via other suitable processing deposition processes; black inks including low viscosity black ink such as black inkjet available from Nazdar of Shawnee, KS, which may be applied by inkjet printing or other suitable methods; and light absorbing additives dispersed or dissolved in a polymer (e.g., an UV curable polymer resin), such as carbon black, carbon nanopowder, carbon nanotubes, metallic nanoparticles, color dyes, pigments, phosphors, etc.

Figure 19:
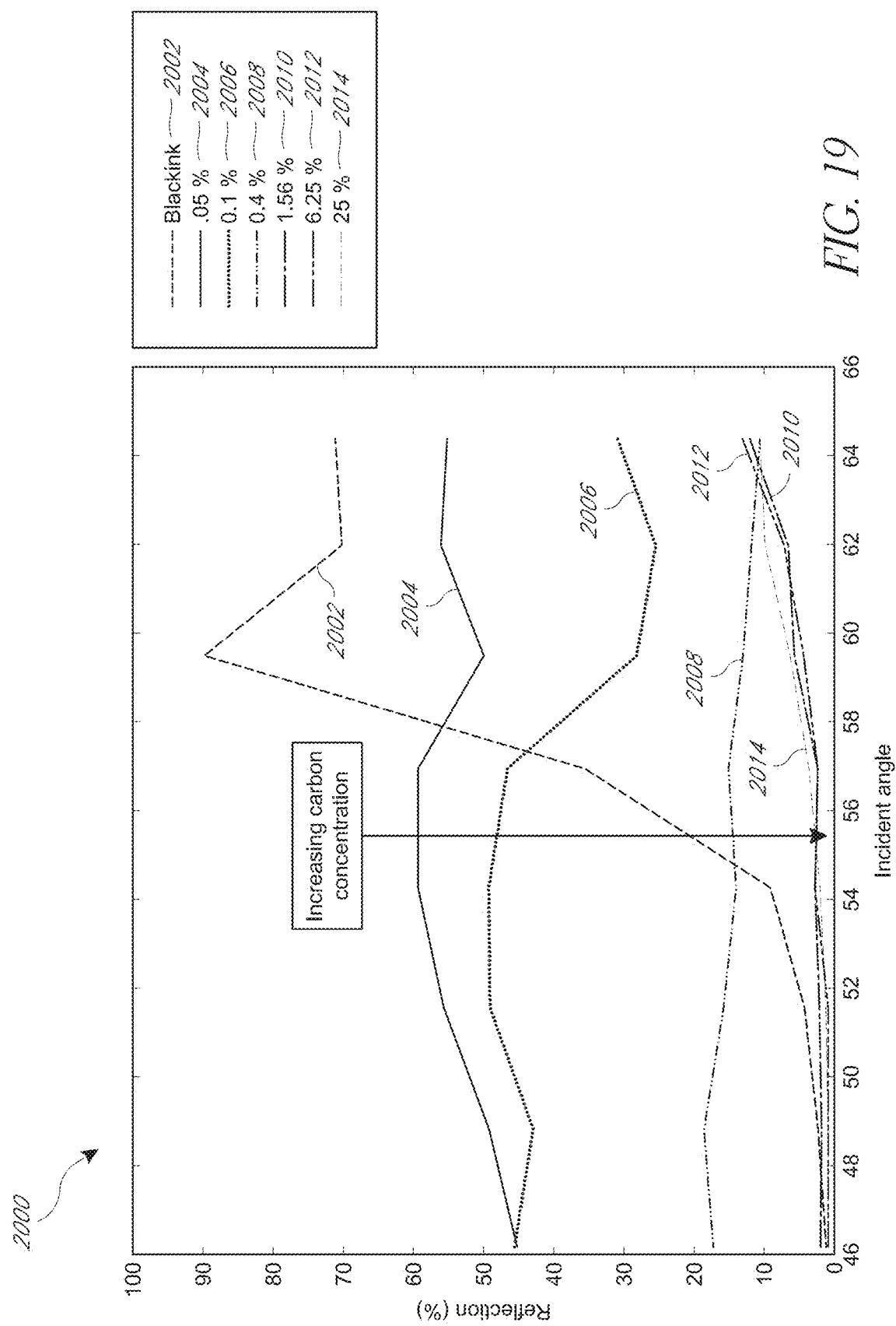
FIGS. 19-20 illustrate simulation results of light absorption as a function of incident angle for different absorbing materials.
Figure 20:
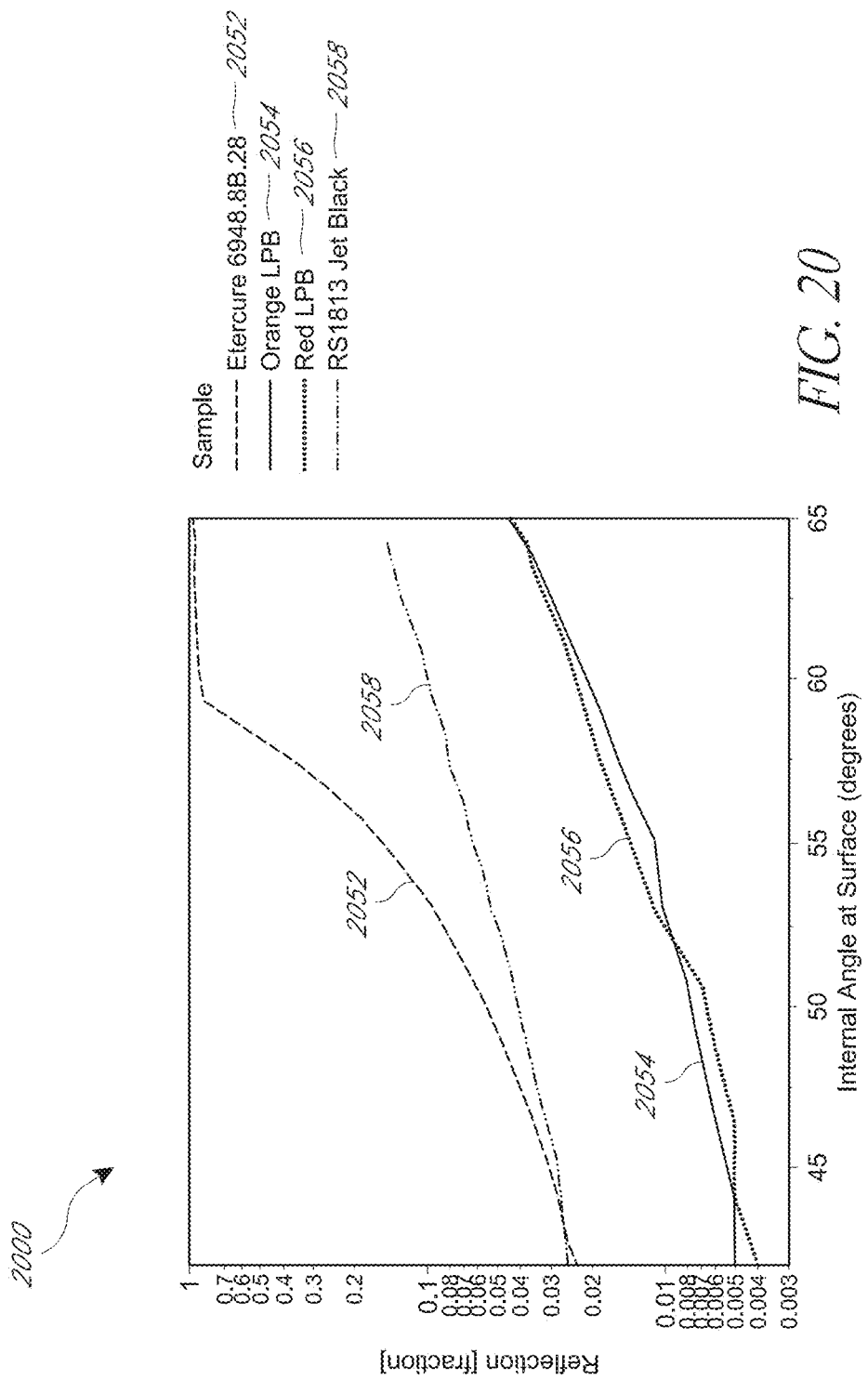

Simulation results of the reflection rates of various different light absorbing materials are shown in graph 2000 of FIG. 19 and graph 2050 of FIG. 20. The simulations of FIGS. 19 and 20, involve a single interaction of a light beam with the light absorbing materials.

The different light absorbing materials simulated for FIG. 19 include a plot 2002 for black ink and plots 2004, 2006, 2008, 2010, 2012, 2014 for varying concentrations of carbon nanopowder dispersed or dissolved in a resin. As shown by plot 2002 in FIG. 19, black ink has a low reflectance (e.g., a reflectance below 10% and thus an absorption rate of at least 90%) for incident angles below about 55 degrees. However, the reflectance of the black ink substantially increases above 55 degrees. As shown by plots 2004, 2006, 2008, 2010, 2012, and 2014, increasing the concentration of carbon in the light absorbing materials tends to decrease the reflectance, and thus increase the absorption rate, of the light absorbing materials. However, once a certain concentration of carbon is reached, the performance of the light absorbing materials levels off and further increases in carbon concentration to not further decrease reflectance. In particular, FIG. 19 illustrates that concentrations of approximately 1.56% carbon (plot 2010), 6.25% carbon (plot 2012), and 25% carbon (plot 2014) have relatively similar reflection and absorption performance across the simulated incident angles.

The different light absorbing materials simulated for FIG. 20 include a plot 2052 for etercure 6948.8B.28 (e.g., a blue dye), plot 2054 for orange LPB (e.g., an orange dye), plot 2056 for red LPB (e.g., a red dye), and plot 2058 for RS1813 jet black (e.g., a black dye). As shown in FIG. 20, the orange and red dyes are able to maintain reflection rates below 10% over the entire range of simulated incident angles, as seen in plots 2056 and 2058. In contrast, the blue dye has a reflection rate below 10% only for the simulated incident angles that are below approximately 53 degrees, as seen in plot 2054, and the black dye has a reflection rate below 10% only for the simulated incident angles that are below approximately 63 degrees, as seen in plot 2052.

Figure 21:
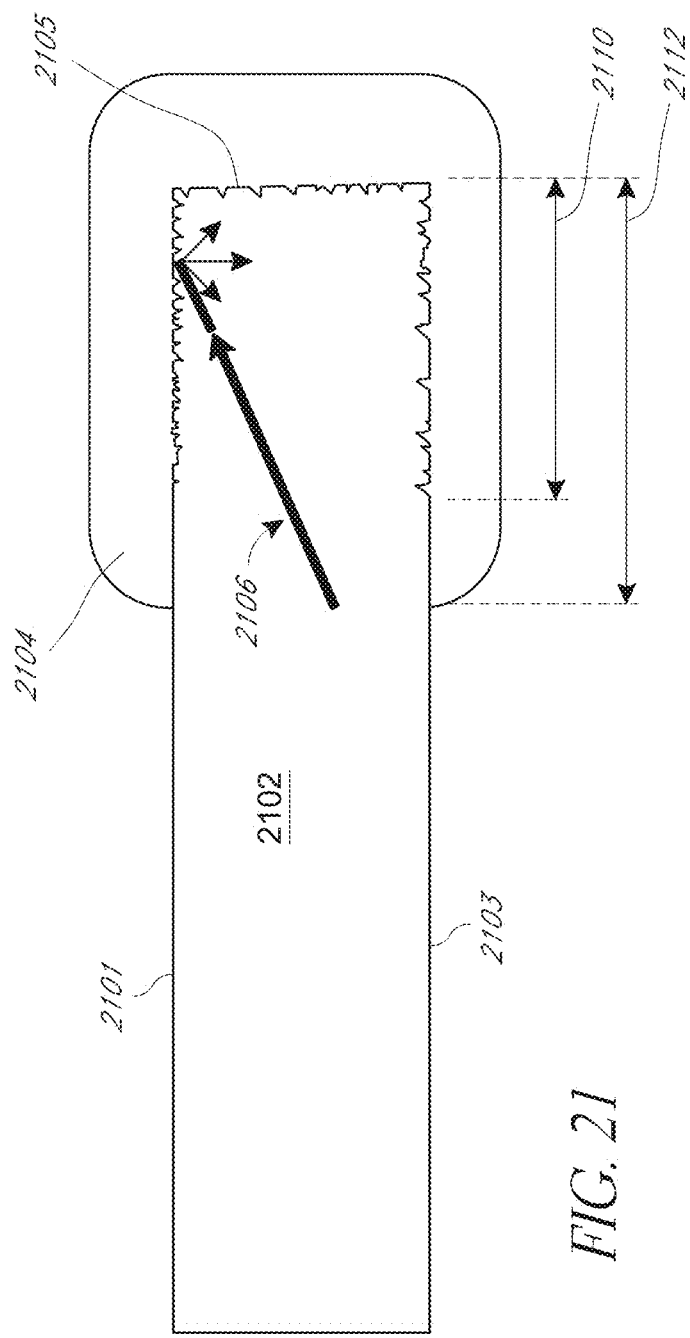
FIG. 21 illustrates an example of a waveguide having roughened edges, which may be covered with absorbing materials.

Another technique for absorption and/or preventing reflection of light beams at the edge of a waveguide is roughening of a waveguide edge, as shown in FIG. 21. A waveguide 2100 may be roughened to provide an edge 2105 with a rough texture. In some embodiments, edge 2105 is covered with light absorbing material 2104. The waveguide 2102 may be roughed along its edge and also over top and bottom major surfaces 2101, 2103 extending away from the edge over a length of roughening 2110, which may be less than a length of blackening 2112 over which the light absorbing material 2104 is applied. In some embodiments, the length of roughening 2110 may be between 2 mm and 5 mm from the edge of waveguide 2100 and the length of blackening 2112 may extend from the waveguide edge to between 2 mm and 5 mm beyond the roughened area. Roughening the waveguide 2100 in this manner may help to diffuse propagating light, as shown by the scattering of light beam 2106 when it hits the roughened area of the waveguide 2100 with applied light absorbing material 2104. Without being limited by theory, the diffusion of light beams such as light beam 2106 may increase interaction between the light beam and the light absorbing material 2104, leading to increased rates of absorption overall.

The edges and adjacent surfaces of waveguide 2100 (extending in from the waveguide edge over length of roughing 2110) may be roughened by sanding the waveguides, by forming the waveguides with molds having a rough texture, or by other methods. Different grit sizes may be used to in sanding waveguides to different roughness. As examples, grit having P150-100 μm particles or grit having P2500-8.4 μm particles may be used in sanding waveguides to a desired roughness. Waveguides may be formed, sanded, or otherwise processed to have a surface roughness (Sa) of at least 1, in certain embodiments. In some embodiments, the surface roughness (Sa) is in a range of 1 to 100. In some embodiments, the waveguide may be roughened radially, such that less light is scattered back towards an active eyepiece area (e.g., away from the edge).

Figure 22A:
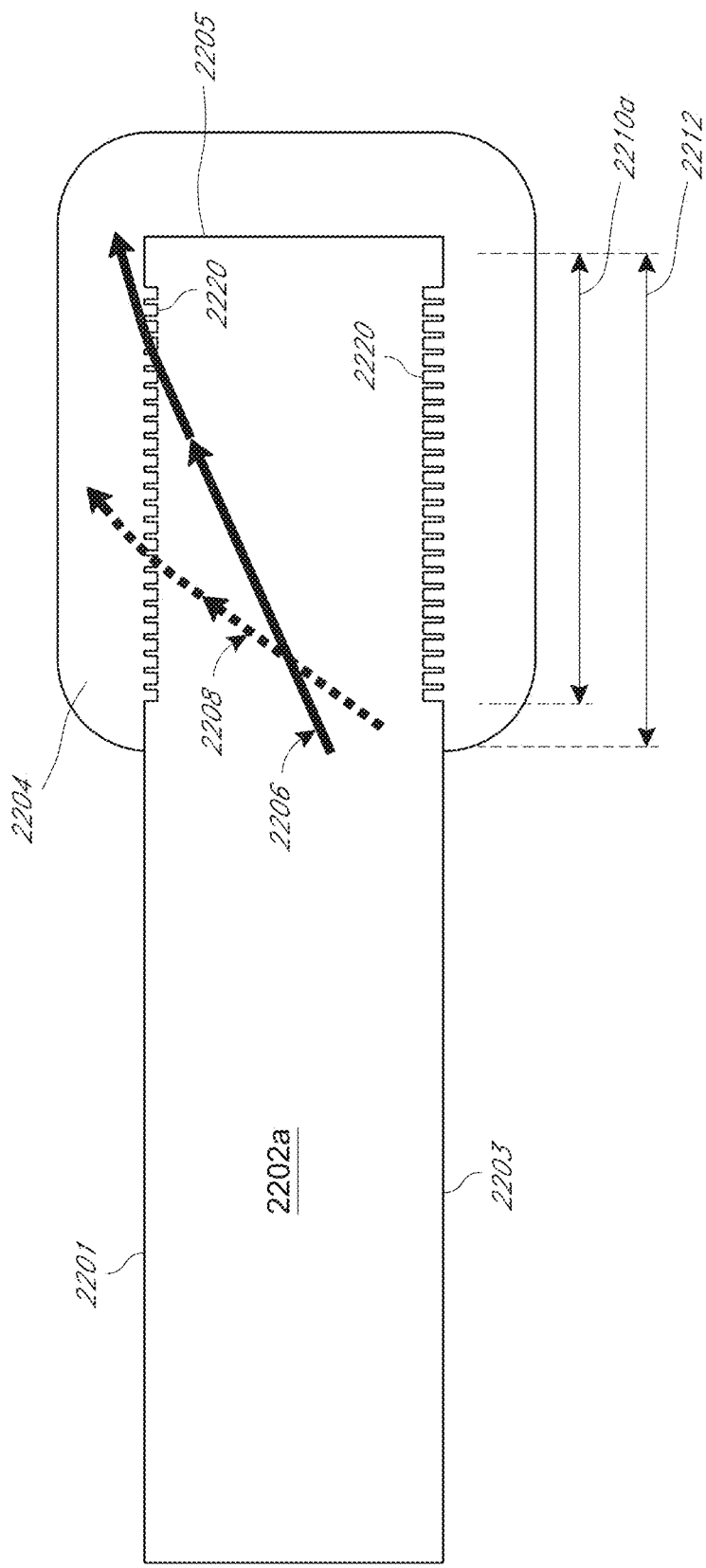
FIG. 22A illustrates an example of a waveguide having edges with out-coupling gratings and absorbing materials.
Figure 22B:
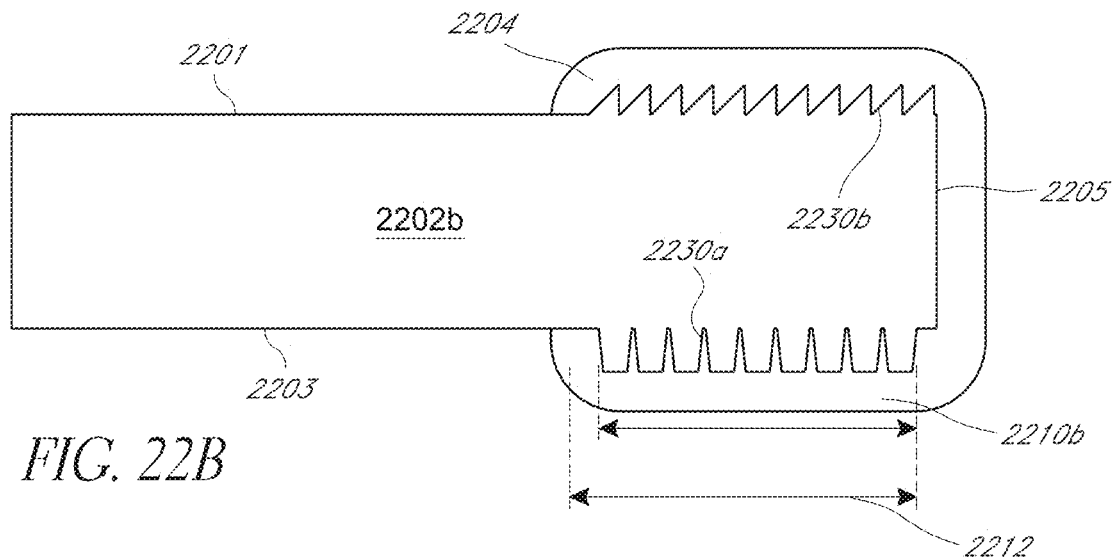
FIGS. 22B-22C illustrates an example of a waveguide having edges with light trapping structures and light absorbing materials.
Figure 22C:
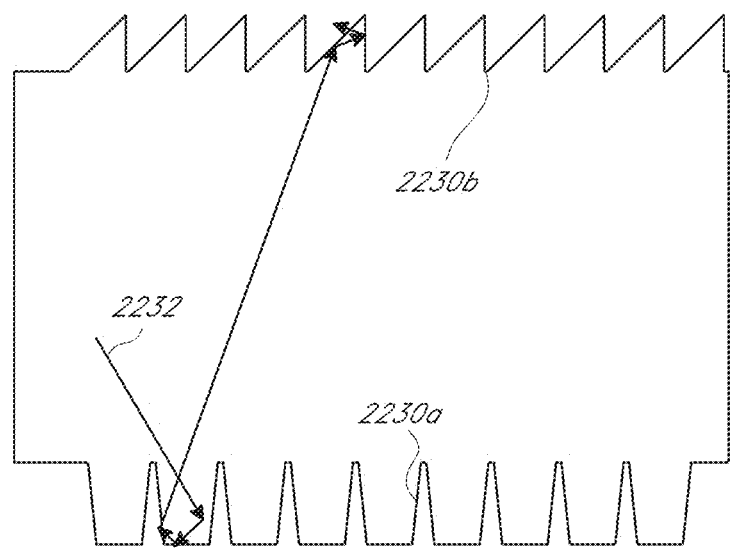

Additional techniques for improving the absorption of light beams at the edge of a waveguide include forming diffractive gratings, as shown in FIG. 22A, or light-trapping structures, as shown in FIGS. 22B and 22C, along the edges of a waveguide.

FIG. 22A illustrates a waveguide 2200a with an edge 2205 covered with light absorbing material 2204, the light absorbing material 2204 extending over an area of blackening 2212 on the top and bottom major surfaces 2201, 2203, where the waveguide 2202a includes out-coupling optical elements 2220 over an area of gratings 2210a extending on the top and bottom major surfaces 2201, 2203 of the waveguide 2202a. In some embodiments, the out-coupling optical elements 2220 are diffractive gratings. In some embodiments, waveguide 2202a may have out-coupling optical elements on its edge in addition or instead of having such gratings on the top and bottom major surfaces 2201, 2203 adjacent to the edge. In some embodiments, the light absorbing material 2204 may be omitted.

The out-coupling optical elements 2220 may, as an example, be out-coupling diffractive gratings that are configured to out-couple light propagating in waveguide 2202a such as light beams 2206 and 2208 into the light absorbing material 2204, where the light is absorbed. As an example, the area of gratings 2210a may extend out between 2 mm and 5 mm from the edge of waveguide 2202a (e.g., which may ensure that any light beams propagating in the waveguide interact with the gratings) and the area of blackening 2212 may further extend out between 2 mm and 5 mm from the area of gratings 2210a (e.g., which may facilitate the absorption of light, scattered by the gratings, by the light absorbing material 2204). The design of the gratings 2220 may vary depending on the indices of refraction of the waveguide 2202a and light absorbing materials 2204, the wavelength(s) of light propagating through the waveguide 2202a, and among other possible factors. In some embodiments, diffractive gratings 2220 may be formed in waveguide 2202a by patterning a mold in which the waveguide 2202a is formed. Diffractive gratings 2200 may, in some embodiments, be formed as part of and/or using the same fabrication techniques used in forming other diffractive elements disclosed herein, such as the out-coupling optical elements 800, 810, and 820 of FIG. 9B, and integral spacers, as disclosed herein.

FIG. 22B illustrates a waveguide 2202a with an edge 2205 covered with light absorbing material 2204 which also extends over an area of blackening 2212 on the top and bottom major surfaces 2201, 2203, where the top and bottom major surfaces 2201, 2203 of the waveguide 2202a include light trapping structures 2230a and/or 2230b over a light trapping area 2210b extending from the edge 2205. In some embodiments, waveguide 2202b may have light trapping structures on its edge in addition or instead of having such structures on the top and bottom major surfaces 2201, 2203 adjacent to the edge. In some embodiments, the light absorbing material 2204 may be omitted. The light trapping structures 2230a and 2230b may, as an example, be microstructures. As shown in FIG. 22C, a simulated light beam 2232 that enters the edge region of waveguide 2202b does not escape the edge region without multiple interactions, due to the shape and size of the light trapping structures 2230a and 2230b. As illustrated, during one of these interactions, light may escape the waveguide and propagate into the light absorbing material 2204 (FIG. 22B) light absorbing material 2204. Without being limited by theory, the light trapping structures 2230a and 2230b may advantageously increase the absorption of light.

In some embodiments, the area of light trapping 2210b may be between 2 mm and 5 mm from the edge of waveguide 2202b (e.g., which may increase the likelihood that light beams propagating in the waveguide interact with the light trapping structures) and the area of blackening 2212 may extend between 2 mm and 5 mm from the area of light trapping 2210b (e.g., which may increase the likelihood that that any light scattered by the light trapping structures is absorbed by the light absorbing material 2204). In some embodiments, light trapping structures such as structures 2230a and 2230b may be formed in waveguide 2202b by patterning a mold in which the waveguide 2202b is formed. Light trapping structures 2230a and 2230b may, in some embodiments, be formed as part of and/or using the same fabrication techniques used in forming diffractive elements disclosed herein, such as the out-coupling optical elements 800, 810, and 820 of FIG. 9B and integral spacers, as disclosed herein.

The design of the light trapping structures 2230a and 2230b may vary depending on the indices of refraction of the waveguide 2202b and light absorbing materials 2204, the wavelength(s) of light propagating through the waveguide 2202b, and among other factors. In some embodiments, the width and heights of the light trapping structures 2230a and 2230b ranges from 0.5 μm to 100 μm. As examples, the width and heights of the light trapping structures 2230a and 2230b may approximately 0.5 μm, approximately 1.0 μm, approximately 2.0 μm, approximately 4.0 μm, approximately 10.0 μm, approximately 20.0 μm, approximately 50 μm, approximately 75 μm, or approximately 100 μm, wherein approximately is understood to be within 0.4 μm.

It will be appreciated that any of the strategies for improving light absorption at the edge of a waveguide may be combined together. As an example, a waveguide may include light absorbing material on an edge and also extending inwardly from the waveguide edge (as disclosed in FIGS. 17 and 18), having a sufficient thickness for desired levels of light absorption, being made from materials as disclosed at least in FIGS. 19 and 20, and having any of a roughening of the waveguide surface (as disclosed in FIG. 21), diffractive gratings (as disclosed in FIG. 22A), and/or light trapping structures (as disclosed in FIGS. 22B and 22C).

Figure 23:
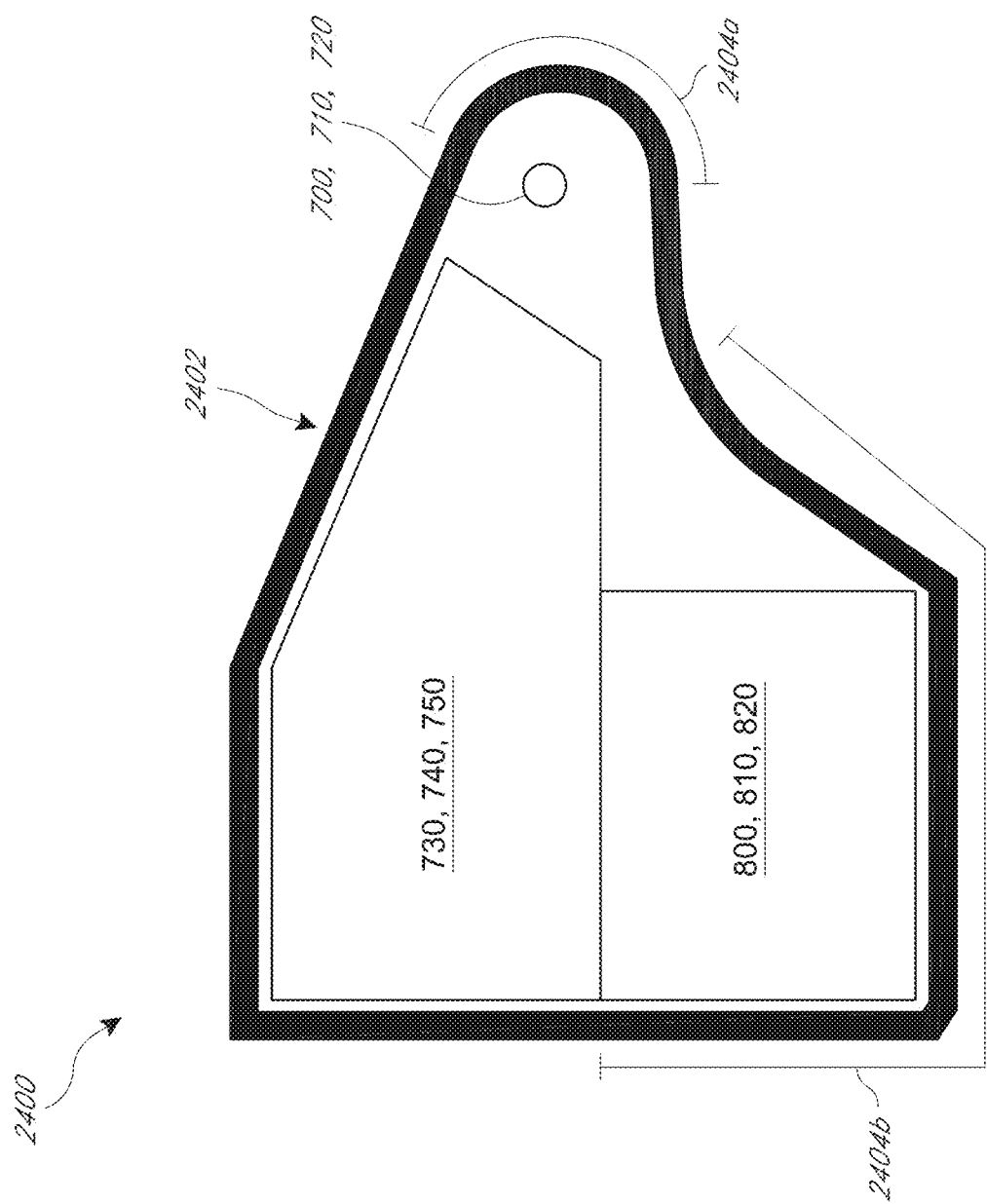
FIG. 23 illustrates edges of examples of the placement of light absorbing materials along edges of a waveguide.

FIG. 23 illustrates edges 2404a, 2404b of a waveguide 2400 that have higher levels of unutilized light. The strategies disclosed herein for improving light absorption at the edge of a waveguide may be applied to all of the edges of a waveguide or, in some embodiments, may be applied only to the areas of the waveguide expected to have higher levels of unutilized light relative to other areas of the waveguide. For example, the edges 2404a, 2404b of FIG. 23 may be considered to have high levels of unutilized light. The areas with the high levels of unutilized light may be the areas of the waveguide in which relatively high amounts of light reach the waveguide edge without being out-coupled. Such unutilized light, if not absorbed at the edge, could potentially reflect back into an active display region and create undesirable ghost images or stray light, thus lowering image quality. In some embodiments, the area of waveguide 2400 with the high levels of unutilized light include edges 2404a adjacent to the in-coupling optical elements 700, 710, 720. The edges 2404a are on a side of the in-coupling optical elements 700, 710, 720 opposite to the direction in which light is directed by the in-coupling optical elements 700, 710, 720 for eventual out-coupling. Another area with high levels of unutilized light includes the edges 2404b adjacent to the out-coupling optical elements 800, 810, 820. Light in this area includes light that has propagated across the out-coupling optical elements 800, 810, 820 without being out-coupled. It will be appreciated that light incident on these edges is unutilized since the light was not out-coupled after passing through these optical elements intended for out-coupling. In contrast, edges adjacent to the light distributing elements 730, 740, 750 may have relatively low levels of unutilized light and thus may not benefit as much from the light absorption strategies described herein.

As noted herein, it will be appreciated that the various waveguides 1602, 1802, 2102, 2202a, and 2202b of FIGS. 16-18 and 21-23 may include one or more integral spacers and/or indentations for accommodating a spacer. In addition, in some embodiments, the waveguides 1602, 1802, 2102, 2202a, and 2202b may be part of a stack of waveguides, each of which may include an integral spacer and indentation for accommodating an underlying spacer from an underlying waveguide, which also includes an integral spacer.

Figure 24:
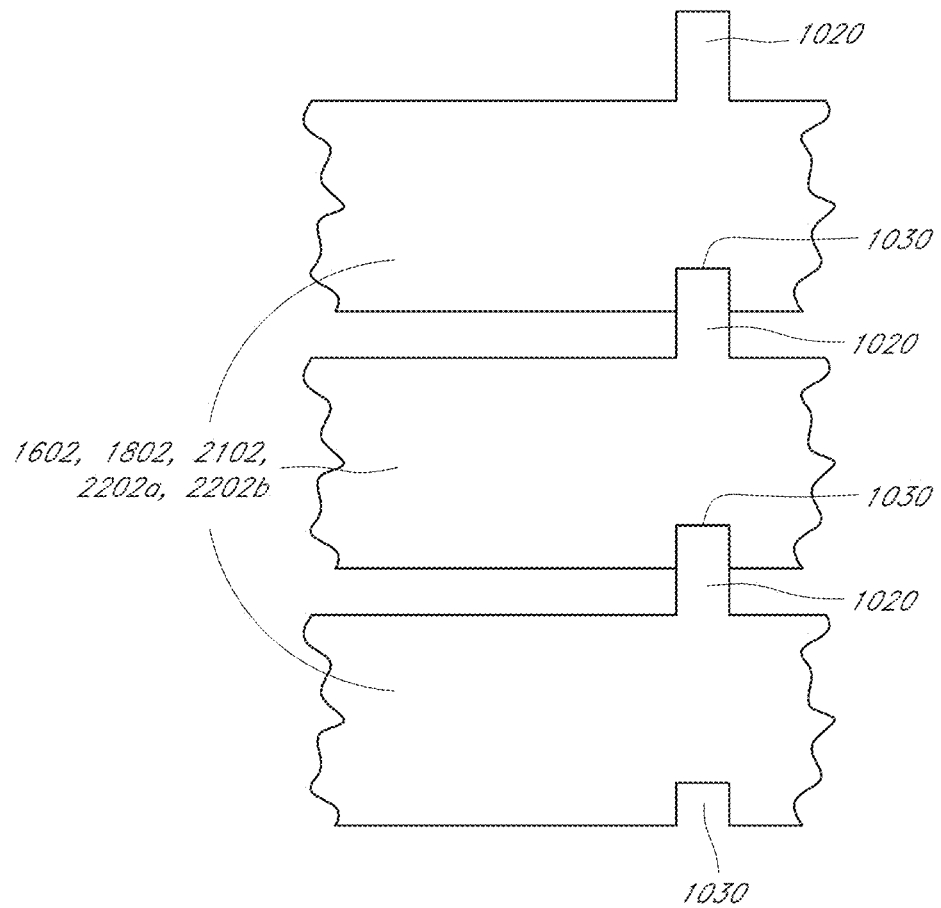
FIG. 24 illustrates a stack of waveguides with integral spacers.

FIG. 24 illustrates a stack of waveguides with integral spacers. The illustrated individual waveguides may be any of the waveguides 1602, 1802, 2102, 2202a, 2202b which are also illustrated in FIGS. 16-18 and 21-23. It will be appreciated that only the portions of the waveguides 1602, 1802, 2102, 2202a, 2202b having an integral spacer 1020 and/or indentation 1030 are shown in this figure for clarity. The remainder of the waveguides 1602, 1802, 2102, 2202a, and 2202b are shown in the corresponding one of FIGS. 16-18 and 21-23, and may include various edge treatments (e.g., light absorbing material, rough textures, out-coupling optical elements, light-trapping microstructures) as disclosed herein. In some embodiments, the waveguides 1602, 1802, 2102, 2202a, 2202b each have one or more integral spacers 1020 configured to provide separation between that waveguide and an immediately neighboring, overlying waveguide. Thus, as illustrated, the waveguides 1602, 1802, 2102, 2202a, 2202b with integral spacers may form a waveguide stack (e.g., corresponding to the waveguide stack 660 of FIGS. 9A-9C). In some embodiments, each of the waveguides 1602, 1802, 2102, 2202a, 2202b of the waveguide stack may be similar (e.g., have similar edge treatments). In some other embodiments, the waveguides forming the waveguide stack may have different edge treatments (e.g., different ones of the waveguides 1602, 1802, 2102, 2202a, 2202b from FIGS. 16-18 and 21-23 may be utilized in different positions within the waveguide stack).

It will be appreciated that the integral spacers 1020 and/or indentations 1030 of the waveguides 1602, 1802, 2102, 2202a, and 2202b may be formed and have shapes and orientations as described above regarding FIGS. 10A-15G. For example, in some embodiments, the waveguides 1602, 1802, 2102, 2202a, 2202b and integral spacers 1020 may be formed of a polymer material that may be molded (e.g., using an imprint mold) to define the integral spacers 1020. In addition, as discussed herein, the mold may include relief features for defining one or more of in-coupling optical elements, out-coupling optical elements, rough surface textures on and adjacent an edge 2105 (FIG. 21), out-coupling optical elements 2220 (FIG. 22A), and light trapping structures 2230a and/or 2230b (FIGS. 22B and 22C).

Example Methods for Forming Molds

Figure 25:
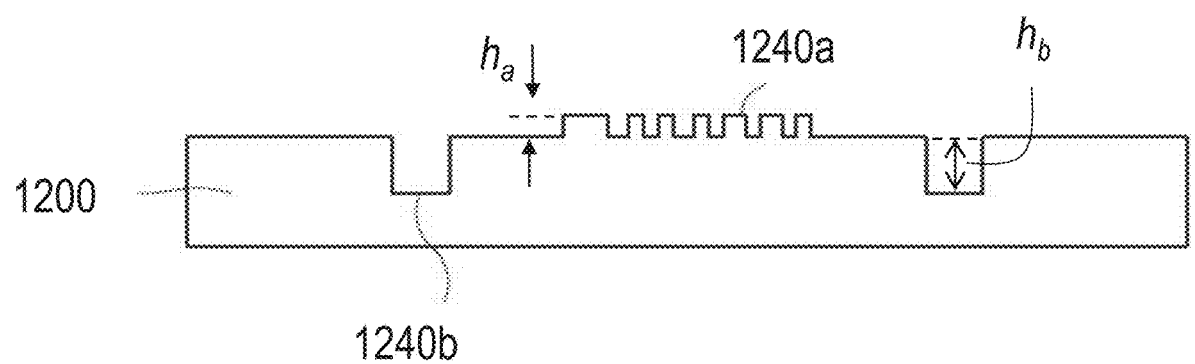
FIG. 25 illustrates an example of a mold for forming waveguides having integral spacers.

An example of a mold 1200 is shown in FIG. 25. The mold 1200 includes a pattern of features made up of small features 1240a and large features 1240b, which may be openings on the surface of the mold 1200. Small features 1240a may have a height (or depth) $h_a$ between approximately 10 nm and 250 nm while large features may have a height (or depth) $h_b$ between approximately 5 µm and 1000 µm. In some embodiments, the small features 1240a correspond to diffractive optical elements and large features 1240b correspond to integrated spacers. As illustrated, the small features 1240a may be formed in an interior of the mold 1200 while the large features 1240b may be formed in the periphery of the mold 1200. As evident from the discussion above, it will be appreciated that small features 1240a and large features 1240b are "small" and "large" in the sense that the features 1240a are smaller than the features 1240b. This difference in dimensions may apply both to the critical dimensions of the features and to the heights of the features. In some embodiments, the ratios of the heights of the large features 1240b to the small features 1240a may be about 20:1 or greater, 500:1 or greater, 4000:1 or greater. Additionally, the ratio of the heights of the large features 1240b to the small features 1240a may be about 100000:1 or less.

Creating a mold with large features like 1240b may present fabrication challenges. Long etch times are required to make large features, but extended exposure to etchants may damage or degrade portions of the substrate that are not meant to be etched. Methods described herein enable fabrication of a mold with large (e.g., micron or millimeter scale) features while maintaining low total thickness variation and surface roughness in unpatterned areas of the mold. It will be appreciated that, as used herein, the substrates for forming molds may be referred to as wafers due to the physical resemblance of some substrates to semiconductor wafers. It will be appreciated, however, that, in addition semiconductor materials, the substrates may be formed of materials other than semiconductors. For example, the substrates may be formed of transparent materials in some embodiments.

Wet Etch Processes

Figure 26:
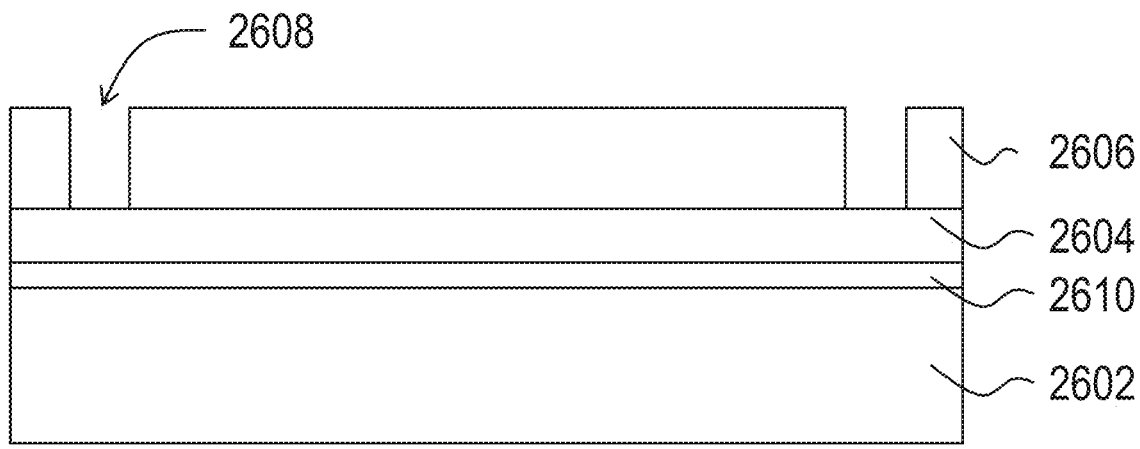
FIGS. 26-28 illustrate examples of various intermediate structures formed during a process for the fabrication of a mold similar to the mold of FIG. 25.
Figure 32:
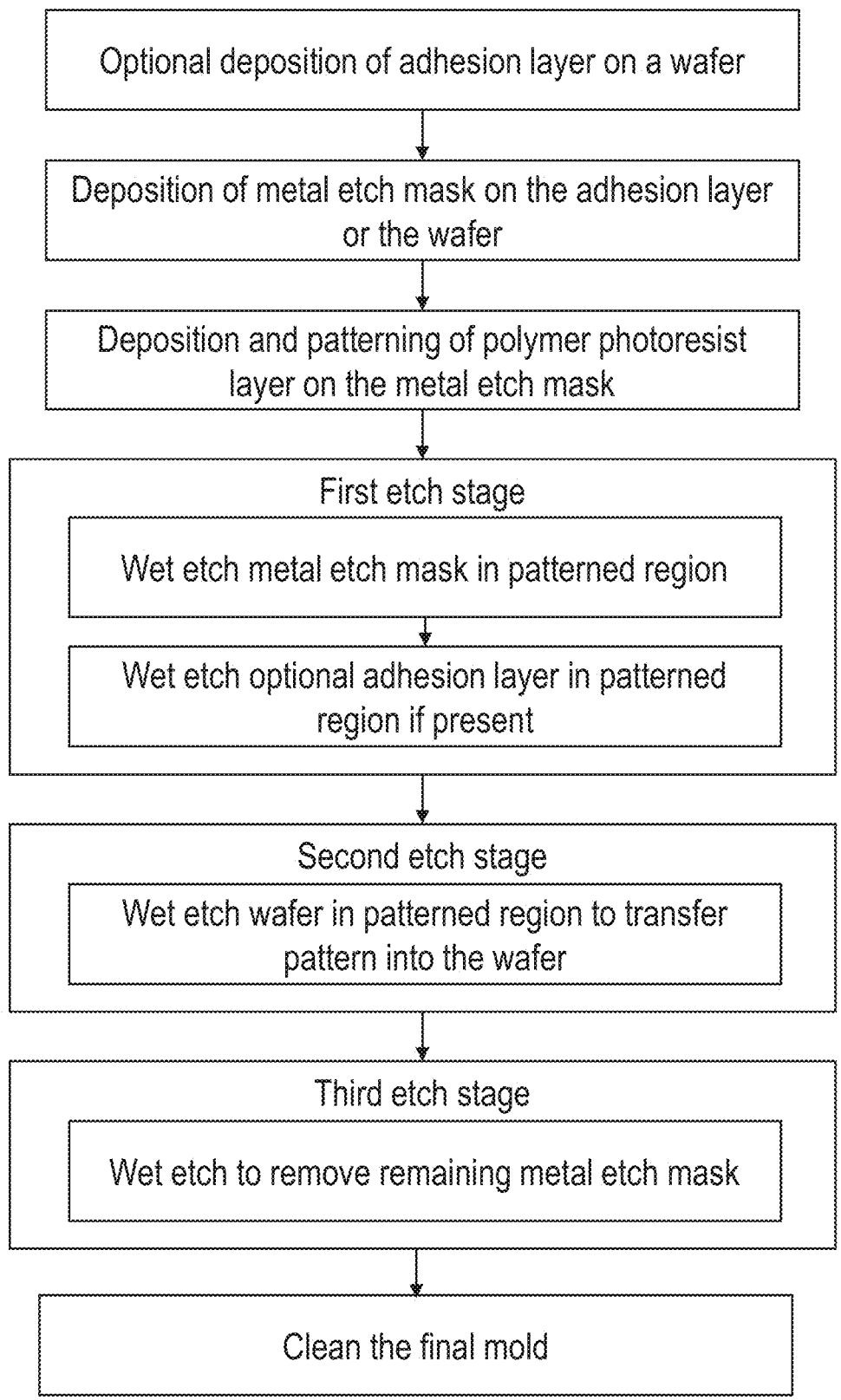
FIG. 32 is a block diagram showing illustrating an example of a process flow for wet etching a substrate to form a mold for integral spacers.

Referring to FIGS. 26 and 32, fabrication of a mold may include providing a substrate 2602, which will be formed into the mold as discussed herein. Preferably, the substrate 2602 has a flat, smooth surface and may have a thickness between approximately 0.3 mm and 20 mm. The substrate may comprise silicon and may be a glass, quartz, fused silica, or other transparent material substrate. Preferably, the substrate has a total thickness variation (TTV) less than about 1 μm and a surface roughness ($R_q$) less than about 0.5 nm.

An etch mask 2604 is applied to the substrate 2602 by a deposition process such as physical vapor deposition, sputtering, electron beam deposition, or thermal deposition. In some embodiments, the deposition process is a chemical vapor deposition. Preferably, the etch mask 2604 is formed of a metal. Without being limited by theory, the metal etch mask 2604 is understood to adhere to the substrate 2602 better than the polymer material of photoresist layer 2606 when exposed to an etchant for the durations required to etch large millimeter scale features, such as spacers. For example, if the photoresist layer 2606 is applied directly to the substrate 2602, the photoresist layer may peel off of the substrate 2602 during the substrate etching process. In some embodiments, an adhesion layer 2610 may be applied before depositing the metal etch mask to promote adhesion between the metal etch mask 1604 and the substrate 2602. For example, the adhesion layer 2610 may be a layer of titanium or chrome material. In some embodiments, the adhesion layer 2610 may be between approximately 10 nm to 100 nm in thickness.

In some embodiments, the etch mask 2604 may be formed by one or more layers of metal material that is removed by the substrate etchant chemistry at a lower rate than the material of the underlying substrate. In embodiments where hydrofluoric acid (HF) is used as the substrate etchant, silver or copper masks may be used for low concentrations of HF, for example less than 30%. At higher concentrations of HF, for example between greater than 50%, gold or platinum masks may be used. In some embodiments, the etch mask may include a gold layer approximately 10 nm to 200 nm in thickness. It will be appreciated that gold or platinum etch masks may also be used for etch chemistries having lower concentrations of HF than 50%.

In some embodiments, a photoresist layer 2606 may be applied to the etch mask 2604, e.g., by spin coating, and may subsequently be patterned using a lithography process such as electron beam, ultraviolet (UV), or nanoimprint lithography. The photoresist layer 2606 includes a pattern of large features 2608 that will be transferred into the substrate 2602 to form the openings for forming spacers in the mold that will be formed by the substrate 2602.

Figure 27:
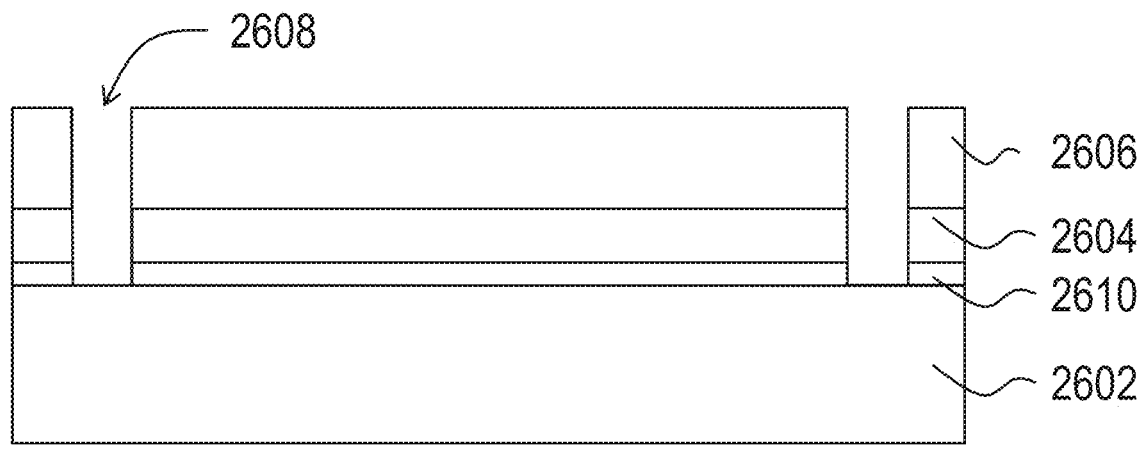

A first etch stage is performed to expose the substrate surface in the region of features 2608 as shown in FIG. 27. In some embodiments, multiple layers of etch mask material may be disposed over the substrate surface to form the etch mask 2604. The layers of etch mask material may be removed by a single etch, if the various materials are etchable using that single etch or by a sequence of etches selective for the material of the exposed one of the layers. It will be appreciated that the etches may be wet and/or dry etches having the appropriate chemistry to selectively remove etch mask material relative to other exposed materials. Where a sequence of etches are performed, a first etching step may be performed to remove the metal mask material in the patterned region. In embodiments where the metal mask 2604 is gold, an etchant chemistry selective for etching gold relative to other exposed materials is used in this step. If an adhesion layer 2610 is present, a second etching step may be performed to remove the adhesion layer in the patterned region. In embodiments where the adhesion layer 2610 is a chrome layer, an etchant chemistry selective for etching chrome relative to other exposed materials is used in this step. The resulting structure is shown in in FIG. 27.

Figure 28:
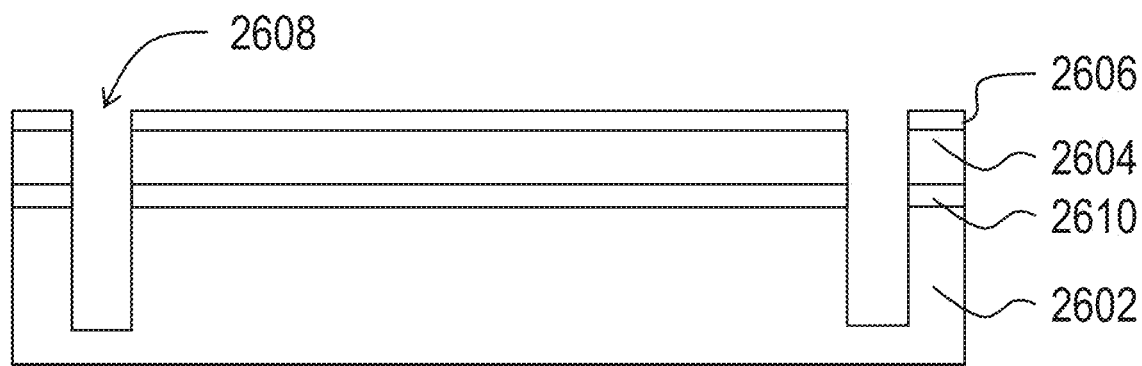

A second etch stage is performed to etch the features 2608 into the substrate 2602, as shown in FIG. 28. In some embodiments, the substrate etch chemistry includes HF, which may have a concentration in a range of about 1% to about 50%. The HF may be mixed with a buffering agent such as ammonium fluoride ($NH_4F$) to slow the etch rate and provide better control of the etching process. Examples of etchants and total wet etch times to form 10 μm height features in fused silica are shown below:

| | |
|---|---|
| 48% HF | 10-14 minutes |
| 10:1 HF (mixed from 10 parts HO, 1 part 49% HF) | 385 minutes |
| 5:1 BHF (mixed from 5 parts 40% $NH_4F$, 1 part 49% HF) | 77 minutes |

The second etch stage preferably results in selective removal of the substrate at the exposed substrate surfaces. The patterned photoresist layer 2606 may be fully or partially etched away depending on the etchant, duration of the etch, and the initial thickness of the photoresist layer. In cases where the photoresist material is fully removed, the metal etch mask remains to protect portions of the substrate surface.

Figure 29A:
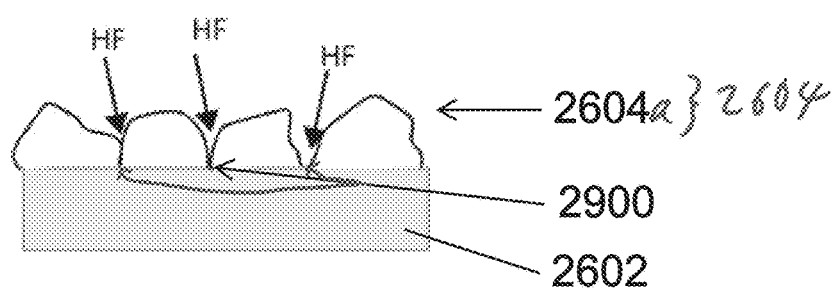
FIGS. 29A-29B illustrates examples of gaps, or pinholes, in an etch mask and the resulting damage to an underlying substrate.
Figure 29B:
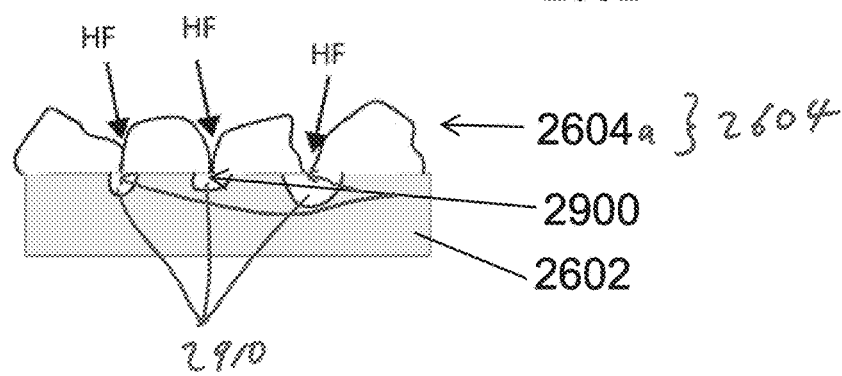

Undesirably, when the photoresist layer 2606 is very thin or fully removed and the metal etch mask 2604 is relied upon to protect portions of the substrate 2602 from the substrate etch chemistry, in some cases, small defects may be seen in the substrate surface that was believed to be covered by the metal etch mask 2604. As shown in FIG. 29A, the metal etch mask 2604 may be understood to be formed by a metal etch mask layer 2604a of metal material deposited by a single deposition process. Without being limited by theory, small gaps or pinholes 2900 in the metal mask 2604a are believed to allow the substrate etchant to reach the surface of the substrate 2602 underneath the pinholes 2900 during some etches. As illustrated, the pinholes 2900 may be pre-existing openings in the metal etch mask 2604a and/or may be thin portions of the metal etch mask 2604a that are subsequently worn away by exposure to etchant. Etchant (e.g., HF) may flow into these pinholes 2900 to etch the surface of the substrate 2602, as shown in FIG. 29B. For example, it has been observed that small spreckles or dots may be seen on a substrate surface after an etch as noted above. These spreckles or dots are believed to be the result of etching of the substrate surface by etchant flowing through the pinholes 2900, which forms depressions 2910 on the substrate surface.

Figure 30A:
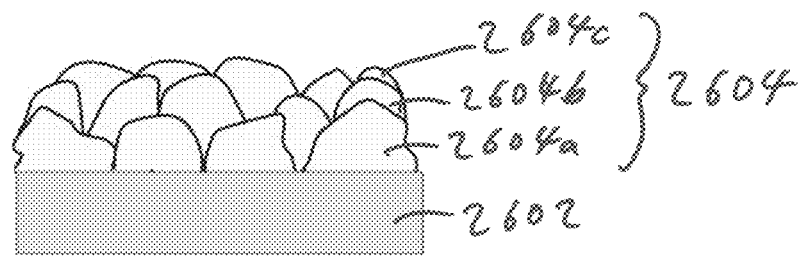
FIGS. 30A-30C provide examples of methods for mitigating gaps in an etch mask.
Figure 30B:
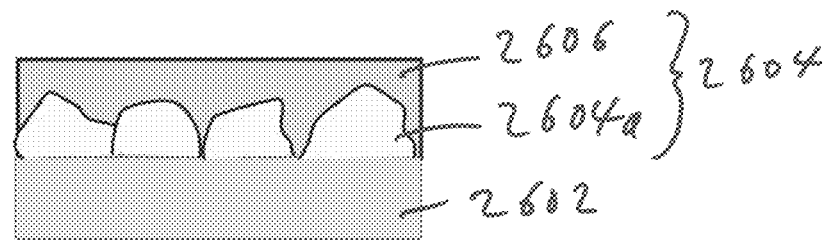
Figure 30C:
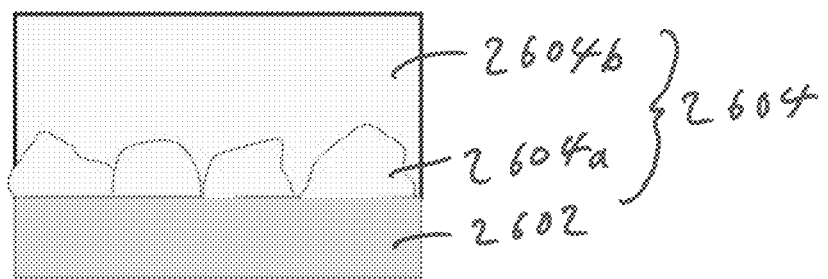

In some embodiments, the pinholes 2900 and/or thin areas of the etch mask 2604a that may become pinholes are mitigated. For example, the metal etch mask 2604a may be augmented by deposition of another material over the metal etch mask 2604a and/or by using another deposition process to deposit more of the same or a different metal. Various strategies to prevent etching defects caused by pinholes are shown in FIG. 30A-C, including to deposition of success of layers of etch mask material to fill or block pinholes, use of photoresist to fill or block pinholes, and electroplating to fill or block pinholes. It will be appreciated, that each of these strategies may also be understood to augment the thickness of an earlier-deposited etch mask layer.

FIG. 30A shows a metal etch mask 2604 (FIGS. 26-28) formed by multiple overlapped metal mask layers 2604a, 2604b, 2604c, which may be deposited in a succession of depositions, one for each of the layers 2604a, 2604b, 2604c. In such a configuration, the location of the pinholes in each layer 2604a, 2604b, 2604c will advantageously be different. This improves substrate surface coverage and reduces the likelihood that the metal etch mask will be penetrated by the etchant used to etch the substrate 2602. The various metal mask layers 2604a, 2604b, 2604c may be formed of the same metal or different metals, and the depositions may be the same type or may be different deposition processes, including one or more vapor deposition processes, such as chemical vapor deposition (CVD) or physical vapor deposition (PVD). Preferably, to simplify the formation of the etch mask 2604 in some embodiments, each of the metal mask layers 2604a, 2604b, 2604c may be formed of the same metal and may be deposited using the same deposition process. In some embodiments, two or more, three or more, or four a more layers may be successively deposited to form the aggregate metal etch mask 2604. In addition, in some embodiments, the total number of layers forming the aggregate etch mask 2604 may be less than ten, less than six, or less than five.

FIG. 30B shows an example where the photoresist layer is retained on the metal etch mask layer to reduce the diffusion of substrate etchant inside the pinholes. In some embodiments, the thickness of the photoresist layer 2606 may be increased to a level such that the photoresist will be retained throughout the expected duration of the substrate etching step. For example, in some embodiments, the thickness of the photoresist layer 2606 may be selected such that, after completion of the etch to define openings 2608 in the substrate 2602, a portion of the photoresist layer 2606 still remains to cover the entirety of the etch mask 2604. In some embodiments, the initial thickness of the photoresist layer 2606 may be selected such that the remaining portion of the photoresist layer 2606, after completing the etch of the substrate 2602, extends above the etch mask 2604 by 5% or more, 10% or more, 15% or more, 25% or more, or 30% or more of the height of the etch mask 2604.

FIG. 30C shows an electroplated layer 2604b grown over the metal etch mask layer 2604a, with the electroplated layer 2604b and the metal etch mask layer 2604a together forming the etch mask 2604. The electroplated layer may be the same material as the metal etch mask material. In some embodiment, another metal may be utilized for the electroplated layer. The augmentation provided by the electroplated layer 2604b creates a very thick etch mask 2604, for example, between approximately 1 µm to 20 µm thick with consistent coverage and no pinholes. The electroplating step may be done either before or after the photoresist patterning step. For example, after or as part of transferring the pattern of openings in the photoresist layer 2606 into the etch mask 2604, the photoresist layer 2606 may be completely removed, thereby exposing the metal etch mask 2604a. Subsequently, the metal etch mask layer 2604a may be used as a seed layer to selectively deposit the electroplated layer 2604b on the metal etch mask layer 2604a before subsequently etching the substrate 2602.

In some embodiments, the deposition of additional metal layers (such as one or more successive metal etch mask layers 2604b, 2604c, FIG. 30A, formed by vapor deposition; or electroplated metal etch mask layer 2604b, FIG. 30B) deposits the same metal on the pre-existing metal etch mask layer 2604a, thereby simplifying the selection of etch chemistries for later etching of the metal etch mask 2604. It has been observed that the reduction in substrate surface defects is readily apparent to the naked eye when processing using a metal etch mask 2604 for which an augmentation strategy as described above has been applied.

In addition to protecting portions of the top surface of the substrate 2602 from etchant, it may also be advantageous to protect the bottom surface of the substrate to avoid changing the substrate thickness, flatness, and/or surface roughness during the substrate etching process. To protect the back side of the substrate, a substrate holder may be used, and may shield the substrate backside, such that only one side of the substrate is in contact with the substrate etchant. In another configuration, a metal etch mask may be applied to the bottom side of the substrate to prevent contact with the substrate etchant. For example, a metal layer may be deposited on the bottom side of the substrate 2602. In some embodiments, the back side metal layer may be formed of the same metal as used to form the etch mask 2604, to simplify the deposition and the number of precursors needed for the various depositions. In some other embodiments, the back side metal layer may be formed of a different metal, e.g., a metal having higher resistance than the etch mask 2604 to etch chemistries utilized for etching the etch mask 2604 and/or the substrate 2602. In yet another configuration, a sacrificial substrate may be bonded to the bottom of the substrate. The sacrificial substrate may be bonded using a photoresist or other adhesive that is easily dissolved, for example, by soaking in an organic solution after the etching step, so that the sacrificial substrate may be removed.

After etching the substrate 2602 to extend the opening 2608 into the substrate 2602, a third stage of etching may be performed. During this third stage, any remaining material forming the metal mask 2604 may be removed, followed by a cleaning stage to wash away any remaining etchant or debris.

Figure 31:
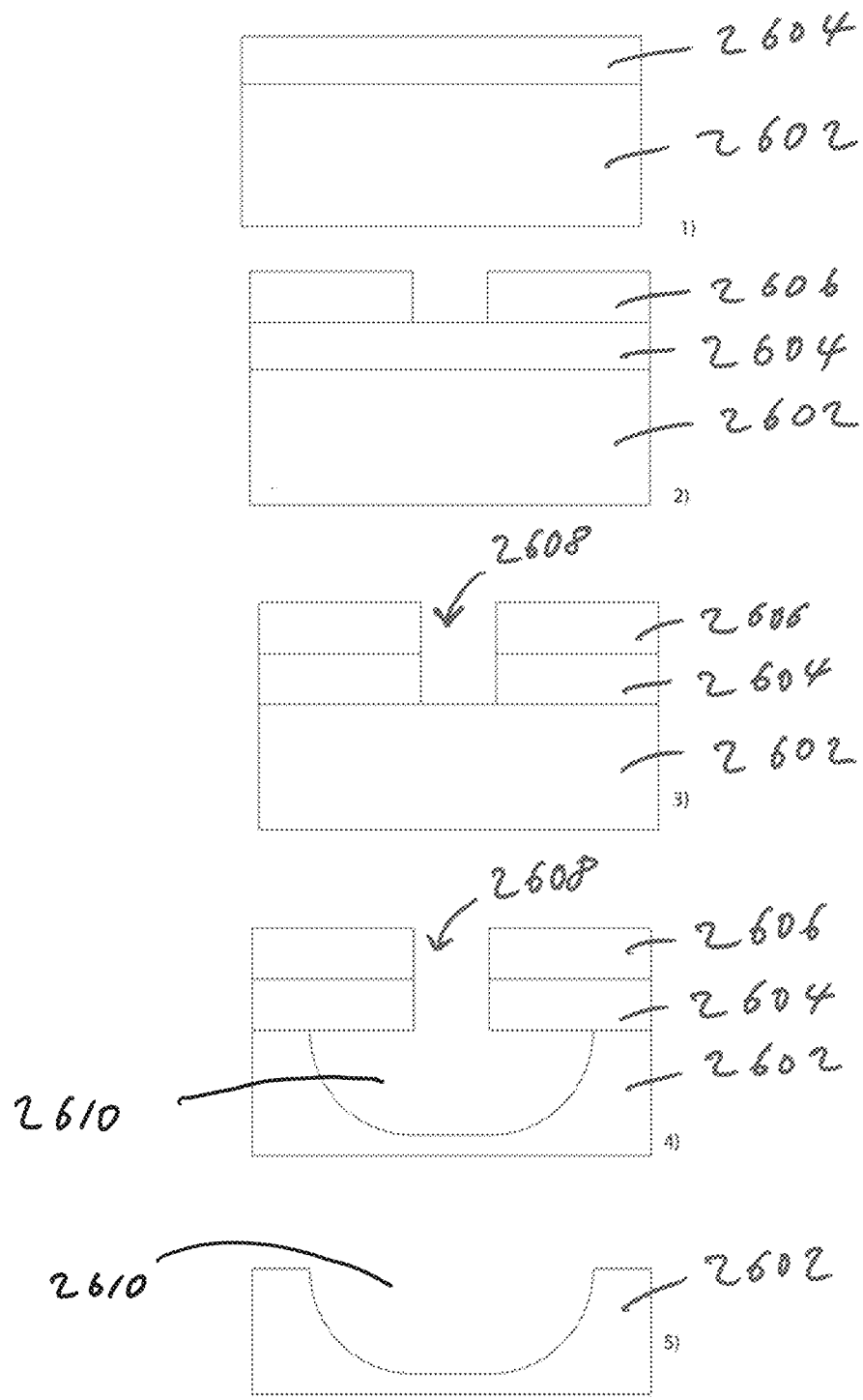
FIG. 31 illustrates an example of intermediate structures formed in a process flow for wet etching a substrate to form a mold for integral spacers.

FIG. 31 shows another view of the sequence of three etching stages, corresponding to the three etch stages the described above, and the resulting mold structure formed after mask material removal and cleaning. The structures 2) and 3) show structures formed during the first etch stage (as discussed above regarding FIGS. 26 and 27). The structure 4) is formed during the second etch stage (as discussed above regarding FIG. 28), and the structure 5) is formed during the third etch stage after removal of mask material.

With continued reference to FIG. 31, in the first illustrated intermediate structure 1), the etch mask 2604, which may be formed of metal in some embodiments, is deposited over the substrate 2602, which may be formed of glass in some embodiments. In the second illustrated intermediate structure 2), the resist layer 2606 is deposited over the etch mask 2604 and is patterned to define an opening 2608 in the resist layer 2606. In the third illustrated intermediate structure 3), the etch mask 2604 is subjected to an etch chemistry selective for the material of that etch mask 2604, to extend the opening 2608 in the resist layer 2606 through the etch mask 2604. In the fourth illustrated intermediate structure 4), the underlying substrate 2602 is subjected to an etch (e.g., a wet etch such as an HF-containing etch) to remove substrate material. In the fifth illustrated intermediate structure 5), the overlying etch mask 2604 and any remaining photoresist material are removed and the resulting structure is subjected to a cleaning process, thereby leaving a mold having openings 2610 therein.

As illustrated, in some embodiments, where the etch is a wet etch, it will be appreciated that the wet etch may etch the substrate material both vertically (downwards) and laterally, thereby forming an open volume 2610. Thus, the fifth illustrated intermediate structure 5) of FIG. 31 shows that the feature transferred into the substrate, the open volume 2610 formed from the opening 2608, has rounded walls or corners and is undercut in relation to the etch mask. Without being limited by theory, this is understood to occur because wet etching is an isotropic process and the substrate etchant attacks both the exposed horizontal surface of the substrate and the vertical surfaces of the feature wall. Advantageously, the curved shape of the volume 2610 facilitates the demolding, or removal, of spacers which may be formed in these volume 2610.

FIG. 32 shows in flowchart format examples of the various actions discussed above and illustrated in FIGS. 26-28 and 31, in which a wet etch is utilized to form an open volume in a substrate, with the substrate and the open volume forming a mold which may be used to fabricate waveguides with an integrated spacer formed in that open volume. For example, it will be appreciated that the first, second, and third illustrated etch stages correspond to the first, second, and third etch stages discussed with reference to FIGS. 26-28 and 31. In this illustrated example, the various etches used to transfer patterns from the photoresist layer to the etch mask and then to the substrate (or wafer) are wet etches. In addition, any mask material remaining after the third etch stage may also be removed using a wet etch.

Dry Etch Processes

Figure 33:
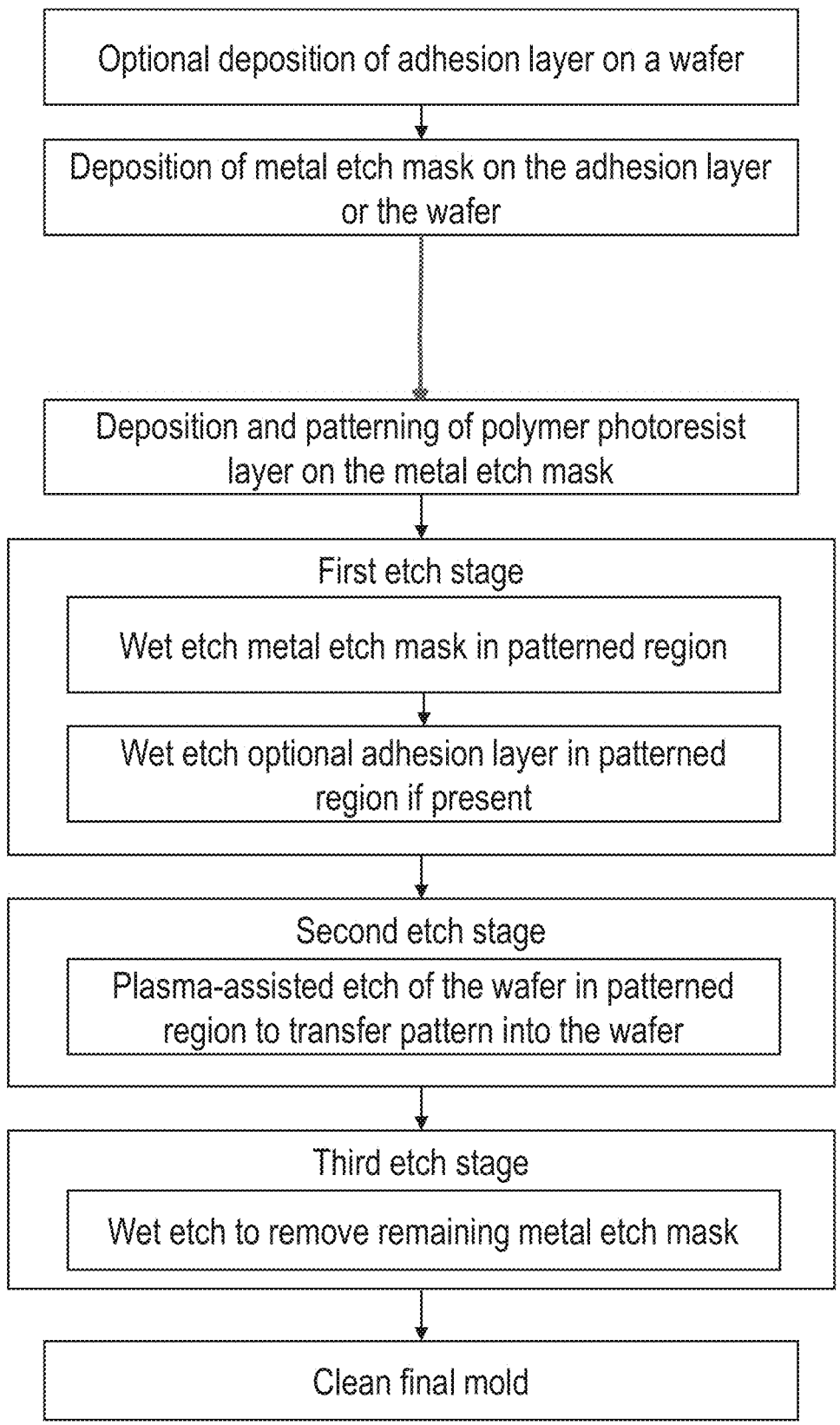
FIG. 33 is a block diagram showing illustrating an example of a process flow for dry etching a substrate to form a mold for integral spacers.

As noted above, wet etches tend to form cross-sectional shapes with rounded sidewalls and/or corners. If more vertical walls are desired in the features of the etched substrate, a process with dry etching may be used. A flowchart of an example dry etch method is shown in FIG. 33. Dry etch process may include, e.g., a plasma-assisted etch process, such as reactive-ion etching (RIE), inductively coupled plasma RIE, or ion milling. In some embodiments, the dry etch process may be used to etch the substrate during the second etch stage. In some embodiments, the flowcharts of FIGS. 32 and 33 are otherwise identical. In some other embodiments, the first etch stage of FIGS. 32 and/or 33, and the first etch stage discussed above regarding FIGS. 26-28 and 31, may utilize a dry etch. In some embodiments, the both first and second etch stages of FIGS. 32 and/or 33, and both the first and second etch stages discussed above regarding FIGS. 26-28 and 31, may utilize dry etches.

Figure 34:
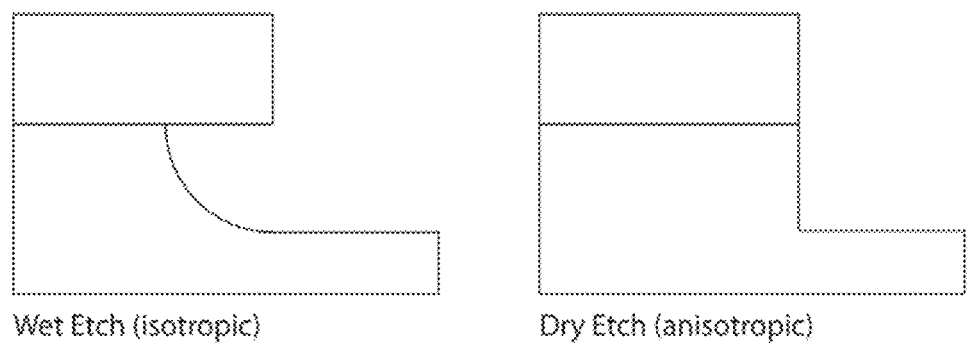
FIG. 34 illustrates examples of the cross-sectional profiles of openings formed using wet and dry etches, respectively.

Dry etches such as plasma etches are directional and will result in less undercutting of the substrate under the etch mask as shown in the comparison drawings of FIG. 34. However, plasma etching will also remove the etch mask over time and may worsen the pinhole effect discussed above. To reduce surface damage of the substrate underneath the etch mask, it may be beneficial to use a very thick etch mask. For example, the mask may be 1 μm in thickness for every 40 μm of substrate to be etched if the substrate is made of a glass material. In some embodiments, multiple depositions of material, such as discussed above regarding FIGS. 30A and 30C, may be utilized to provide a thick etch mask.

Examples of plasma etching parameters are provided below. As indicated below, the appropriate ranges for chamber pressure, gas composition and flux, RF power, temperature, and ICP power and/or VHF power may be selected based upon the composition of the substrate to be etched and/or the final openings to be formed (e.g., the sizes and/or aspect ratios of the openings). In some embodiments, glass may be etched in a process with process parameters as provided below.

1) Chamber pressure (from 1 to $10^{-4}$ Torr).
  1. Including from 20 mtorr to 5 mtorr
  2. Including from 100 mtorr to 20 mtorr
2) Gas composition and flux (as Ar, $O_2$, $N_2$, $H_2$, $C_2F_6$, $CF_4$, $CHF_3$, $CF_3Cl$, $SF_6$, $Cl_2$, BCL, HBr, other halide gases). Flux range from 1 to 100 sccm.
  1. Including $SF_6$/Ar
  2. Including $BCL_3$/HBr/Ar
  3. Including $CF_4$/$CHF_3$/AR
3) RF power (10 to 500 W).
  1. Including from 200 to 100 W
  2. Including from 500 to 200 W
  3. Including from 100 to 10 W
4) Temperature (−150 to 100° C.).
  1. Including from −120 to −100° C.
  2. Including from −100 to 0° C.
  3. Including from 0 to 20° C.
  4. Including from 20 to 50° C.
5) ICP power, VHF power (10 to 2500 W).

With reference to both FIGS. 32 and 33, as discussed herein, the deposition of the etch mask may involve a single deposition or, more preferably, may involve multiple depositions of material and/or the use of a thick resist layer, as discussed herein regarding FIGS. 30A-30C. Also, regarding the first etch stage of FIGS. 32 and 33, the illustrated wet etch for the etch mask and optional adhesion layer may be replaced with a dry etch in some embodiments.

It will be appreciated that the substrate, or wafer, and the open volumes formed in the substrate may constitute a mold which may be used to fabricate waveguides with integrated spacers formed in those open volumes. As discussed herein, it will be appreciated that the waveguides may have multiple integrated spacers in various orientations and configurations. While a single volume 2610 or only one or two openings 2608 are illustrated in FIGS. 26-28 and 31 for ease of discussion and illustration, it will be appreciated that the number of volumes 2610 or openings 2608 may correspond to the number of desired spacers to be formed and the orientations and configurations of those volumes 2610 or openings 2608 may correspond to the orientations and configurations of the desired spacers.

Moreover, in the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than restrictive sense.

Indeed, it will be appreciated that the systems and methods of the disclosure each have several innovative aspects, no single one of which is solely responsible or required for the desirable attributes disclosed herein. The various features and processes described above may be used independently of one another, or may be combined in various ways. All possible combinations and subcombinations are intended to fall within the scope of this disclosure.

Certain features that are described in this specification in the context of separate embodiments also may be implemented in combination in a single embodiment. Conversely, various features that are described in the context of a single embodiment also may be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination. No single feature or group of features is necessary or indispensable to each and every embodiment.

It will be appreciated that conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted may be incorporated in the example methods and processes that are schematically illustrated. For example, one or more additional operations may be performed before, after, simultaneously, or between any of the illustrated operations. Additionally, the operations may be rearranged or reordered in other embodiments. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products. Additionally, other embodiments are within the scope of the following claims. In some cases, the actions recited in the claims may be performed in a different order and still achieve desirable results.

Accordingly, the claims are not intended to be limited to the embodiments shown herein, but are to be accorded the widest scope consistent with this disclosure, the principles and the novel features disclosed herein.

What is claimed is:

1. A method for forming a mold, comprising:
   providing a substrate;
   depositing an adhesive layer on the substrate;
   depositing a plurality of etch mask layers on the adhesive layer, wherein depositing the plurality of etch mask layers comprises
      depositing a first etch mask layer of a first metal by a first deposition technique, and
      depositing a second etch mask layer of a second metal that is different from the first metal by a second deposition technique that is different from the first deposition technique;
   depositing a photoresist layer over the etch mask layers;
   lithographically defining openings in the photoresist layer;
   etching the substrate through the photoresist layer, the plurality of etch mask layers, and the adhesion layer to define a first set of openings in the substrate,
   wherein the first set of openings in the substrate have a depth between 5 µm and 1000 µm; and
   defining a second set of openings in the substrate, wherein a ratio of the heights of the first set of openings to the heights of the second set of openings is 500:1 or greater, wherein the second set of openings are arranged in an interior region of the substrate and the first set of openings are arranged in a periphery of the substrate.

2. The method of claim 1, wherein the adhesion layer comprises titanium or chrome and the first etch mask layer comprises gold.

3. The method of claim 1, wherein the first deposition technique comprises one of electroplating or a vapor deposition.

4. The method of claim 3, wherein the second deposition technique comprises the other one of electroplating or vapor deposition.

5. The method of claim 1, wherein each etch mask layer of the plurality of etch mask layers has a thickness of 10 nm to 200 nm.

6. The method of claim 1, wherein etching the substrate through the etch mask layer comprises a wet etch.

7. The method of claim 1, wherein etching the substrate through the etch mask layer comprises a dry etch.

8. The method of claim 1, wherein the substrate is formed of an optically transparent material.

9. The method of claim 8, wherein the optically transparent material is chosen from the group consisting of glass, quartz, and fused silica.

10. The method of claim 1, wherein the ratio is 100000:1 or less.

11. The method of claim 1, wherein the second set of openings define a diffractive grating.

12. The method of claim 1, further comprising removing the plurality of etch mask layers.

13. The method of claim 1, wherein the first set of openings define spacers sized to provide a separation distance between a first waveguide and a second waveguide.

14. The method of claim 13, wherein a bottom of the first set of openings define light scattering features such that top surfaces of spacers formed with the mold comprise the light scattering features.

15. The method of claim 13, wherein the spacers defined by the first set of openings comprise multiple tiers, wherein each tier corresponds to a spacer of a different width.

16. The method of claim 1, wherein the second set of openings define a shape of one or more of an in-coupling optical element, an out-coupling optical element, and a light trapping structure.

17. The method of claim 1, wherein the first set of openings define spacers sized to provide a separation distance between a first waveguide and a second waveguide, and the second set of openings define surface relief features, wherein the spacers defined by the first set of openings comprise a first group of spacers elongated along a first direction and a second group of spacers elongated along the first direction, wherein a length of the first group of spacers along the first direction is shorter than a length of the second group of spacers along the first direction.

18. The method of claim 17, wherein a length of the surface relief features is elongated along the first direction.

* * * * *